(12) United States Patent
Nishi et al.

(10) Patent No.: US 6,605,408 B2
(45) Date of Patent: Aug. 12, 2003

(54) RESIST COMPOSITION AND PATTERNING PROCESS

(75) Inventors: Tsunehiro Nishi, Nakakubiki-gun (JP); Takeshi Kinsho, Nakakubiki-gun (JP); Shigehiro Nagura, Nakakubiki-gun (JP); Tomohiro Kobayashi, Nakakubiki-gun (JP); Satoshi Watanabe, Nakakubiki-gun (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 140 days.

(21) Appl. No.: 09/832,919

(22) Filed: Apr. 12, 2001

(65) Prior Publication Data

US 2002/0001772 A1 Jan. 3, 2002

(30) Foreign Application Priority Data

Apr. 13, 2000 (JP) ........................................ 2000-111545
Oct. 30, 2000 (JP) ........................................ 2000-330181

(51) Int. Cl.$^7$ .............................. C08F 2/00; G03F 7/039
(52) U.S. Cl. ................... 430/270.1; 430/330; 430/327; 430/287.1; 430/296; 526/73; 526/281; 526/332; 526/337
(58) Field of Search .................... 430/270.1, 330, 430/296, 327, 287.1, 967, 945; 526/73, 281, 332, 337

(56) References Cited

U.S. PATENT DOCUMENTS

| 6,372,854 | B1 | * | 4/2002 | Sunaga et al. | ............ | 525/326.8 |
| 6,399,274 | B1 | * | 6/2002 | Kinsho et al. | ............ | 430/270.1 |
| 2001/0031424 | A1 | * | 10/2001 | Nishi et al. | ................. | 430/296 |
| 2002/0165328 | A1 | * | 11/2002 | Yamamoto et al. | ........... | 526/73 |

FOREIGN PATENT DOCUMENTS

| JP | 4039665 | 2/1992 | | |
| JP | 5257281 | 10/1993 | | |
| JP | 5257285 | 10/1993 | | |
| JP | 6342212 | 12/1994 | | |
| JP | 7333850 | 12/1995 | | |
| JP | 9230595 | 9/1997 | | |
| JP | 9244247 | 9/1997 | | |
| JP | 10254139 | 9/1998 | | |
| JP | 11171982 A | * | 6/1999 | ............ C08G/61/08 |
| JP | 11327144 A | * | 11/1999 | ......... G03F/07/039 |
| JP | 2002122992 A | * | 4/2002 | ......... G03F/07/039 |
| WO | 97/33198 | 9/1997 | | |

OTHER PUBLICATIONS

Abstract of Japanese 4039665.
Abstract of Japanese 5257281.
Abstract of Japanese 5257285.
Abstract of Japanese 6342212.
Abstract of Japanese 7333850.
Abstract of Japanese 9230595.
Abstract of Japanese 9244247.
Abstract of Japanese 10254139.

* cited by examiner

*Primary Examiner*—Janet Baxter
*Assistant Examiner*—Yvette C. Thornton
(74) *Attorney, Agent, or Firm*—Millen, White, Zelano & Branigan, P.C.

(57) ABSTRACT

A hydrogenated product of a ring-opening metathesis polymer comprising structural units as shown below has improved heat resistance, pyrolysis resistance and light transmission and is suited as a photoresist for semiconductor microfabrication using UV or deep-UV. A resist composition comprising the polymer as a base resin is sensitive to high-energy radiation and has excellent sensitivity, resolution, and etching resistance.

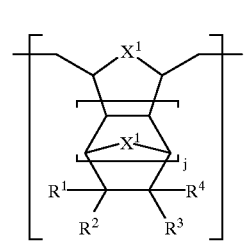

(1)

9 Claims, 1 Drawing Sheet

RESIST COMPOSITION AND PATTERNING PROCESS

This invention relates to a resist composition comprising a hydrogenated product of ring-opening metathesis polymer as a base resin, especially having improved sensitivity, resolution, and etching resistance and suited for semiconductor microfabrication using UV and deep-UV radiation (inclusive of excimer lasers), and a patterning process using the resist composition.

BACKGROUND OF THE INVENTION

Semiconductor integrated circuits have reached so great a scale of integration that large scale integrated circuits (LSI) and very large scale integrated circuits (VLSI) are now used in practice. At the same time, the minimum pattern size of integrated circuits reaches the submicron region and will become finer. Micropatterning is generally carried out by lithography, for example, by forming a thin film on a substrate, coating a resist thereon, effecting selective exposure to form a latent image of the desired pattern, developing the resist to form a resist pattern, effecting dry etching using the resist pattern as a mask, and removing the resist, leaving the desired pattern.

The light source used for exposure in the lithography is ultraviolet radiation, typically g-line (wavelength 436 nm) and i-line (wavelength 365 nm). As the pattern feature size becomes finer, the light source undergoes a transition to shorter wavelength ones such as deep-UV, vacuum-UV, electron beams (EB) and x-rays. The latest stage of lithography considers to use as the exposure light source excimer lasers, specifically KrF laser of wavelength 248 nm and ArF laser of wavelength 193 nm. The excimer lasers are expected to be effective for micropatterning.

In resist compositions for forming submicron-size patterns using exposure light of shorter wavelength or in the vacuum ultraviolet region, a variety of polymers or copolymers are used. Proposed thus far are polymers or copolymers of acrylic esters or alpha-substituted acrylic esters having an adamantane skeleton and acid-eliminatable protective groups in the ester moiety (see JP-A 4-39665), polymers or copolymers of acrylic esters or alpha-substituted acrylic esters having a norbornane skeleton and acid-eliminatable protective groups in the ester moiety (see JP-A 5-257281), polymers or copolymers of cyclohexylmaleimide (see JP-A 5-257285), polymers having a cellulose skeleton in the backbone which undergoes cleavage with acid (see JP-A 6-342212), and polyvinyl alcohol and polyvinyl alcohol derivatives (see JP-A 7-333850).

These polymers and copolymers do not satisfy all the characteristics necessary as resist material including dry etching resistance, transparency to deep-UV, solubility in resist solvents, wettability with developers, adhesion to silicon and other substrates, and solubility in stripping agents. None of them are easy to synthesize. There is a need to have polymers satisfying the above requirements.

On the other hand, photoresist compositions comprising polymers based on aliphatic cyclic hydrocarbon as the backbone and having a cyclic skeleton bearing acid-decomposable functional groups are disclosed in WO 97/33198, JP-A 9-230595, JP-A 9-244247, and JP-A 10-254139. These cyclic polymers have good dry etching resistance and transparency to deep-UV, but leave unsolved the problems of dissolution in resist solvents in high concentrations, wettability with developers, and adhesion to silicon substrates.

SUMMARY OF THE INVENTION

An object of the invention is to provide a resist composition which is sensitive to high-energy radiation, has improved sensitivity, resolution and etching resistance, and is useful in micropatterning using electron beams and deep-UV. Another object is to provide a micropatterning process using the same.

We have found that a hydrogenated product of a ring-opening metathesis polymer having a narrow molecular weight distribution is useful as the base resin in a positive acting photoresist composition because it satisfies all the above-described characteristics necessary for a polymer to perform as the base resin in a resist composition, more specifically characteristics including light transparency, high sensitivity, high resolution, and affinity to alkali developers, so that it is suitable for use in semiconductor micropatterning with UV and deep-UV (inclusive of excimer lasers) and can form a satisfactory pattern. Studying hydrogenated products of polymers resulting from ring-opening metathesis polymerization of cyclic olefin monomers to see whether they have a potential to utilize as the base resin to formulate resist compositions having improved optical properties, electric properties, high rigidity, heat resistance, substrate adhesion and weathering resistance, we have found that a hydrogenated product of a ring-opening metathesis polymer having specific structural units of aliphatic cyclic compound in the backbone, which cyclic structure partially contains oxygen atom-bearing structural units, satisfies all the characteristics necessary for resist material.

In a first aspect, the invention provides a resist composition comprising as a base resin a hydrogenated product of a ring-opening metathesis polymer comprising structural units [A] of the following general formula (1) and one or both of structural units [B] of the following general formula (3) and structural units [C] of the following general formula (4), and having a constitutional molar ratio defined as [A]/([B]+[C]) of from 20/80 to 99/1 and a dispersity defined as a weight average molecular weight (Mw) divided by a number average molecular weight (Mn) of 1.0 to 2.0.

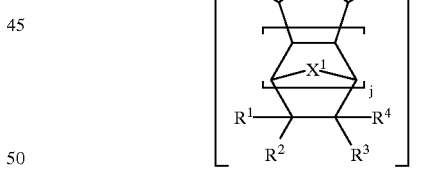

(1)

Herein at least one of $R^1$ to $R^4$ is a functional group having a tertiary ester group of cyclic alkyl represented by the following general formula (2):

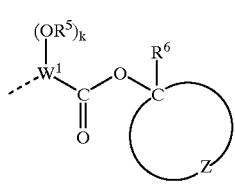

(2)

wherein the broken line denotes a valence bond, $R^5$ is selected from the class consisting of hydrogen, straight, branched or cyclic alkyl groups of 1 to 10 carbon atoms, straight, branched or cyclic alkoxyalkyl groups of 2 to 10 carbon atoms, and straight, branched or cyclic acyl groups of 1 to 10 carbon atoms, $R^6$ is a straight, branched or cyclic alkyl group of 1 to 10 carbon atoms, $W^1$ is a single bond or (k+2)-valent hydrocarbon group of 1 to 10 carbon atoms, Z is a divalent hydrocarbon group of 2 to 15 carbon atoms which forms a single ring or bridged ring with the carbon atom, and k is 0 or 1.

The remainders of $R^1$ to $R^4$ are independently selected from the class consisting of hydrogen, straight, branched or cyclic alkyl groups of 1 to 20 carbon atoms, halogen atoms, straight, branched or cyclic haloalkyl groups of 1 to 20 carbon atoms, straight, branched or cyclic alkoxy groups of 1 to 20 carbon atoms, straight, branched or cyclic alkoxyalkyl groups of 2 to 20 carbon atoms, straight, branched or cyclic alkylcarbonyloxy groups of 2 to 20 carbon atoms, arylcarbonyloxy groups of 6 to 20 carbon atoms, straight, branched or cyclic alkylsulfonyloxy groups of 1 to 20 carbon atoms, arylsulfonyloxy groups of 6 to 20 carbon atoms, straight, branched or cyclic alkoxycarbonyl groups of 2 to 20 carbon atoms, and straight, branched or cyclic alkoxycarbonylalkyl groups of 3 to 20 carbon atoms; $X^1$, which may be the same or different, is —O— or —$CR^7{}_2$— wherein $R^7$ is hydrogen or a straight or branched alkyl group of 1 to 10 carbon atoms; and j is 0 or an integer of 1 to 3.

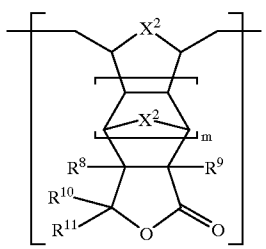

(3)

Herein $R^8$ to $R^{11}$ each are independently hydrogen or a straight, branched or cyclic alkyl group of 1 to 10 carbon atoms, $X^2$, which may be the same or different, is —O— or —$CR^{12}{}_2$— wherein $R^{12}$ is hydrogen or a straight or branched alkyl group of 1 to 10 carbon atoms, and m is 0 or an integer of 1 to 3.

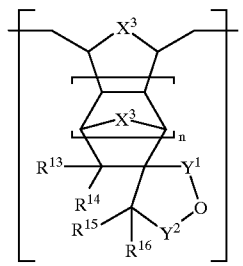

(4)

Herein $R^{13}$ to $R^{16}$ each are independently hydrogen or a straight, branched or cyclic alkyl group of 1 to 10 carbon atoms, $X^3$, which may be the same or different, is —O— or —$CR^{17}{}_2$— wherein $R^{17}$ is hydrogen or a straight or branched alkyl group of 1 to 10 carbon atoms, one of $Y^1$ and $Y^2$ is —(C=O)— and the other is —$CR^{18}{}_2$— wherein $R^{18}$ is hydrogen or a straight or branched alkyl group of 1 to 10 carbon atoms, and n is 0 or an integer of 1 to 3.

At least one of $X^1$ in the structural units [A] of formula (1), $X^2$ in the structural units [B] of formula (3), and $X^3$ in the structural units [C] of formula (4) is —O—.

Preferably, the functional group having a tertiary ester group of cyclic alkyl of the formula (2) represented by at least one of $R^1$ to $R^4$ is 1-alkylcyclopentyl ester, 2-alkyl-2-norbornyl ester or 2-alkyl-2-adamantyl ester.

In one preferred embodiment, the hydrogenated product of ring-opening metathesis polymer further comprises structural units [D] of the following general formula (5).

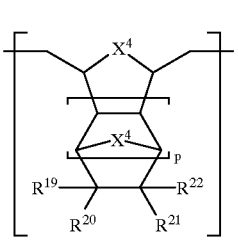

(5)

Herein at least one of $R^{19}$ to $R^{22}$ is a functional group having a carboxylic acid group represented by the following general formula (6):

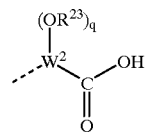

(6)

wherein the broken line denotes a valence bond, $R^{23}$ is selected from the class consisting of hydrogen, straight, branched or cyclic alkyl groups of 1 to 10 carbon atoms, straight, branched or cyclic alkoxyalkyl groups of 2 to 10 carbon atoms, and straight, branched or cyclic acyl groups of 1 to 10 carbon atoms, $W^2$ is a single bond or (q+2)-valent hydrocarbon group of 1 to 10 carbon atoms, and q is 0 or 1; the remainders of $R^{19}$ to $R^{22}$ are independently selected from the class consisting of hydrogen, straight, branched or cyclic alkyl groups of 1 to 20 carbon atoms, halogen atoms, straight, branched or cyclic haloalkyl groups of 1 to 20 carbon atoms, straight, branched or cyclic alkoxy groups of 1 to 20 carbon atoms, straight, branched or cyclic alkoxyalkyl groups of 2 to 20 carbon atoms, straight, branched or cyclic alkylcarbonyloxy groups of 2 to 20 carbon atoms, arylcarbonyloxy groups of 6 to 20 carbon atoms, straight, branched or cyclic alkylsulfonyloxy groups of 1 to 20 carbon atoms, arylsulfonyloxy groups of 6 to 20 carbon atoms, straight, branched or cyclic alkoxycarbonyl groups of 2 to 20 carbon atoms, and straight, branched or cyclic alkoxycarbonylalkyl groups of 3 to 20 carbon atoms; $X^4$, which may be the same or different, is —O— or —$CR^{24}{}_2$— wherein $R^{24}$ is hydrogen or a straight or branched alkyl group of 1 to 10 carbon atoms; and p is 0 or an integer of 1 to 3.

More preferably, the hydrogenated product of ring-opening metathesis polymer has a constitutional molar ratio of structural units [A] of formula (1), structural units [B] of formula (3) and structural units [C] of formula (4) to structural units [D] of formula (5), defined as ([A]+[B]+[C])/[D], of from 100/0 to 20/80.

In a further preferred embodiment, the hydrogenated product of ring-opening metathesis polymer further comprises structural units [E] of the following general formula (7).

(7)

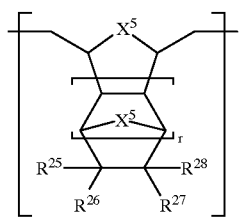

Herein at least one of $R^{25}$ to $R^{28}$ is a functional group having a carboxylate group represented by the following general formula (8):

(8)

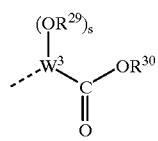

wherein the broken line denotes a valence bond, $R^{29}$ is selected from the class consisting of hydrogen, straight, branched or cyclic alkyl groups of 1 to 10 carbon atoms, straight, branched or cyclic alkoxyalkyl groups of 2 to 10 carbon atoms, and straight, branched or cyclic acyl groups of 1 to 10 carbon atoms, $R^{30}$ is a straight, branched or cyclic alkyl group of 1 to 10 carbon atoms, straight, branched or cyclic alkoxyalkyl group of 2 to 10 carbon atoms, or straight, branched or cyclic haloalkyl group of 1 to 20 carbon atoms, $W^3$ is a single bond or (s+2)-valent hydrocarbon group of 1 to 10 carbon atoms, and s is 0 or 1; the remainders of $R^{25}$ to $R^{28}$ are independently selected from the class consisting of hydrogen, straight, branched or cyclic alkyl groups of 1 to 20 carbon atoms, halogen atoms, straight, branched or cyclic haloalkyl groups of 1 to 20 carbon atoms, straight, branched or cyclic alkoxy groups of 1 to 20 carbon atoms, straight, branched or cyclic alkoxyalkyl groups of 2 to 20 carbon atoms, straight, branched or cyclic alkylcarbonyloxy groups of 2 to 20 carbon atoms, arylcarbonyloxy groups of 6 to 20 carbon atoms, straight, branched or cyclic alkylsulfonyloxy groups of 1 to 20 carbon atoms, arylsulfonyloxy groups of 6 to 20 carbon atoms, straight, branched or cyclic alkoxycarbonyl groups of 2 to 20 carbon atoms, and straight, branched or cyclic alkoxycarbonylalkyl groups of 3 to 20 carbon atoms; $X^5$, which may be the same or different, is —O— or —$CR^{31}_2$— wherein $R^{31}$ is hydrogen or a straight or branched alkyl group of 1 to 10 carbon atoms; and r is 0 or an integer of 1 to 3.

More preferably, the hydrogenated product of ring-opening metathesis polymer has a constitutional molar ratio of structural units [A] of formula (1), structural units [B] of formula (3) and structural units [C] of formula (4) to structural units [E] of formula (7), defined as ([A]+[B]+[C])/[E], of from 100/0 to 40/60.

Preferably, the hydrogenated product of ring-opening metathesis polymer has a number average molecular weight (Mn) of 500 to 200,000 and more preferably a number average molecular weight (Mn) of 3,000 to 20,000, as measured by gel permeation chromatography (GPC) using a polystyrene standard.

In another aspect, the invention provides a process for forming a resist pattern comprising the steps of applying the resist composition onto a substrate to form a coating, heat treating the coating and then exposing it to high-energy radiation or electron beams through a photo mask, and optionally heat treating the exposed coating and developing it with a developer.

BRIEF DESCRIPTION OF THE DRAWING

The only FIGURE.

DESCRIPTION OF THE PREFERRED EMBODIMENT

Figure 1:
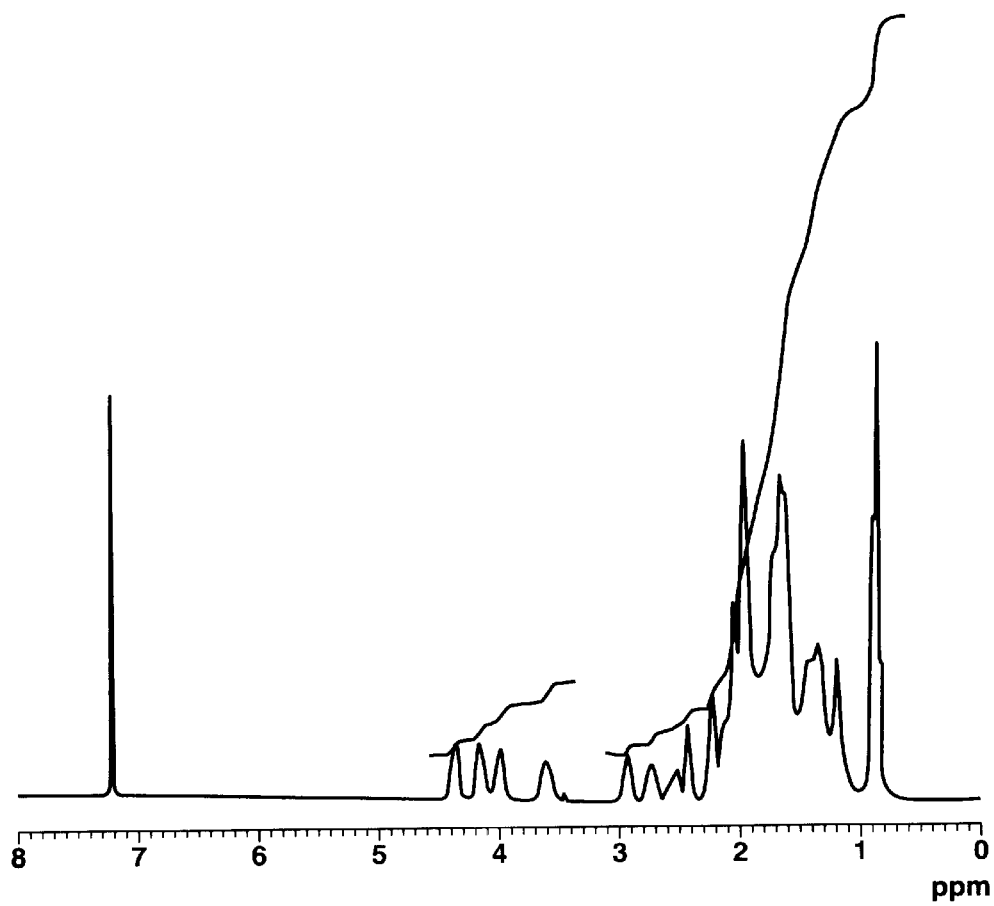
FIG. 1 is a diagram showing the $^1$H-NMR spectrum of the hydrogenated ring-opening metathesis polymer obtained in Synthesis Example 1.

The resist composition of the invention uses as the base resin a hydrogenated product of a ring-opening metathesis polymer comprising structural units [A] of the general formula (1) and structural units [B] of the general formula (3) and/or structural units [C] of the general formula (4).

(1)

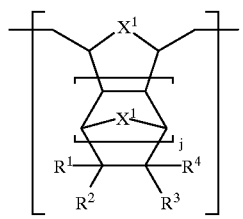

(3)

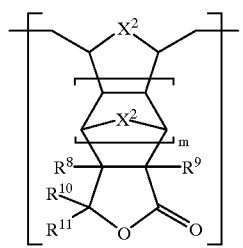

(4)

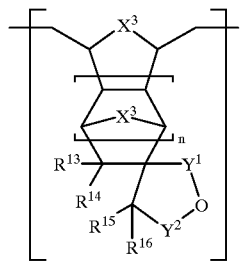

In formula (1), at least one of $R^1$ to $R^4$ is a functional group having a tertiary ester group of cyclic alkyl represented by the general formula (2).

(2)

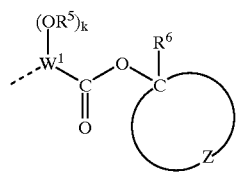

Herein the broken line denotes a valence bond, $R^5$ is hydrogen, a straight, branched or cyclic alkyl group of 1 to 10 carbon atoms, a straight, branched or cyclic alkoxyalkyl group of 2 to 10 carbon atoms, or a straight, branched or cyclic acyl group of 1 to 10 carbon atoms. $R^6$ is a straight, branched or cyclic alkyl group of 1 to 10 carbon atoms. $W^1$ is a single bond or (k+2)-valent hydrocarbon group of 1 to 10 carbon atoms. Z is a divalent hydrocarbon group of 2 to 15 carbon atoms which forms a single ring or bridged ring with the carbon atom, and k is 0 or 1.

Of the groups represented by $R^5$, the straight, branched or cyclic alkyl groups of 1 to 10 carbon atoms include, for example, methyl, ethyl, propyl, isopropyl, n-butyl, isobutyl, tert-butyl, cyclopentyl, cyclohexyl, 1-ethylcyclopentyl and 1-ethylcyclohexyl. Examples of the straight, branched or cyclic alkoxyalkyl group of 2 to 10 carbon atoms include methoxymethyl, 1-ethoxyethyl, 1-tert-butoxyethyl, 1-cyclohexyloxyethyl, 1-ethoxypropyl, 1-ethoxy-1-methylethyl, tetrahydrofuran-2-yl and tetrahydropyran-2-yl. Examples of the straight, branched or cyclic acyl group of 1 to 10 carbon atoms include formyl, acetyl, pivaloyl and cyclohexylcarbonyl. Of these $R^5$ groups, preferred are straight or branched alkyl groups of 1 to 6 carbon atoms, straight, branched or cyclic alkoxyalkyl groups of 2 to 7 carbon atoms, and straight or branched acyl groups of 2 to 7 carbon atoms. Most preferred are hydrogen, methyl, ethyl, methoxymethyl, 1-ethoxyethyl, tetrahydrofuran-2-yl, and acetyl.

Examples of the straight, branched or cyclic alkyl group of 1 to 10 carbon atoms represented by $R^6$ include methyl, ethyl, propyl, isopropyl, n-butyl, isobutyl, tert-butyl, cyclopentyl, cyclohexyl, cyclooctyl, norbornyl, 1-methylcyclopentyl, 1-ethylcyclopentyl, 1-methylcyclohexyl, 1-ethylcyclohexyl, 1-methylnorbornyl and 1-ethylnorbornyl. Of these groups, preferred are methyl, ethyl, propyl, isopropyl, n-butyl, isobutyl, tert-butyl, cyclopentyl, cyclohexyl, norbornyl, 1-ethylcyclopentyl and 1-ethylcyclohexyl.

The (k+2)-valent hydrocarbon groups of 1 to 10 carbon atoms represented by $W^1$ are divalent straight, branched or cyclic hydrocarbon groups of 1 to 10 carbon atoms when k is 0. Examples include methylene, dimethylmethylene, ethylidene, propylidene, butylidene, ethylene, 1-methylethylene, 2-methylethylene, 1-ethylethylene, 2-ethylethylene, 1,1-dimethylethylene, 1,2-dimethylethylene, 2,2-dimethylethylene, 1-ethyl-2-methylethylene, trimethylene, 1-methyltrimethylene, 2-methyltrimethylene, 3-methyltrimethylene, tetramethylene, pentamethylene, 1,1-cyclopentylene, 1,2-cyclopentylene, 1,3-cyclopentylene, 1,1-cyclohexylene, 1,2-cyclohexylene, 1,3-cyclohexylene, and 1,4-cyclohexylene. Of these, methylene, ethylidene, ethylene, 1-methylethylene, 2-methylethylene, trimethylene, and 2-methyltrimethylene are preferred. When k is 1, $W^1$ represents trivalent hydrocarbon groups, examples of which correspond to the above-exemplified hydrocarbon groups for k=0, with one hydrogen atom at an arbitrary position being eliminated to provide a valence bond.

Z is a divalent hydrocarbon group of 2 to 15 carbon atoms which forms a single ring or bridged ring with the carbon atom. Examples of the group represented by the formula:

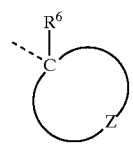

include 1-alkylcyloalkyl groups of the following general formula (13) and 2-alkyl-2-norbornyl groups of the following general formula (14), as well as 2-alkyl-2-adamantyl groups such as 2-methyl-2-adamantyl and 2-ethyl-2-adamantyl.

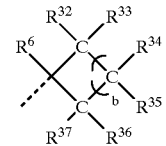

(13)

$R^6$ is as defined above, each of $R^{32}$ to $R^{37}$ is independently hydrogen or a straight, branched or cyclic alkyl group of 1 to 10 carbon atoms, and b is 0 or an integer of 1 to 6. When b is 2 to 6, a corresponding plurality of $R^{34}$ and $R^{35}$ groups may be the same or different.

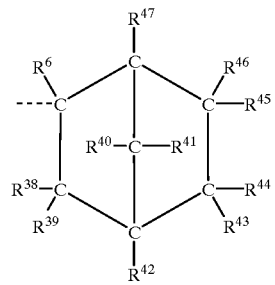

(14)

$R^6$ is as defined above, and each of $R^{38}$ to $R^{47}$ is independently hydrogen or a straight, branched or cyclic alkyl group of 1 to 10 carbon atoms.

Illustrative examples of formula (13) include 1-methylcyclopropyl, 1-methylcyclobutyl, 1-ethylcyclobutyl, 1-methylcyclopentyl, 1-ethylcyclopentyl, 1-n-propyl-cyclopentyl, 1-isopropylcyclopentyl, 1-tert-butyl-cyclopentyl, 1-cyclopentylcyclopentyl, 1-cyclohexyl-cyclopentyl, 1-norbornylcyclopentyl, 1-methylcyclohexyl, 1-ethylcyclohexyl, 1-methylcycloheptyl, 1-ethylcycloheptyl, 1-methylcyclooctyl and 1-methylcyclononyl. Of these groups, preferred are 1-alkylcyclopentyl groups of the following chemical formulas (15-1) to (15-8), namely 1-methylcyclopentyl, 1-ethylcyclopentyl, 1-n-propyl-cyclopentyl, 1-isopropylcyclopentyl, 1-tert-butyl-cyclopentyl, 1-cyclopentylcyclopentyl, 1-cyclohexyl-cyclopentyl and 1-norbornylcyclopentyl.

(15-1)

(15-2)

(15-3)

(15-4)
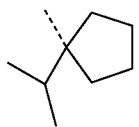
(15-5)
(15-6)
(15-7)
(15-8)
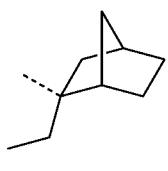
Most preferred are 1-methylcyclopentyl of formula (15-1) and 1-ethylcyclopentyl of formula (15-2).
Illustrative examples of formula (14) include 2-alkyl-2-norbornyl groups of the following chemical formulas (16-1) to (16-11), with the groups of formulas (16-1), (16-2), (16-3) and (16-4) being preferred.
(16-1)
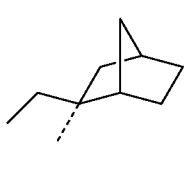
(16-2)
(16-3)
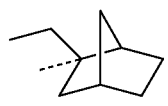
(16-4)
(16-5)
(16-6)
(16-7)
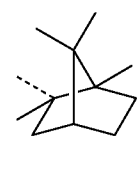
(16-8)
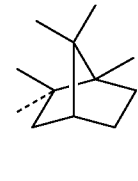
(16-9)
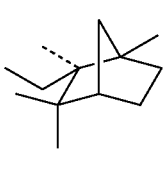
(16-10)
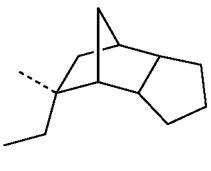
(16-11)
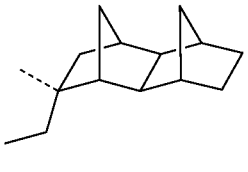
The remainders of $R^1$ to $R^4$ are independently selected from among hydrogen; straight, branched or cyclic alkyl groups of 1 to 20 carbon atoms, such as methyl, ethyl, propyl, isopropyl, n-butyl, tert-butyl, cyclohexyl and menthyl; halogen atoms such as chlorine, bromine, iodine and fluorine; straight, branched or cyclic haloalkyl groups of 1 to 20 carbon atoms, such as fluoromethyl, chloromethyl, bromomethyl, difluoromethyl, dichloromethyl, dibromomethyl, trifluoromethyl, trichloromethyl and tribromomethyl; straight, branched or cyclic alkoxy groups of 1 to 12 carbon atoms, such as methoxy, ethoxy, isopropoxy, n-butoxy, tert-butoxy and menthoxy; straight, branched or cyclic alkoxyalkyl groups of 2 to 20 carbon atoms, such as methoxymethyl, methoxyethyl, tert-butoxymethyl, tert-butoxyethyl and methoxymenthol as well as alkoxy saccharides such as methylglucose; straight, branched or cyclic alkylcarbonyloxy groups of 2 to 20 carbon atoms, such as acetoxy; arylcarbonyloxy groups of 6 to 20 carbon atoms, such as naphthoyloxy; straight, branched or cyclic alkylsulfonyloxy groups of 1 to 20 carbon atoms, such as mesyloxy; arylsulfonyloxy groups of 6 to 20 carbon atoms, such as tosyloxy; straight, branched or cyclic alkoxycarbonyl groups of 2 to 20 carbon atoms, such as methoxycarbonyl, ethoxycarbonyl, n-propoxycarbonyl, isopropoxycarbonyl, n-butoxycarbonyl, tert-butoxycarbonyl and cyclohexyloxycarbonyl; and straight, branched or cyclic alkoxycarbonylalkyl groups of 3 to 20 carbon atoms, such as methoxycarbonylmethyl, 2-(methoxycarbonyl)ethyl, 1-(methoxycarbonyl)ethyl, ethoxycarbonylmethyl, 2-(ethoxycarbonyl)ethyl, n-propoxycarbonylmethyl, isopropoxycarbonylmethyl, n-butoxycarbonylmethyl, tert-butoxycarbonylmethyl and cyclohexyloxycarbonylmethyl. Of these, preferred are hydrogen, straight, branched or cyclic alkyl groups of 1 to 20 carbon atoms, straight, branched or cyclic alkoxy groups of 1 to 20 carbon atoms, straight, branched or cyclic alkoxyalkyl groups of 2 to 20 carbon atoms, straight, branched or cyclic alkoxycarbonyl groups of 2 to 20 carbon atoms, and straight, branched or cyclic alkoxycarbonylalkyl groups of 3 to 20 carbon atoms. Most preferred are hydrogen, straight or branched alkyl groups of 1 to 10 carbon atoms, straight or branched alkoxycarbonyl groups of 2 to 10 carbon atoms, and straight or branched alkoxycarbonylalkyl groups of 3 to 10 carbon atoms.

$X^1$ is —O— or —$CR^7_2$— wherein $R^7$ is hydrogen or a straight or branched alkyl group of 1 to 10 carbon atoms. The letter j is 0 or an integer of 1 to 3. When j is 1 to 3, $X^1$ may be the same or different. Exemplary of $R^7$ are hydrogen or straight or branched alkyl groups of 1 to 10 carbon atoms such as methyl, ethyl, n-propyl, isopropyl, n-butyl and tert-butyl. Preferably $X^1$ is —O— or —$CH_2$—. More preferably all $X^1$ groups are either —O— or —$CH_2$—. Preferably j is 0 or 1.

Illustrative examples of the structural units [A] of formula (1) include structural units of the following chemical formulas (17-1-1) to (17-4-16).

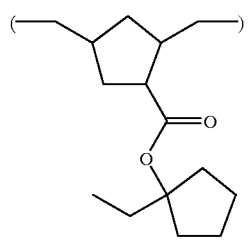

(17-1-1)

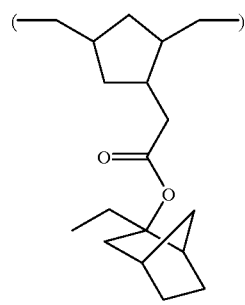

(17-1-2)

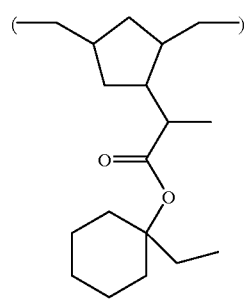

(17-1-3)

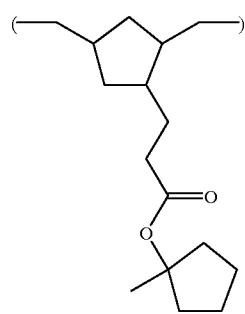

(17-1-4)

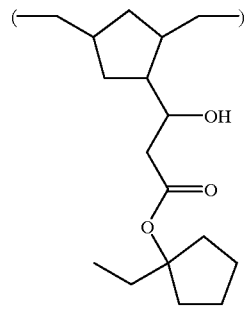

(17-1-5)

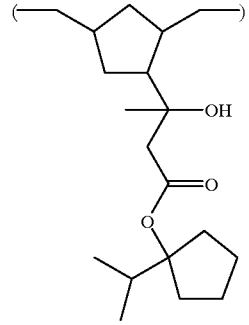

(17-1-6)

(17-1-7) 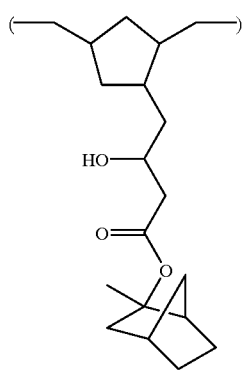
(17-1-8) 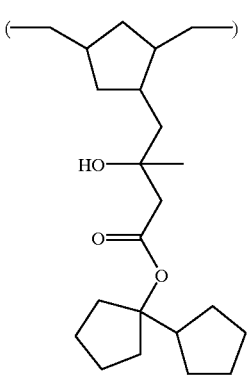
(17-1-9) 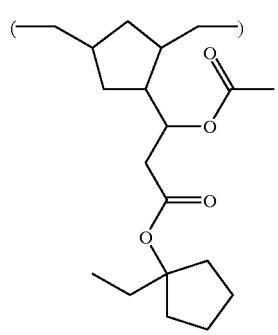
(17-1-10) 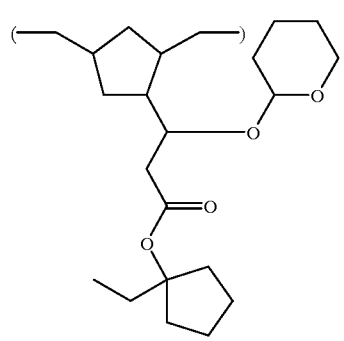
(17-1-11) 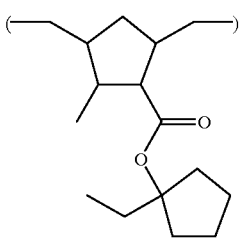
(17-1-12) 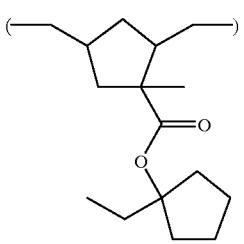
(17-1-13) 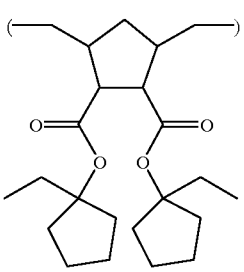
(17-1-14) 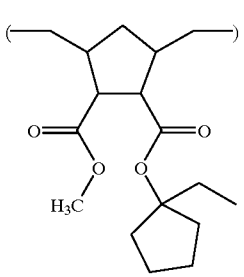
(17-1-15) 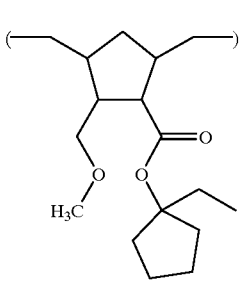
(17-1-16) 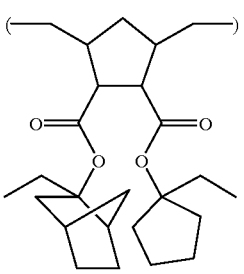

(17-2-1)
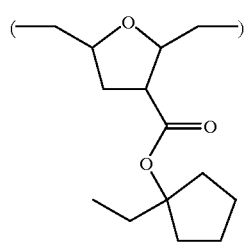
(17-2-2)
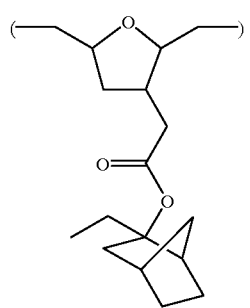
(17-2-3)
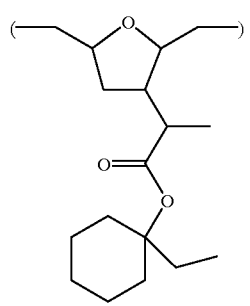
(17-2-4)
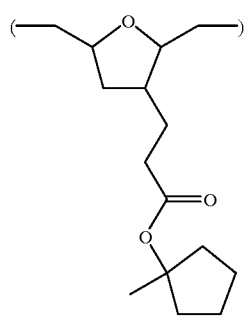
(17-2-5)
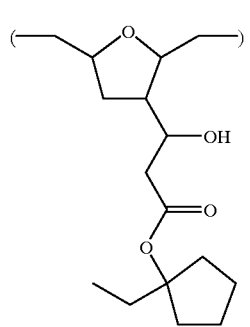
(17-2-6)
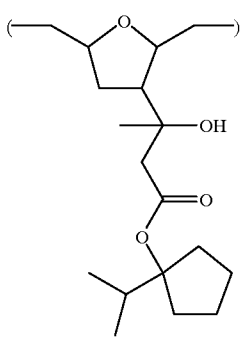
(17-2-7)
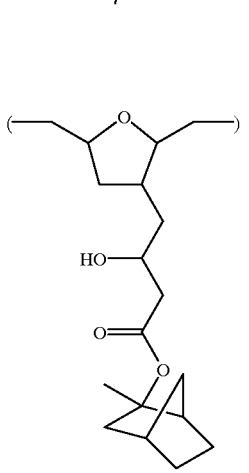
(17-2-8)
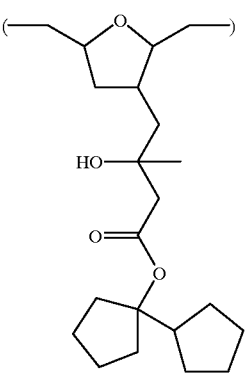
(17-2-9)
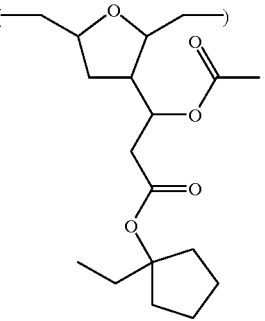

(17-2-10)
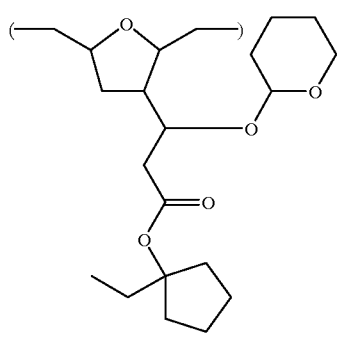
(17-2-11)
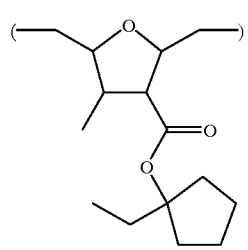
(17-2-12)
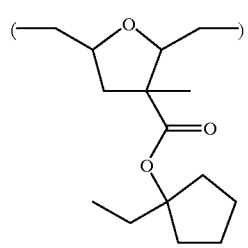
(17-2-13)
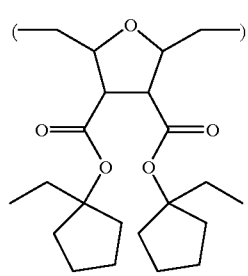
(17-2-14)
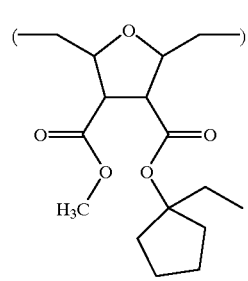
(17-2-15)
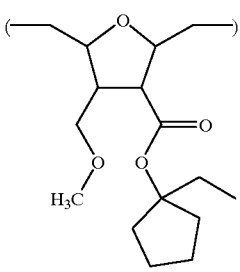
(17-2-16)
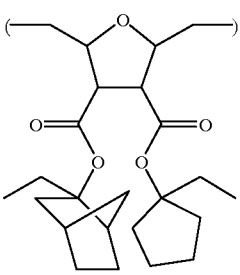
(17-3-1)
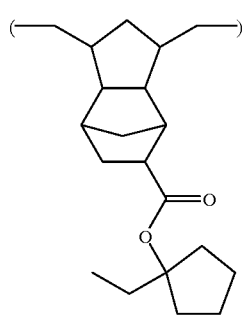
(17-3-2)
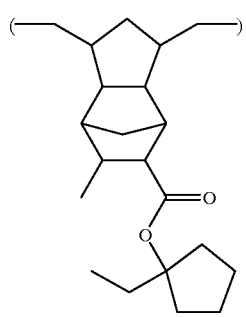
(17-3-3)
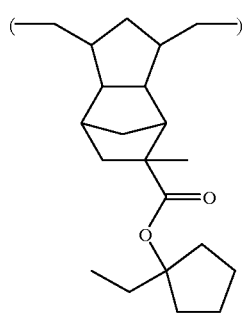

(17-3-4)
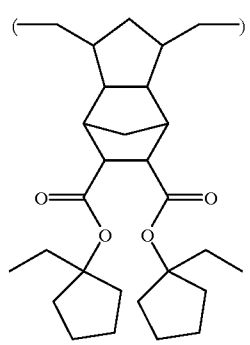
(17-3-5)
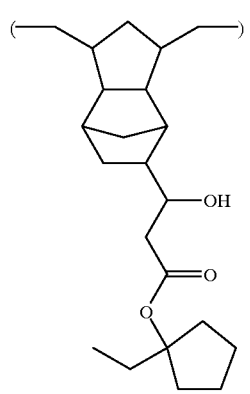
(17-3-6)
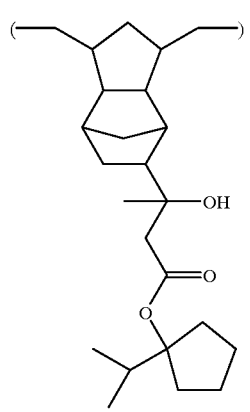
(17-3-7)
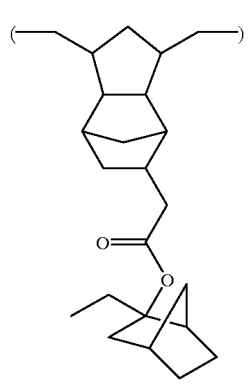
(17-3-8)
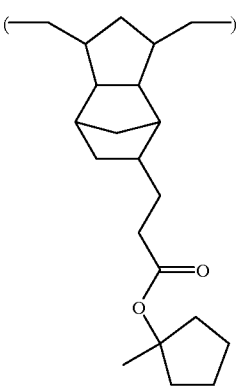
(17-3-9)
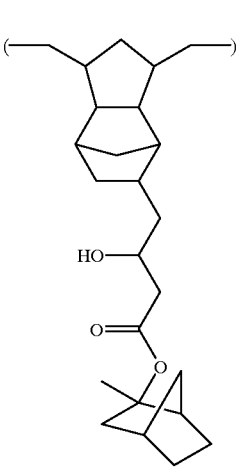
(17-3-10)
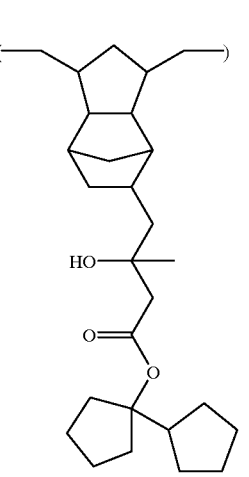

(17-3-11)
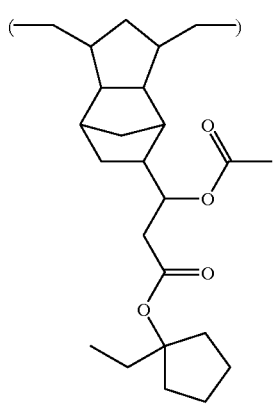
(17-3-12)
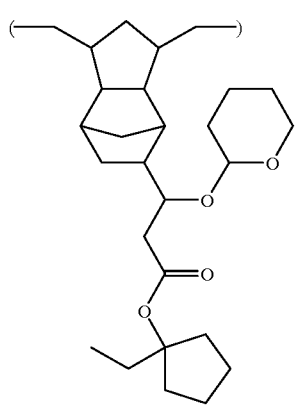
(17-3-13)
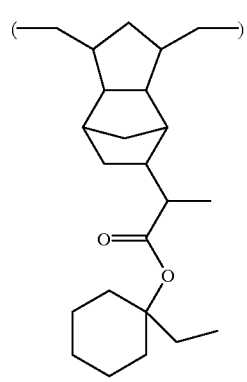
(17-3-14)
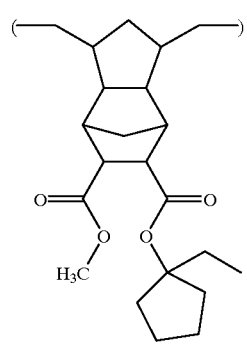
(17-3-15)
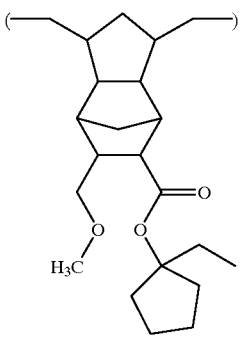
(17-3-16)
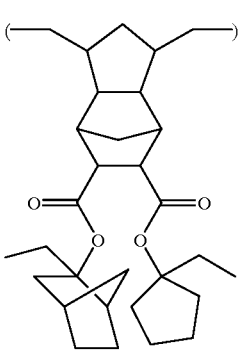
(17-4-1)
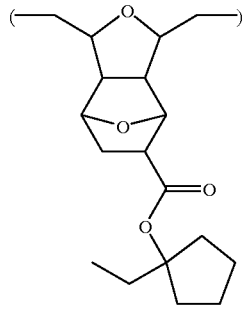
(17-4-2)
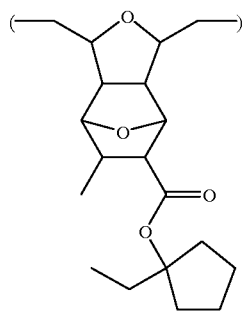

-continued
(17-4-3)
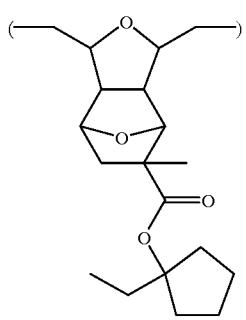
(17-4-4)
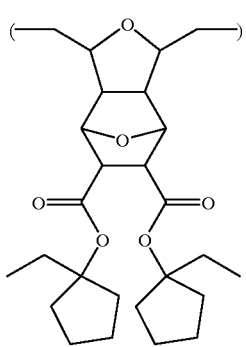
(17-4-5)
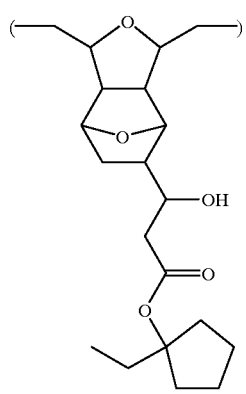
(17-4-6)
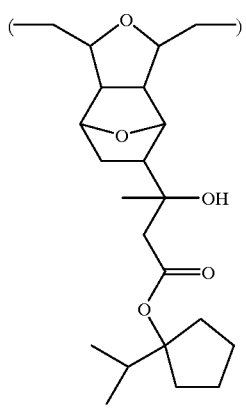
-continued
(17-4-7)
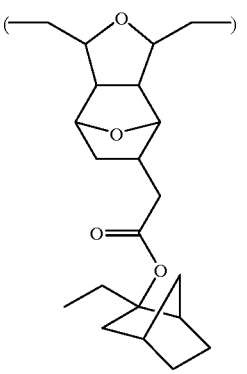
(17-4-8)
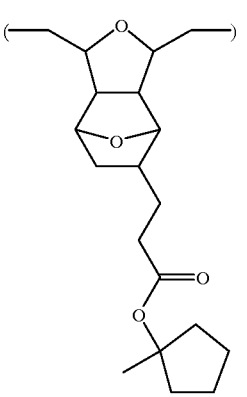
(17-4-9)
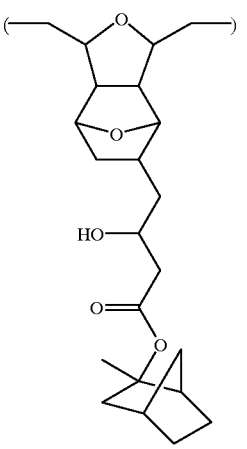
(17-4-10)
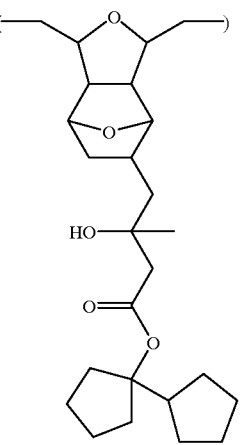

(17-4-11) 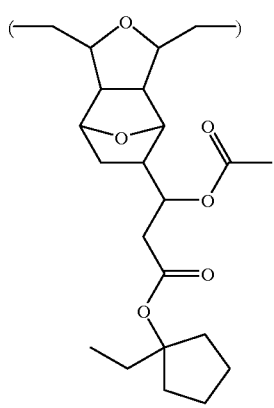

(17-4-12) 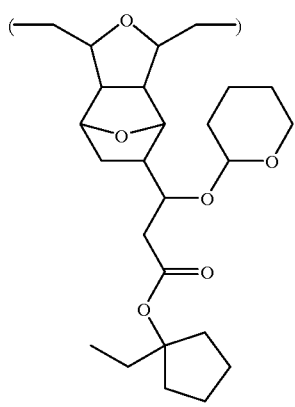

(17-4-13) 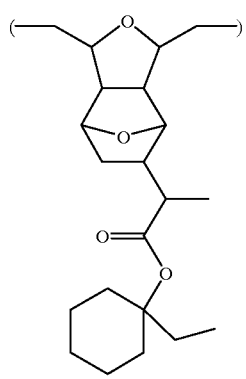

(17-4-14) 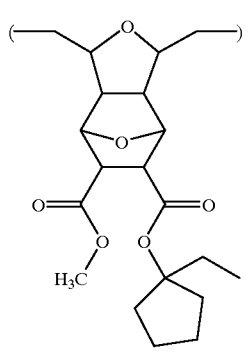

(17-4-15) 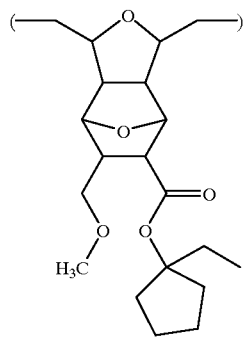

(17-4-16) 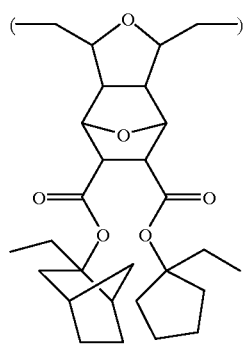

In formula (3), $R^8$ to $R^{11}$ each are independently hydrogen or straight, branched or cyclic alkyl groups of 1 to 10 carbon atoms, such as methyl, ethyl, n-propyl, isopropyl, n-butyl, tert-butyl, cyclohexyl and menthyl. $X^2$ is —O— or —$CR^{12}_2$— wherein $R^{12}$ is hydrogen or a straight or branched alkyl group of 1 to 10 carbon atoms. The letter m is 0 or an integer of 1 to 3. When m is 1 to 3, $X^2$ may be the same or different. Exemplary of $R^{12}$ are hydrogen or straight or branched alkyl groups of 1 to 10 carbon atoms such as methyl, ethyl, n-propyl, isopropyl, n-butyl and tert-butyl. Preferably $X^2$ is —O— or —$CH_2$—. More preferably all $X^2$ groups are either —O— or —$CH_2$—. Preferably m is 0 or 1.

Illustrative examples of the structural units [B] of formula (3) include structural units of the following chemical formulas (18-1) to (18-16).

(18-1) 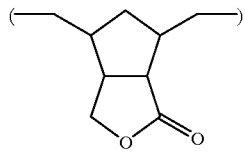

(18-2) 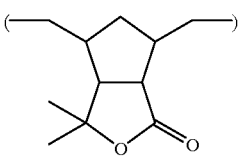

-continued (18-3)
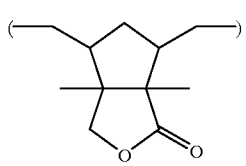

(18-4)
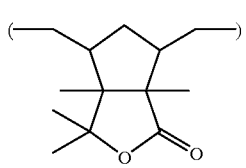

(18-5)
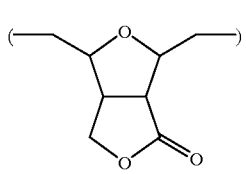

(18-6)
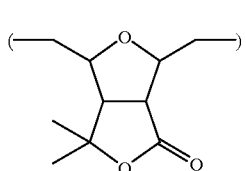

(18-7)
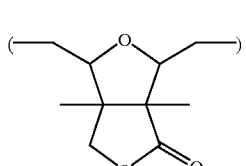

(18-8)
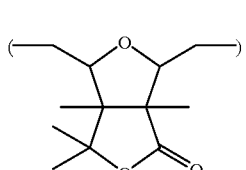

(18-9)
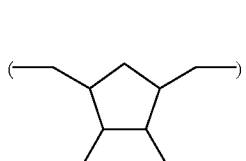

(18-10)
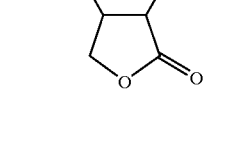

-continued (18-11)
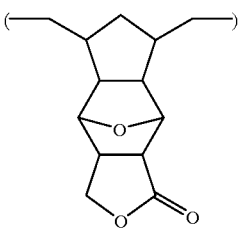

(18-12)
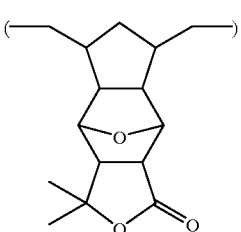

(18-13)
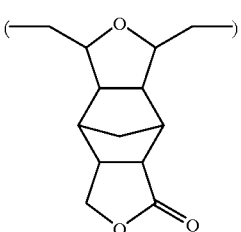

(18-14)
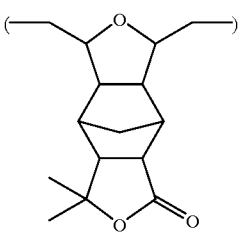

(18-15)
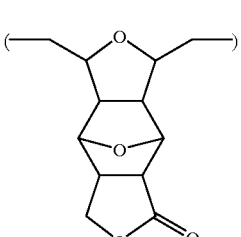

(18-16)
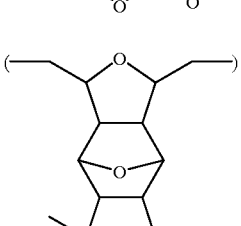

In formula (4), $R^{13}$ to $R^{16}$ each are independently hydrogen or straight, branched or cyclic alkyl groups of 1 to 10 carbon atoms, such as methyl, ethyl, n-propyl, isopropyl, n-butyl, tert-butyl, cyclohexyl and menthyl. $X^3$ is —O— or —$CR^{17}_2$— wherein $R^{17}$ is hydrogen or a straight or branched alkyl group of 1 to 10 carbon atoms. The letter n is 0 or an integer of 1 to 3. When n is 1 to 3, $X^3$ may be the same or different. Exemplary of $R^{17}$ are hydrogen or straight or branched alkyl groups of 1 to 10 carbon atoms such as methyl, ethyl, n-propyl, isopropyl, n-butyl and tert-butyl. Preferably $X^3$ is —O— or —CH$_2$—. More preferably all $X^3$ groups are either —O— or —CH$_2$—. One of $Y^1$ and $Y^2$ is —(C=O)— and the other is —CR$^{18}_2$— wherein $R^{18}$ is hydrogen or a straight or branched alkyl group of 1 to 10 carbon atoms. Exemplary of $R^{18}$ are hydrogen or straight or branched alkyl groups of 1 to 10 carbon atoms such as methyl, ethyl, n-propyl, isopropyl, n-butyl and tert-butyl. Preferably, one of $Y^1$ and $Y^2$ is —(C=O)— and the other is —CH$_2$—. Preferably n is 0 or 1.

Illustrative examples of the structural units [C] of formula (4) include structural units of the following chemical formulas (19-1) to (19-16).

(19-1)
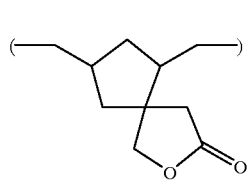

(19-2)
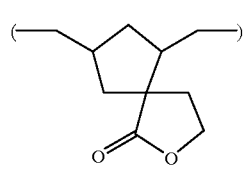

(19-3)
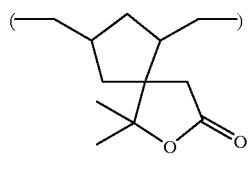

(19-4)
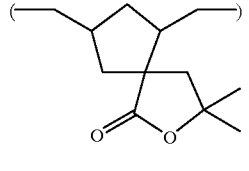

(19-5)
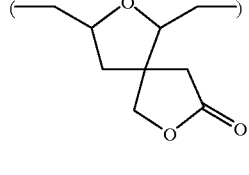

(19-6)
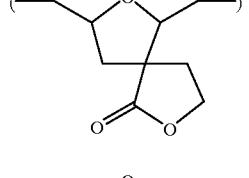

(19-7)
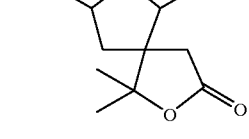

-continued (19-8)
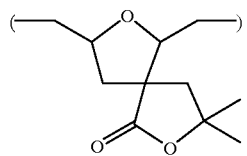

(19-9)
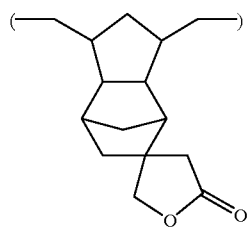

(19-10)
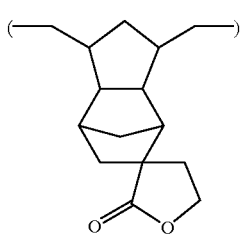

(19-11)
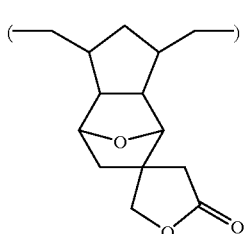

(19-12)
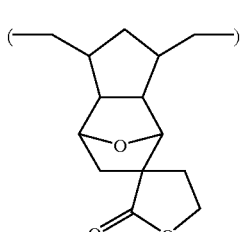

(19-13)
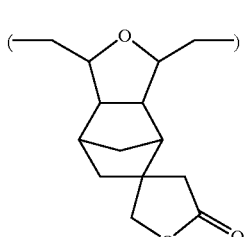

(19-14)
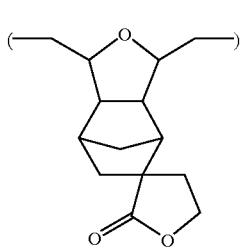

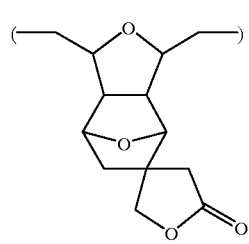

(19-15)

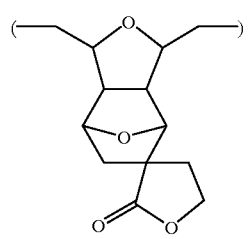

(19-16)

In the hydrogenated product of a ring-opening metathesis polymer used herein, at least one of $X^1$ in the structural units [A] of formula (1), $X^2$ in the structural units [B] of formula (3), and $X^3$ in the structural units [C] of formula (4) should be —O—. The inclusion of an oxygen atom in the backbone-forming aliphatic cyclic compound is not only effective for improving the adhesion of the polymer to silicon or other substrates to be coated therewith, lo wetting tension upon development with an aqueous alkali solution, and the solubility of the resist composition in polar organic solvents used in the step of applying the resist composition to silicon wafers, such as ketones and alcohols, but also effective for improving affinity to water and development with a stripping agent (or developer) such as an aqueous alkali solution following exposure. In a preferred embodiment, at least one of $X^1$ in structural units [A] of formula (1), $X^2$ in structural units [B] of formula (3), and $X^3$ in structural units [C] of formula (4) is —O— and the remainders are —$CH_2$—. The amount of —O— units is 1 to 99 mol %, preferably 2 to 95 mol %, more preferably 5 to 80 mol %, and most preferably 10 to 70 mol %, based on the total of $X^1$, $X^2$ and $X^3$ units.

In the polymer of the invention, the molar ratio of structural units [A] of formula (1) to the sum of structural units [B] of formula (3) and structural units [C] of formula (4), that is, [A]/([B]+[C]) is from 20/80 to 99/1. This indicates that the polymer must contain at least an amount of structural units [B] and/or [C] in addition to structural units [A]. The structural units [A] contain tertiary ester groups of cyclic alkyl represented by the general formula (2), namely groups which are decomposable with the acid generated by the photoacid generator upon exposure, to produce carboxylic acid, and are thus necessary to form a resist pattern by development with an aqueous alkali solution following exposure. The structural units [B] and/or [C] are necessary to provide adhesion to silicon or other substrates to be coated. If the constitutional molar ratio [A]/([B]+[C]) is less than 20/80, the result is under-development. If the ratio is more than 99/1, the adhesion to substrates to be coated is lost. Preferably the molar ratio [A]/([B]+[C]) is from 20/80 to 95/5, more preferably from 25/75 to 90/10, and most preferably from 30/70 to 85/15. The incorporation of the structural units in a polymer in the above range is adequate to prepare a resist composition and very important as the resist composition to be coated onto silicon or other substrates because the polymer becomes soluble in polar solvents such as 2-heptanone along with highly polar photoacid generators. A resist composition prepared using the hydrogenated ring-opening metathesis polymer is capable of forming a uniform smooth coating film since the hydrogenated polymer has an increased solubility or dissolution rate in polar solvents.

In the hydrogenated ring-opening metathesis polymer, at least either one of structural units [B] and [C] is essential. The hydrogenated ring-opening metathesis polymer may be a ternary copolymer of structural units [A] and structural units [B] and [C] although a binary copolymer of structural units [A] and structural units [B] or [C] is preferred.

The hydrogenated ring-opening metathesis polymer used herein should have a narrow molecular weight distribution as demonstrated by a dispersity between 1.0 and 2.0, the dispersity (also known as polydispersity index) being defined as a weight average molecular weight (Mw) divided by a number average molecular weight (Mn). The molecular weight distribution of a polymer largely affects the resolution when used as a resist composition, with a narrower molecular weight distribution leading to a pattern with a higher resolution. Preferably the dispersity is from 1.0 to 1.8, more preferably from 1.0 to 1.6. Usually, the hydrogenated ring-opening metathesis polymer has a number average molecular weight (Mn) of 500 to 200,000, preferably 1,000 to 100,000, more preferably 3,000 to 50,000, even more preferably 3,000 to 20,000. It is noted that both the number and weight average molecular weights used herein are measured by gel permeation chromatography (GPC) using a polystyrene standard.

In the hydrogenated ring-opening metathesis polymers, each of the structural units [A], [B] and [C] may be of one type, or any or all of them may be a mixture of two or more types. For instance, hydrogenated products of ring-opening metathesis polymers are included in which the structural units [A] are comprised of structural units [A-1] and [A-2] of the following general formulas (1-1) and (1-2), respectively, the structural units [B] are comprised of structural units [B-1] and [B-2] of the following general formulas (3-1) and (3-2), respectively, and the structural units [C] are comprised of structural units [C-1] and [C-2] of the following general formulas (4-1) and (4-2), respectively.

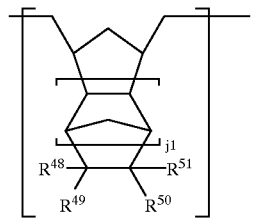

(1-1)

In formula (1-1), at least one of $R^{48}$ to $R^{51}$ is a functional group having a tertiary ester group of cyclic alkyl represented by the general formula (2), and the remainders are each independently selected from among hydrogen, straight, branched or cyclic alkyl groups of 1 to 20 carbon atoms, halogen atoms, straight, branched or cyclic haloalkyl groups of 1 to 20 carbon atoms, straight, branched or cyclic alkoxy groups of 1 to 20 carbon atoms, straight, branched or cyclic alkoxyalkyl groups of 2 to 20 carbon atoms, straight, branched or cyclic alkylcarbonyloxy groups of 2 to 20 carbon atoms, arylcarbonyloxy groups of 6 to 20 carbon atoms, straight, branched or cyclic alkylsulfonyloxy groups of 1 to 20 carbon atoms, arylsulfonyloxy groups of 6 to 20 carbon atoms, straight, branched or cyclic alkoxycarbonyl groups of 2 to 20 carbon atoms, and straight, branched or cyclic alkoxycarbonylalkyl groups of 3 to 20 carbon atoms, and $j_1$ is 0 or an integer of 1 to 3.

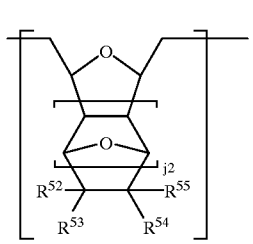

(1-2)

In formula (1-2), at least one of $R^{52}$ to $R^{55}$ is a functional group having a tertiary ester group of cyclic alkyl represented by the general formula (2), and the remainders are each independently selected from among hydrogen, straight, branched or cyclic alkyl groups of 1 to 20 carbon atoms, halogen atoms, straight, branched or cyclic haloalkyl groups of 1 to 20 carbon atoms, straight, branched or cyclic alkoxy groups of 1 to 20 carbon atoms, straight, branched or cyclic alkoxyalkyl groups of 2 to 20 carbon atoms, straight, branched or cyclic alkylcarbonyloxy groups of 2 to 20 carbon atoms, arylcarbonyloxy groups of 6 to 20 carbon atoms, straight, branched or cyclic alkylsulfonyloxy groups of 1 to 20 carbon atoms, arylsulfonyloxy groups of 6 to 20 carbon atoms, straight, branched or cyclic alkoxycarbonyl groups of 2 to 20 carbon atoms, and straight, branched or cyclic alkoxycarbonylalkyl groups of 3 to 20 carbon atoms, and j2 is 0 or an integer of 1 to 3.

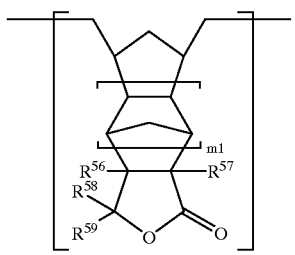

(3-1)

In formula (3-1), $R^{56}$ to $R^{59}$ are each independently selected from hydrogen and straight, branched or cyclic alkyl groups of 1 to 10 carbon atoms, and $m_1$ is 0 or an integer of 1 to 3.

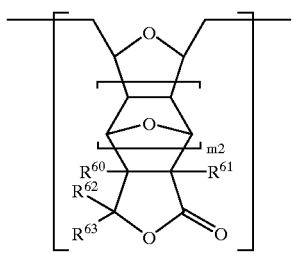

(3-2)

In formula (3-2), $R^{60}$ to $R^{63}$ are each independently selected from hydrogen and straight, branched or cyclic alkyl groups of 1 to 10 carbon atoms, and $m_2$ is 0 or an integer of 1 to 3.

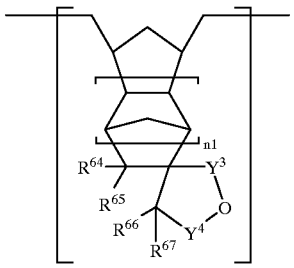

(4-1)

In formula (4-1), $R^{64}$ to $R^{67}$ are each independently selected from hydrogen and straight, branched or cyclic alkyl groups of 1 to 10 carbon atoms, one of $Y^3$ and $Y^4$ is —(C=O)— and the other is —CH$_2$—, and $n_1$ is 0 or an integer of 1 to 3.

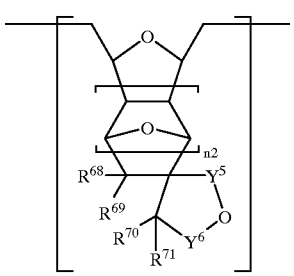

(4-2)

In formula (4-2), $R^{68}$ to $R^{71}$ are each independently selected from hydrogen and straight, branched or cyclic alkyl groups of 1 to 10 carbon atoms, one of $Y^5$ and $Y^6$ is —(C=O)— and the other is —CH$_2$—, and $n_2$ is 0 or an integer of 1 to 3.

In one preferred embodiment, the hydrogenated product of ring-opening metathesis copolymer further includes structural units [D] of the following general formula (5) in addition to structural units [A] and structural units [B] and/or [C]. The inclusion of structural units [D] is effective for improving the adhesion to substrates and the affinity to developers.

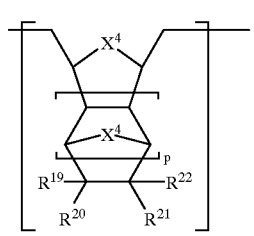

(5)

Herein at least one of $R^{19}$ to $R^{22}$ is a functional group having a carboxylic acid group represented by the following general formula (6):

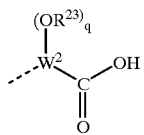
(6)

wherein the broken line denotes a valence bond, $R^{23}$ is selected from among hydrogen, straight, branched or cyclic alkyl groups of 1 to 10 carbon atoms, straight, branched or cyclic alkoxyalkyl groups of 2 to 10 carbon atoms, and straight, branched or cyclic acyl groups of 1 to 10 carbon atoms, $W^2$ is a single bond or (q+2)-valent-hydrocarbon group of 1 to 10 carbon atoms, and q is 0 or 1; the remainders of $R^{19}$ to $R^{22}$ are independently selected from among hydrogen, straight, branched or cyclic alkyl groups of 1 to 20 carbon atoms, halogen atoms, straight, branched or cyclic haloalkyl groups of 1 to 20 carbon atoms, straight, branched or cyclic alkoxy groups of 1 to 20 carbon atoms, straight, branched or cyclic alkoxyalkyl groups of 2 to 20 carbon atoms, straight, branched or cyclic alkylcarbonyloxy groups of 2 to 20 carbon atoms, arylcarbonyloxy groups of 6 to 20 carbon atoms, straight, branched or cyclic alkylsulfonyloxy groups of 1 to 20 carbon atoms, arylsulfonyloxy groups of 6 to 20 carbon atoms, straight, branched or cyclic alkoxycarbonyl groups of 2 to 20 carbon atoms, and straight, branched or cyclic alkoxycarbonylalkyl groups of 3 to 20 carbon atoms.

$X^4$, which may be the same or different, is —O— or —$CR^{24}_2$— wherein $R^{24}$ is hydrogen or a straight or branched alkyl group of 1 to 10 carbon atoms; and p is 0 or an integer of 1 to 3.

Of the groups represented by $R^{23}$, the straight, branched or cyclic alkyl groups of 1 to 10 carbon atoms include, for example, methyl, ethyl, propyl, isopropyl, n-butyl, isobutyl, tert-butyl, cyclopentyl, cyclohexyl, 1-ethylcyclopentyl and 1-ethylcyclohexyl. Examples of the straight, branched or cyclic alkoxyalkyl group of 2 to 10 carbon atoms include methoxymethyl, 1-ethoxyethyl, 1-tert-butoxyethyl, 1-cyclohexyloxyethyl, 1-ethoxypropyl, 1-ethoxy-1-methylethyl, tetrahydrofuran-2-yl and tetrahydropyran-2-yl. Examples of the straight, branched or cyclic acyl group of 1 to 10 carbon atoms include formyl, acetyl, pivaloyl and cyclohexylcarbonyl. Of these $R^{23}$ groups, preferred are straight or branched alkyl groups of 1 to 6 carbon atoms, straight, branched or cyclic alkoxyalkyl groups of 2 to 7 carbon atoms, and straight or branched acyl groups of 2 to 7 carbon atoms. Most preferred are hydrogen, methyl, ethyl, methoxymethyl, 1-ethoxyethyl, tetrahydrofuran-2-yl, and acetyl.

The (q+2)-valent hydrocarbon groups of 1 to 10 carbon atoms represented by $W^2$ are divalent straight, branched or cyclic hydrocarbon groups of 1 to 10 carbon atoms when q is 0. Examples include methylene, dimethylmethylene, ethylidene, propylidene, butylidene, ethylene, 1-methylethylene, 2-methylethylene, 1-ethylethylene, 2-ethylethylene, 1,1-dimethylethylene, 1,2-dimethylethylene, 2,2-dimethylethylene, 1-ethyl-2-methylethylene, trimethylene, 1-methyltrimethylene, 2-methyltrimethylene, 3-methyltrimethylene, tetramethylene, pentamethylene, 1,1-cyclopentylene, 1,2-cyclopentylene, 1,3-cyclopentylene, 1,1-cyclohexylene, 1,2-cyclohexylene, 1,3-cyclohexylene, and 1,4-cyclohexylene. Of these, methylene, ethylidene, ethylene, 1-methylethylene, 2-methylethylene, trimethylene, and 2-methyltrimethylene are preferred. When q is 1, $W^2$ represents trivalent hydrocarbon groups, examples of which correspond to the above-exemplified hydrocarbon groups for q=0, with one hydrogen atom at an arbitrary position being eliminated to provide a valence bond. Most preferred $W^2$ is a single bond.

The remainders of $R^{19}$ to $R^{22}$ are independently selected from among hydrogen; straight, branched or cyclic alkyl groups of 1 to 20 carbon atoms, such as methyl, ethyl, propyl, isopropyl, n-butyl, tert-butyl, cyclohexyl and menthyl; halogen atoms such as chlorine, bromine, iodine and fluorine; straight, branched or cyclic haloalkyl groups of 1 to 20 carbon atoms, such as fluoromethyl, chloromethyl, bromomethyl, difluoromethyl, dichloromethyl, dibromomethyl, trifluoromethyl, trichloromethyl and tribromomethyl; straight, branched or cyclic alkoxy groups of 1 to 12 carbon atoms, such as methoxy, ethoxy, isopropoxy, n-butoxy, tert-butoxy and menthoxy; straight, branched or cyclic alkoxyalkyl groups of 2 to 20 carbon atoms, such as methoxymethyl, methoxyethyl, tert-butoxymethyl, tert-butoxyethyl and methoxymenthol as well as alkoxy saccharides such as methylglucose; straight, branched or cyclic alkylcarbonyloxy groups of 2 to 20 carbon atoms, such as acetoxy; arylcarbonyloxy groups of 6 to 20 carbon atoms, such as naphthoyloxy; straight, branched or cyclic alkylsulfonyloxy groups of 1 to 20 carbon atoms, such as mesyloxy; arylsulfonyloxy groups of 6 to 20 carbon atoms, such as tosyloxy; straight, branched or cyclic alkoxycarbonyl groups of 2 to 20 carbon atoms, such as methoxycarbonyl, ethoxycarbonyl, n-propoxycarbonyl, isopropoxycarbonyl, n-butoxycarbonyl, tert-butoxycarbonyl and cyclohexyloxycarbonyl; and straight, branched or cyclic alkoxycarbonylalkyl groups of 3 to 20 carbon atoms, such as methoxycarbonylmethyl, 2-(methoxycarbonyl)ethyl, 1-(methoxy-carbonyl)ethyl, ethoxycarbonylmethyl, 2-(ethoxycarbonyl)-ethyl, n-propoxycarbonylmethyl, isopropoxycarbonylmethyl, n-butoxycarbonylmethyl, tert-butoxycarbonylmethyl and cyclohexyloxycarbonylmethyl. Of these, preferred are hydrogen, straight, branched or cyclic alkyl groups of 1 to 20 carbon atoms, straight, branched or cyclic alkoxy groups of 1 to 20 carbon atoms, straight, branched or cyclic alkoxyalkyl groups of 2 to 20 carbon atoms, straight, branched or cyclic alkoxycarbonyl groups of 2 to 20 carbon atoms, and straight, branched or cyclic alkoxycarbonylalkyl groups of 3 to 20 carbon atoms. Most preferred are hydrogen, straight or branched alkyl groups of 1 to 10 carbon atoms, straight or branched alkoxycarbonyl groups of 2 to 10 carbon atoms, and straight or branched alkoxycarbonylalkyl groups of 3 to 10 carbon atoms.

$X^4$ is —O— or —$CR^{23}_2$— wherein $R^{23}$ is hydrogen or a straight or branched alkyl group of 1 to 10 carbon atoms. When p is 1 to 3, $X^4$ may be the same or different. Exemplary of $R^{23}$ are hydrogen or straight or branched alkyl groups of 1 to 10 carbon atoms such as methyl, ethyl, n-propyl, isopropyl, n-butyl and tert-butyl. Preferably $X^4$ is —O— or —$CH_2$—. More preferably all $X^4$ groups are either —O— or —$CH_2$—. Preferably p is 0 or 1.

Illustrative examples of the structural units [D] of formula (5) include structural units of the following chemical formulas (20-1-1) to (20-4-16).
(20-1-1)
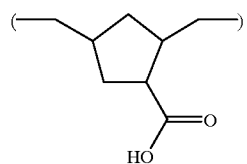
(20-1-2)
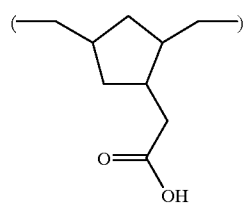
(20-1-3)
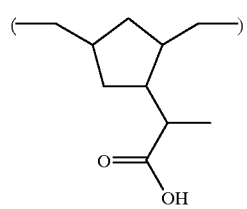
(20-1-4)
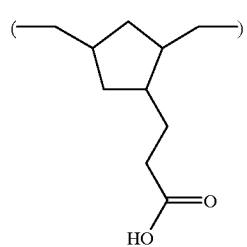
(20-1-5)
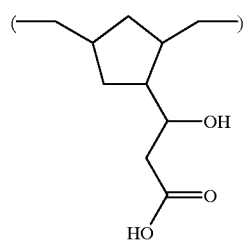
(20-1-6)
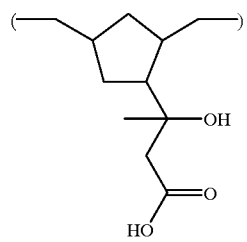
(20-1-7)
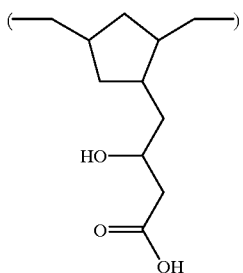
(20-1-8)
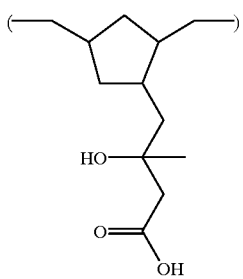
(20-1-9)
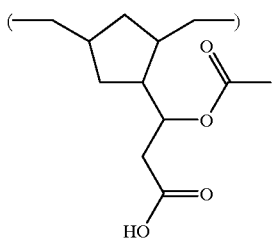
(20-1-10)
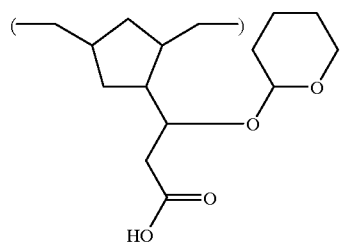
(20-1-11)
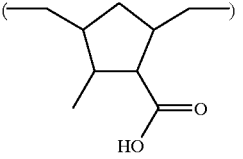
(20-1-12)
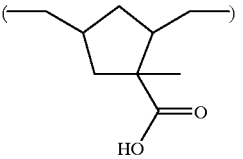
(20-1-13)
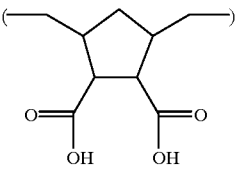

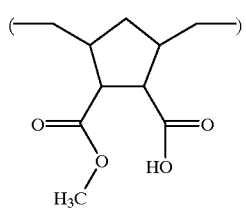
(20-1-14)
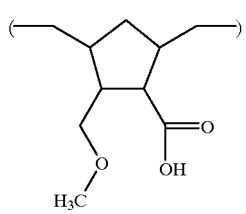
(20-1-15)
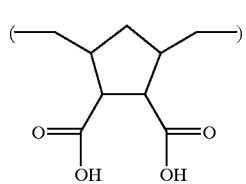
(20-1-16)
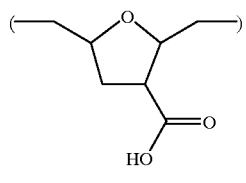
(20-2-1)
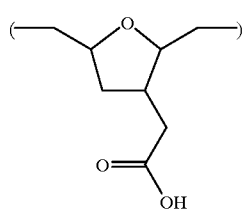
(20-2-2)
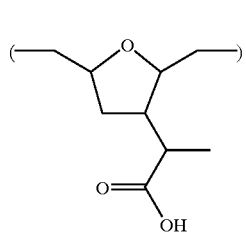
(20-2-3)
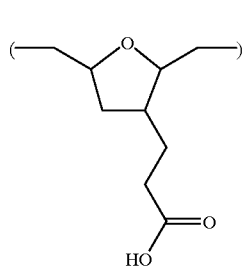
(20-2-4)
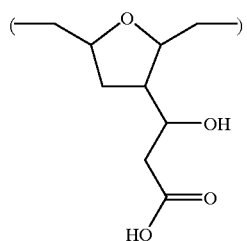
(20-2-5)
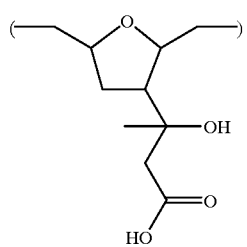
(20-2-6)
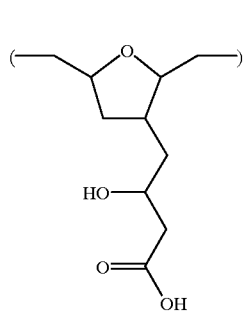
(20-2-7)
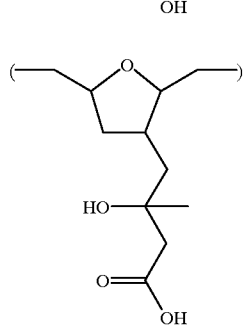
(20-2-8)
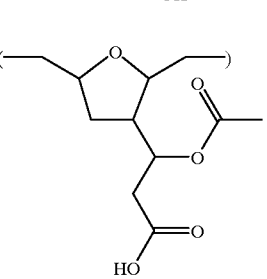
(20-2-9)
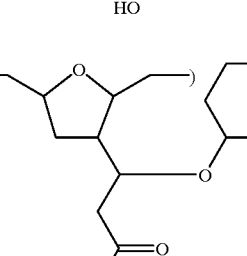
(20-2-10)

(20-2-11)
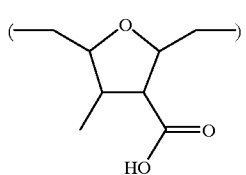
(20-2-12)
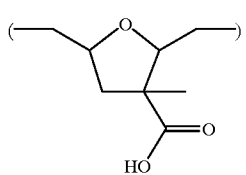
(20-2-13)
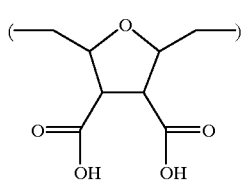
(20-2-14)
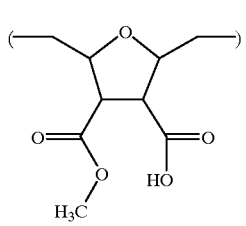
(20-2-15)
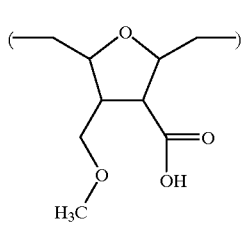
(20-2-16)
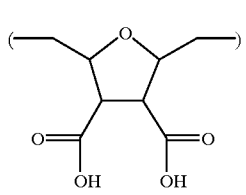
(20-3-1)
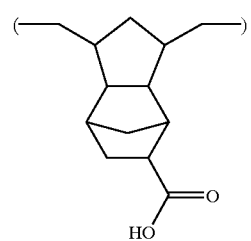
(20-3-2)
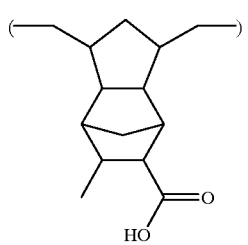
(20-3-3)
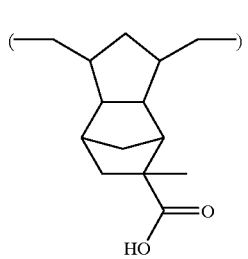
(20-3-4)
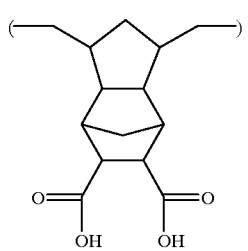
(20-3-5)
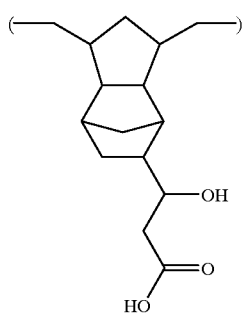
(20-3-6)
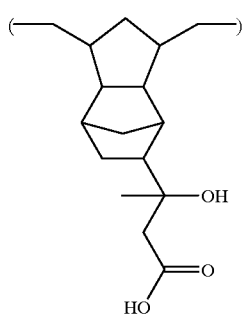

(20-3-7)
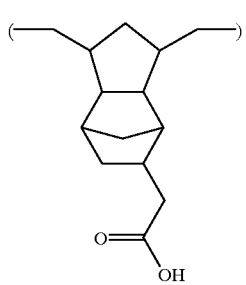
(20-3-8)
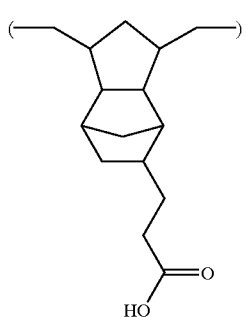
(20-3-9)
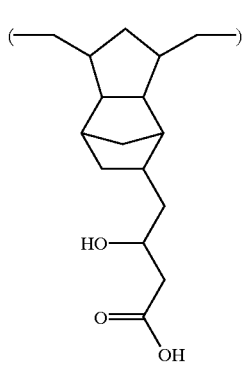
(20-3-10)
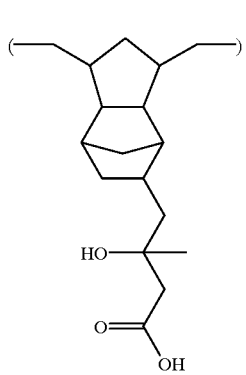
(20-3-11)
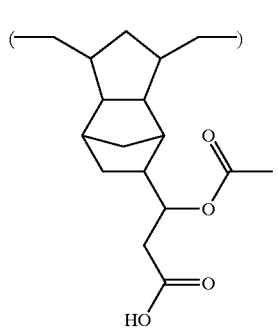
(20-3-12)
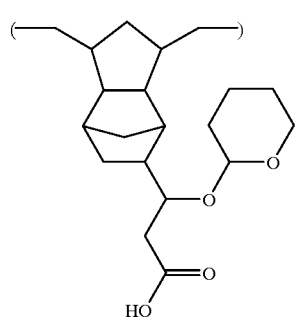
(20-3-13)
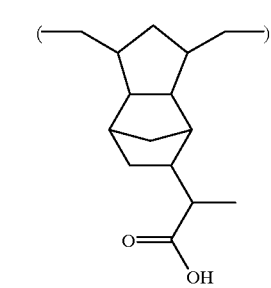
(20-3-14)
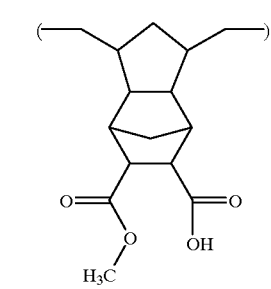
(20-3-15)
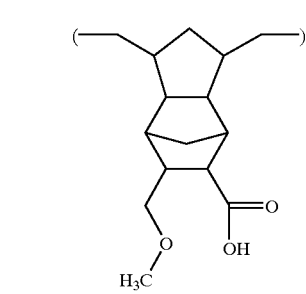
(20-3-16)
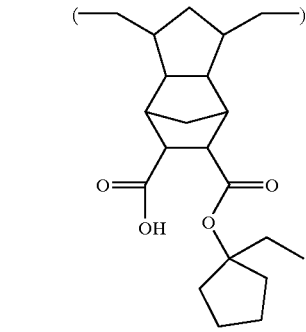

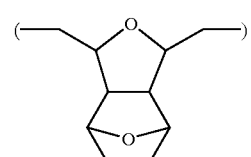 (20-4-1)
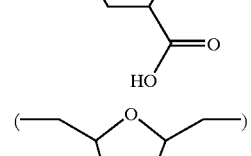 (20-4-2)
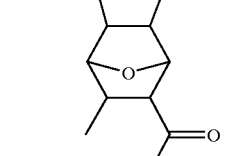 (20-4-3)
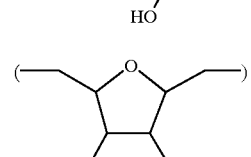 (20-4-4)
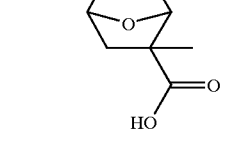 (20-4-5)
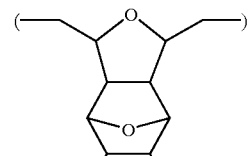 (20-4-6)
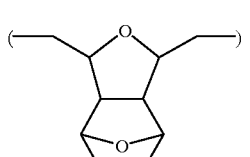 (20-4-7)
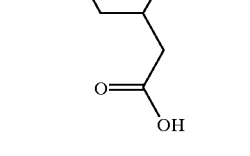 (20-4-8)
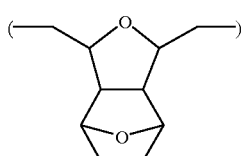 (20-4-9)
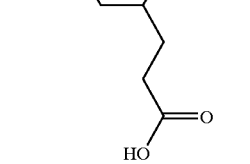 (20-4-9)
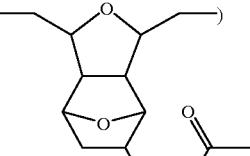 (20-4-10)
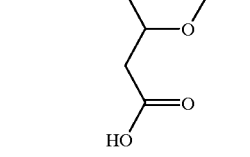 (20-4-11)

-continued (20-4-12)
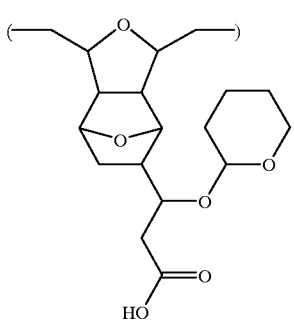

(20-4-13)
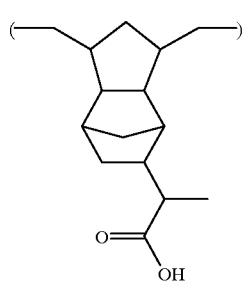

(20-4-14)
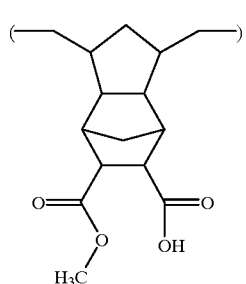

(20-4-15)
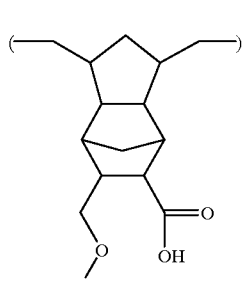

(20-4-16)
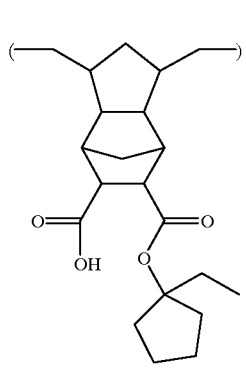

In the preferred embodiment, the constitutional molar ratio of structural units [A] of formula (1), structural units [B] of formula (3) and structural units [C] of formula (4) to structural units [D] of formula (5), defined as ([A]+[B]+[C])/[D], may range from 100/0 to 20/80. It is preferred that a quantity of structural units [D] be included in addition to structural units [A], [B] and [C]. The structural units [D] are effective for substantially improving the adhesion to substrates to be coated, typically silicon substrates and the affinity to developers. The molar ratio ([A]+[B]+[C])/[D] is more preferably from 98/2 to 50/50, even more preferably from 97/3 to 60/40, and most preferably from 95/5 to 70/30.

In a further preferred embodiment, the hydrogenated product of ring-opening metathesis copolymer further include structural units [E] of the following general formula (7) in addition to structural units [A], structural units [B] and/or [C] and preferably, structural units [D].

(7)
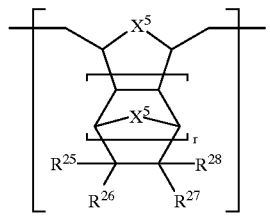

Herein at least one of $R^{25}$ to $R^{28}$ is a functional group having a carboxylate group represented by the following general formula (8):

(8)
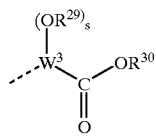

wherein the broken line denotes a valence bond, $R^{29}$ is selected from among hydrogen, straight, branched or cyclic alkyl groups of 1 to 10 carbon atoms, straight, branched or cyclic alkoxyalkyl groups of 2 to 10 carbon atoms, and straight, branched or cyclic acyl groups of 1 to 10 carbon atoms, $R^{30}$ is a straight, branched or cyclic alkyl group of 1 to 10 carbon atoms, straight, branched or cyclic alkoxyalkyl group of 2 to 10 carbon atoms, or straight, branched or cyclic haloalkyl group of 1 to 20 carbon atoms, $W^3$ is a single bond or (s+2)-valent hydrocarbon group of 1 to 10 carbon atoms, and s is 0 or 1. The remainders of $R^{25}$ to $R^{28}$ are independently selected from among hydrogen, straight, branched or cyclic alkyl groups of 1 to 20 carbon atoms, halogen atoms, straight, branched or cyclic haloalkyl groups of 1 to 20 carbon atoms, straight, branched or cyclic alkoxy groups of 1 to 20 carbon atoms, straight, branched or cyclic alkoxyalkyl groups of 2 to 20 carbon atoms, straight, branched or cyclic alkylcarbonyloxy groups of 2 to 20 carbon atoms, arylcarbonyloxy groups of 6 to 20 carbon atoms, straight, branched or cyclic alkylsulfonyloxy groups of 1 to 20 carbon atoms, arylsulfonyloxy groups of 6 to 20 carbon atoms, straight, branched or cyclic alkoxycarbonyl groups of 2 to 20 carbon atoms, and straight, branched or cyclic alkoxycarbonylalkyl groups of 3 to 20 carbon atoms. $X^5$, which may be the same or different, is —O— or —$CR^{31}_2$— wherein $R^{31}$ is hydrogen or a straight or branched alkyl group of 1 to 10 carbon atoms; and r is 0 or an integer of 1 to 3.

Of the groups represented by $R^{28}$, the straight, branched or cyclic alkyl groups of 1 to 10 carbon atoms include, for example, methyl, ethyl, propyl, isopropyl, n-butyl, isobutyl, tert-butyl, cyclopentyl, cyclohexyl, 1-ethylcyclopentyl and 1-ethylcyclohexyl. Examples of the straight, branched or cyclic alkoxyalkyl group of 2 to 10 carbon atoms include methoxymethyl, 1-ethoxyethyl, 1-tert-butoxyethyl, 1-cyclohexyloxyethyl, 1-ethoxypropyl, 1-ethoxy-1-methylethyl, tetrahydrofuran-2-yl and tetrahydropyran-2-yl. Examples of the straight, branched or cyclic acyl group of 1 to 10 carbon atoms include formyl, acetyl, pivaloyl and cyclohexylcarbonyl. Of these $R^{28}$ groups, preferred are straight or branched alkyl groups of 1 to 6 carbon atoms, straight, branched or cyclic alkoxyalkyl groups of 2 to 7 carbon atoms, and straight or branched acyl groups of 2 to 7 carbon atoms. Most preferred are hydrogen, methyl, ethyl, methoxymethyl, 1-ethoxyethyl, tetrahydrofuran-2-yl, and acetyl.

Of the groups represented by $R^{29}$, the straight, or branched alkyl groups of 1 to 10 carbon atoms include methyl, ethyl, propyl, isopropyl, n-butyl, isobutyl, and tert-butyl; the straight, branched or cyclic alkoxyalkyl groups of 2 to 10 carbon atoms include methoxymethyl, 1-ethoxyethyl, 1-tert-butoxyethyl, 1-cyclohexyloxyethyl, 1-ethoxypropyl, 1-ethoxy-1-methylethyl, tetrahydrofuran-2-yl and tetrahydropyran-2-yl; and the straight, branched or cyclic haloalkyl groups of 1 to 20 carbon atoms include fluoromethyl, chloromethyl, bromomethyl, difluoromethyl, dichloromethyl, dibromomethyl, trifluoromethyl, trichloromethyl and tribromomethyl. Of these $R^{29}$ groups, preferred are straight or branched alkyl groups of 1 to 10 carbon atoms, especially methyl, ethyl, propyl, isopropyl, n-butyl, isobutyl and tert-butyl.

The (s+2)-valent hydrocarbon groups of 1 to 10 carbon atoms represented by $W^3$ are divalent straight, branched or cyclic hydrocarbon groups of 1 to 10 carbon atoms when s is 0. Examples include methylene, dimethylmethylene, ethylidene, propylidene, butylidene, ethylene, 1-methylethylene, 2-methylethylene, 1-ethylethylene, 2-ethylethylene, 1,1-dimethylethylene, 1,2-dimethylethylene, 2,2-dimethylethylene, 1-ethyl-2-methylethylene, trimethylene, 1-methyltrimethylene, 2-methyltrimethylene, 3-methyltrimethylene, tetramethylene, pentamethylene, 1,1-cyclopentylene, 1,2-cyclopentylene, 1,3-cyclopentylene, 1,1-cyclohexylene, 1,2-cyclohexylene, 1,3-cyclohexylene, and 1,4-cyclohexylene. Of these, methylene, ethylidene, ethylene, 1-methylethylene, 2-methylethylene, trimethylene, and 2-methyltrimethylene are preferred. When s is 1, $W^3$ represents trivalent hydrocarbon groups, examples of which correspond to the above-exemplified hydrocarbon groups for s=0, with one hydrogen atom at an arbitrary position being eliminated to provide a valence bond. Most preferred $W^3$ is a single bond.

The remainders of $R^{24}$ to $R^{27}$ are independently selected from among hydrogen; straight, branched or cyclic alkyl groups of 1 to 20 carbon atoms, such as methyl, ethyl, propyl, isopropyl, n-butyl, tert-butyl, cyclohexyl and menthyl; halogen atoms such as chlorine, bromine, iodine and fluorine; straight, branched or cyclic haloalkyl groups of 1 to 20 carbon atoms, such as fluoromethyl, chloromethyl, bromomethyl, difluoromethyl, dichloromethyl, dibromomethyl, trifluoromethyl, trichloromethyl and tribromomethyl; straight, branched or cyclic alkoxy groups of 1 to 12 carbon atoms, such as methoxy, ethoxy, isopropoxy, n-butoxy, tert-butoxy and menthoxy; straight, branched or cyclic alkoxyalkyl groups of 2 to 20 carbon atoms, such as methoxymethyl, methoxyethyl, tert-butoxymethyl, tert-butoxyethyl and methoxymenthol as well as alkoxy saccharides such as methylglucose; straight, branched or cyclic alkylcarbonyloxy groups of 2 to 20 carbon atoms, such as acetoxy; arylcarbonyloxy groups of 6 to 20 carbon atoms, such as naphthoyloxy; straight, branched or cyclic alkylsulfonyloxy groups of 1 to 20 carbon atoms, such as mesyloxy; arylsulfonyloxy groups of 6 to 20 carbon atoms, such as tosyloxy; straight, branched or cyclic alkoxycarbonyl groups of 2 to 20 carbon atoms, such as methoxycarbonyl, ethoxycarbonyl, n-propoxycarbonyl, isopropoxycarbonyl, n-butoxycarbonyl, tert-butoxycarbonyl and cyclohexyloxycarbonyl; and straight, branched or cyclic alkoxycarbonylalkyl groups of 3 to 20 carbon atoms, such as methoxycarbonylmethyl, 2-(methoxycarbonyl)ethyl, 1-(methoxycarbonyl)ethyl, ethoxycarbonylmethyl, 2-(ethoxycarbonyl)-ethyl, n-propoxycarbonylmethyl, isopropoxycarbonylmethyl, n-butoxycarbonylmethyl, tert-butoxycarbonylmethyl and cyclohexyloxycarbonylmethyl. Of these, preferred are hydrogen, straight, branched or cyclic alkyl groups of 1 to 20 carbon atoms, straight, branched or cyclic alkoxy groups of 1 to 20 carbon atoms, straight, branched or cyclic alkoxyalkyl groups of 2 to 20 carbon atoms, straight, branched or cyclic alkoxycarbonyl groups of 2 to 20 carbon atoms, and straight, branched or cyclic alkoxycarbonylalkyl groups of 3 to 20 carbon atoms. Most preferred are hydrogen, straight or branched alkyl groups of 1 to 10 carbon atoms, straight or branched alkoxycarbonyl groups of 2 to 10 carbon atoms, and straight or branched alkoxycarbonylalkyl groups of 3 to 10 carbon atoms.

$X^5$ is —O— or —$CR^{30}_2$— wherein $R^{30}$ is hydrogen or a straight or branched alkyl group of 1 to 10 carbon atoms. When r is 1 to 3, $X^5$ may be the same or different. Exemplary of $R^{30}$ are hydrogen or straight or branched alkyl groups of 1 to 10 carbon atoms such as methyl, ethyl, n-propyl, isopropyl, n-butyl and tert-butyl. Preferably $X^5$ is —O— or —$CH_2$—. More preferably all $X^5$ groups are either —O— or —$CH_2$—. Preferably r is 0 or 1.

Illustrative examples of the structural units [E] of formula (7) include structural units of the following chemical formulas (21-1-1) to (21-4-16).

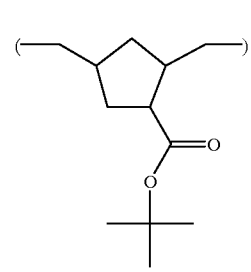

(21-1-1)

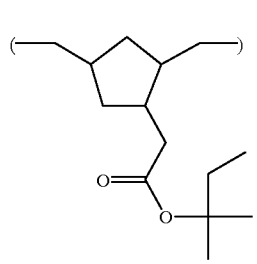

(21-1-2)

-continued
(21-1-3)
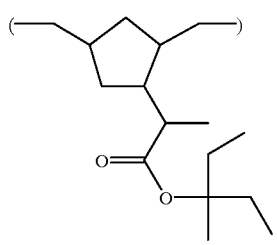
(21-1-4)
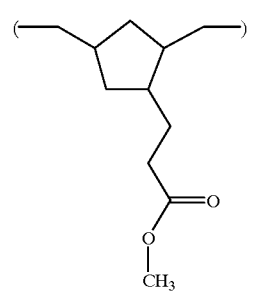
(21-1-5)
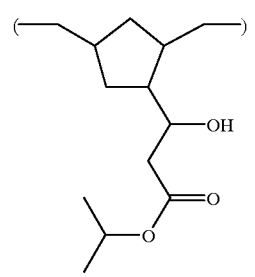
(21-1-6)
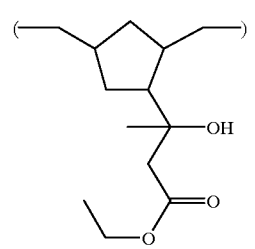
(21-1-7)
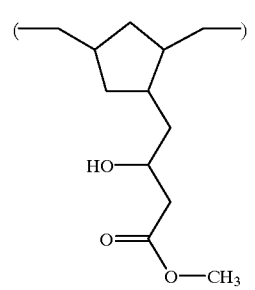
-continued
(21-1-8)
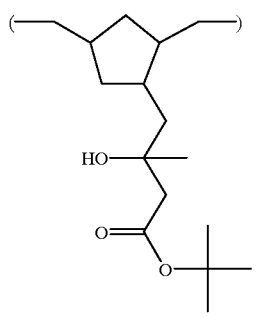
(21-1-9)
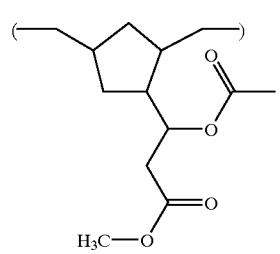
(21-1-10)
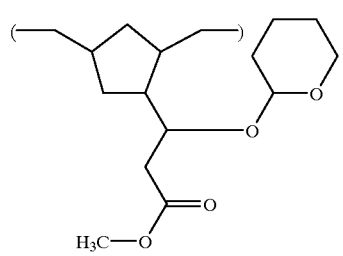
(21-1-11)
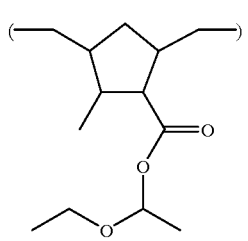
(21-1-12)
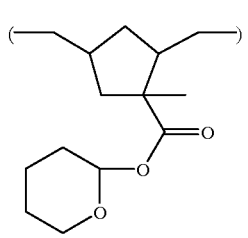
(21-1-13)
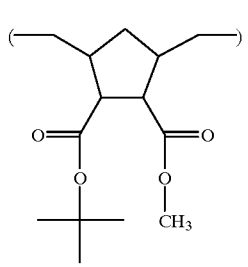

(21-1-14)
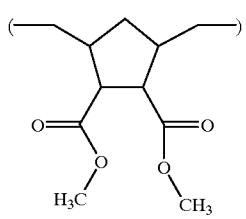
(21-1-15)
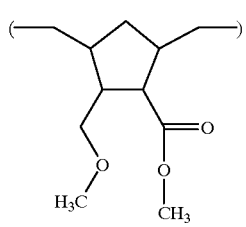
(21-1-16)
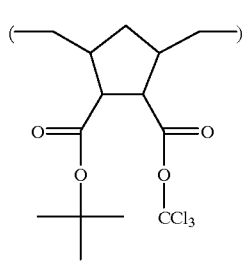
(21-2-1)
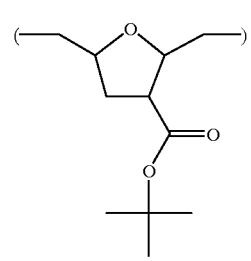
(21-2-2)
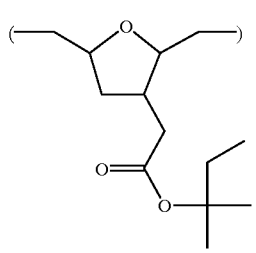
(21-2-3)
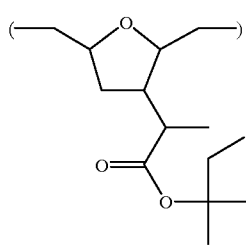
(21-2-4)
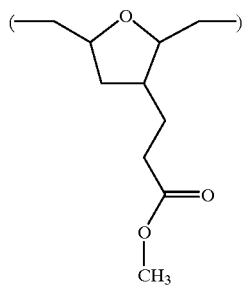
(21-2-5)
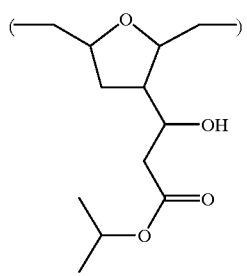
(21-2-6)
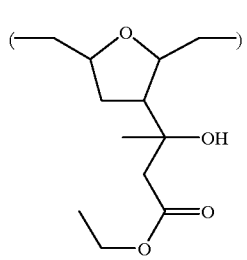
(21-2-7)
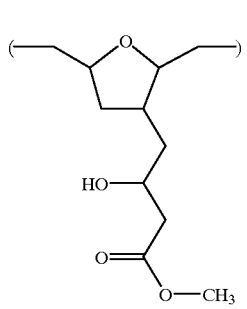
(21-2-8)
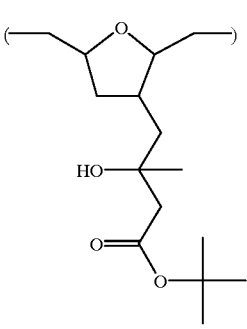

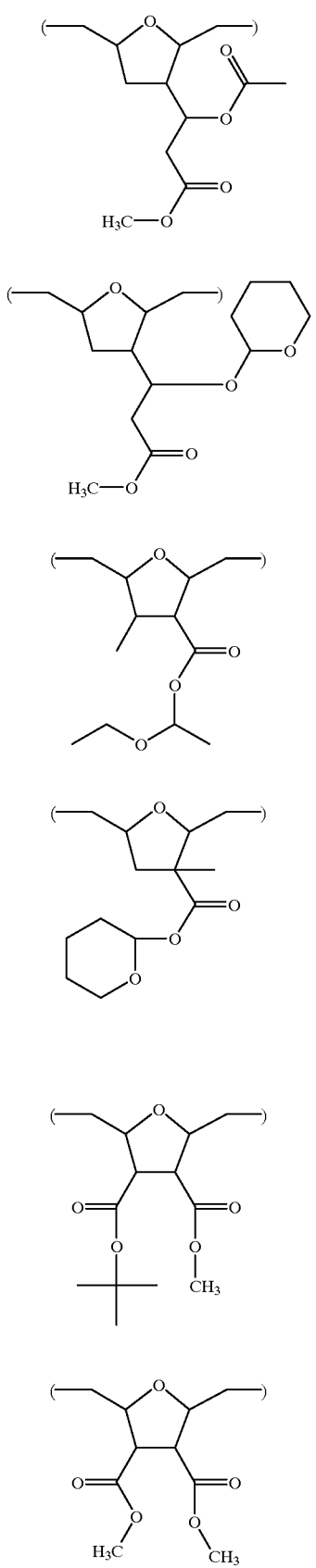
(21-2-9)
(21-2-10)
(21-2-11)
(21-2-12)
(21-2-13)
(21-2-14)
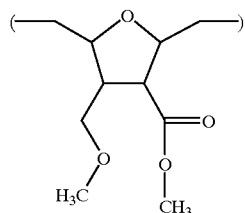
(21-2-15)
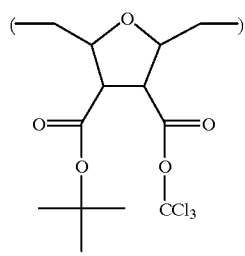
(21-2-16)
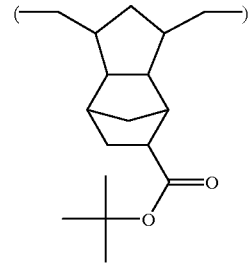
(21-3-1)
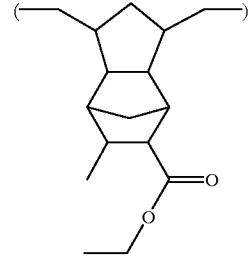
(21-3-2)
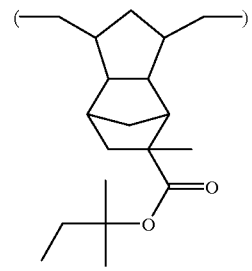
(21-3-3)
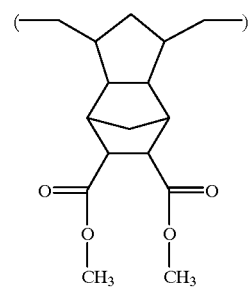
(21-3-4)

-continued
(21-3-5)
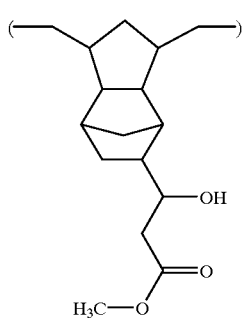
(21-3-6)
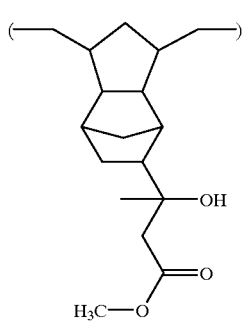
(21-3-7)
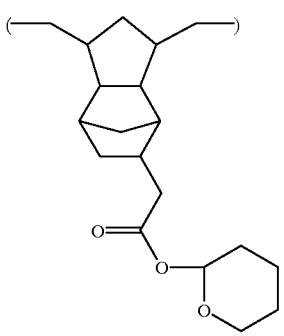
(21-3-8)
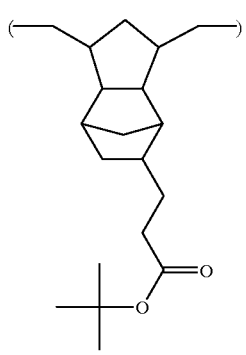
-continued
(21-3-9)
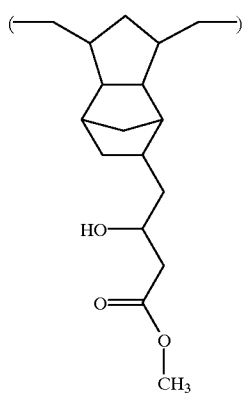
(21-3-10)
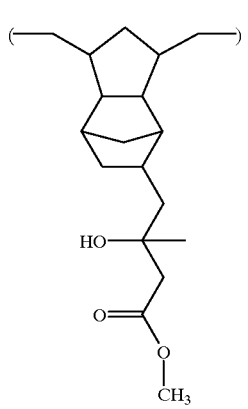
(21-3-11)
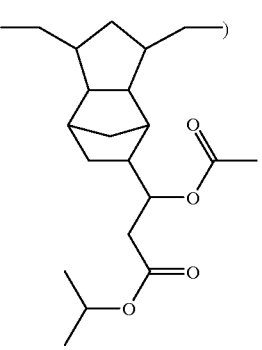
(21-3-12)
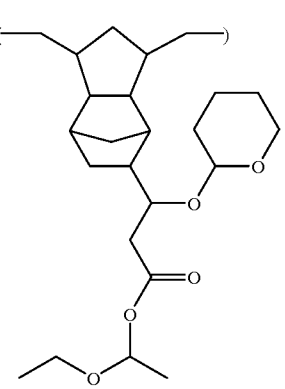

(21-3-13)
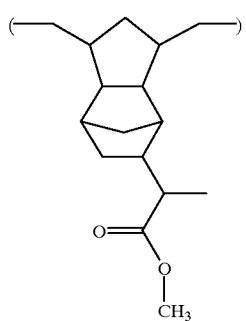
(21-3-14)
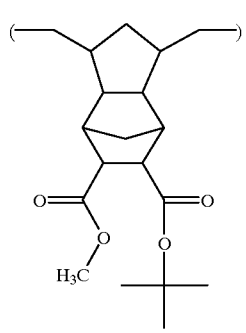
(21-3-15)
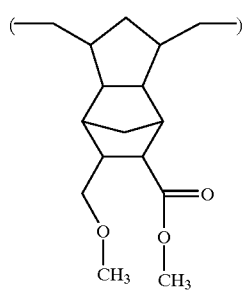
(21-3-16)
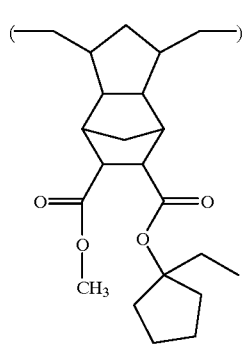
(21-4-1)
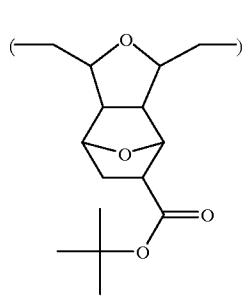
(21-4-2)
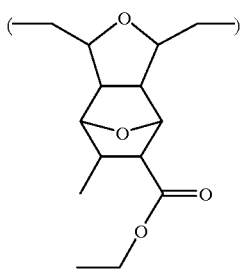
(21-4-3)
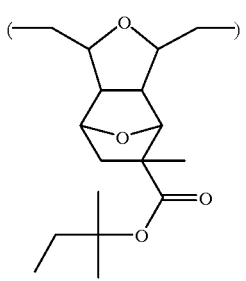
(21-4-4)
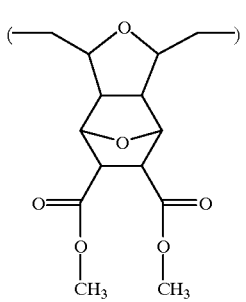
(21-4-5)
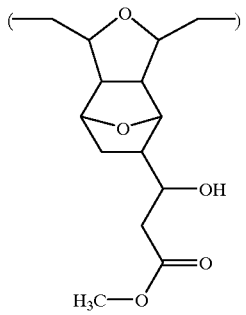
(21-4-6)
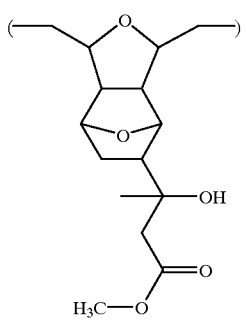

(21-4-7)
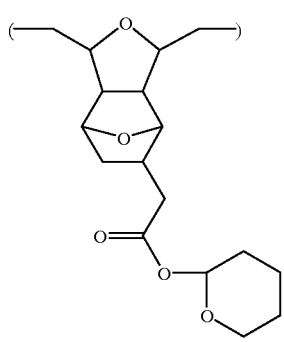
(21-4-8)
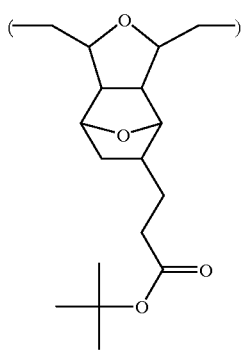
(21-4-9)
(21-4-10)
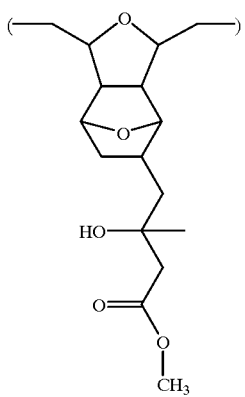
(21-4-11)
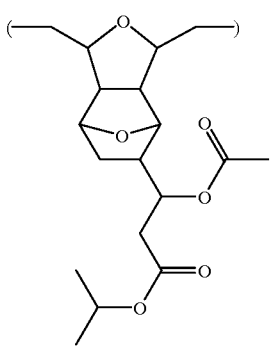
(21-4-12)
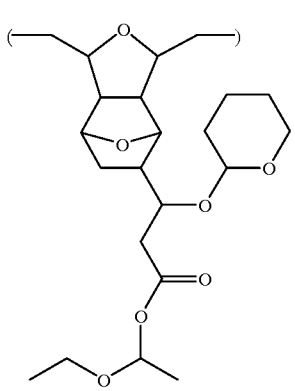
(21-4-13)
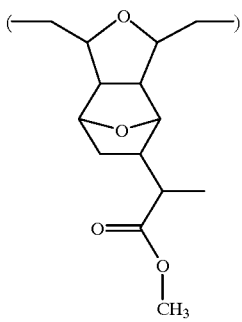
(21-4-14)

-continued (21-4-15)

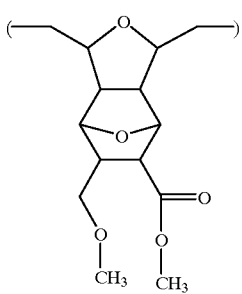

(21-4-16)

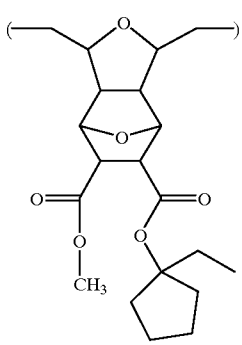

In a further preferred embodiment, the hydrogenated ring-opening metathesis copolymers may contain structural units [F] of the following general formula (22) in addition to the structural units [A] and [B] and/or [C] and optionally [D] and/or [E].

(22)

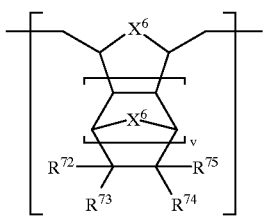

In formula (22), $R^{72}$ to $R^{75}$ are each independently selected from among hydrogen, straight, branched or cyclic alkyl groups of 1 to 20 carbon atoms, halogen atoms, straight, branched or cyclic haloalkyl groups of 1 to 20 carbon atoms, straight, branched or cyclic alkoxy groups of 1 to 20 carbon atoms, straight, branched or cyclic alkoxyalkyl groups of 2 to 20 carbon atoms, hydroxyl group, straight, branched or cyclic hydroxyalkyl groups of 1 to 20 carbon atoms, cyano group, straight, branched or cyclic cyanoalkyl groups of 2 to 20 carbon atoms, straight, branched or cyclic alkylcarbonyloxy groups of 2 to 20 carbon atoms, straight, branched or cyclic alkylcarbonyloxyalkyl groups of 3 to 20 carbon atoms, arylcarbonyloxy groups of 6 to 20 carbon atoms, straight, branched or cyclic alkyl-sulfonyloxy groups of 1 to 20 carbon atoms, straight, branched or cyclic alkylsulfonyloxyalkyl groups of 2 to 20 carbon atoms, arylsulfonyloxy groups of 6 to 20 carbon atoms; $X^6$, which may be the same or different, is —O— or —$CR^{76}{}_2$— wherein $R^{76}$ is hydrogen or a straight or branched alkyl group of 1 to 10 carbon atoms; and v is 0 or an integer of 1 to 3. The structural units [F] may be introduced in a proportion of 0 to about 50 mol %, especially 0 to about 30 mol %, based on the total moles of structural units [A] to [E].

In the hydrogenated product of ring-opening metathesis copolymer used in the invention, the molar ratio of structural units [A] of formula (1) to structural units [B] of formula (3) and/or structural units [C] of formula (4), that is, [A]/([B]+[C]) should be from 20/80 to 99/1. The structural units [A] contain tertiary ester groups of cyclic alkyl which are decomposed with the acid generated from the photoacid generator upon exposure and are essential to form a resist pattern through development with an aqueous alkali solution after exposure, and the structural units [B] and [C] are necessary to ensure the adhesion to substrates to be coated, such as silicon substrates. A molar ratio [A]/([B]+[C]) of less than 20/80 leads to under-development whereas a molar ratio [A]/([B]+[C]) of more than 99/1 fails to provide substrate adhesion. The structural units [D] of formula (6) contain carboxylic acid groups and are effective for improving the adhesion to substrates to be coated, such as silicon substrates and the dissolution in solvents. The molar ratio of structural units [A], [B] and [C] to structural units [D], ([A]+[B]+[C])/[D] should preferably range from 100/0 to 20/80, because this range can improve the wetting tension during development with an aqueous alkali solution after exposure, thereby overcoming the problem of uneven development. The incorporation of the structural units in a polymer in the above range is adequate to prepare a resist composition and very important as the resist composition to be coated onto silicon or other substrates because the polymer becomes soluble in polar solvents such as 2-heptanone along with highly polar photoacid generators. A resist composition prepared using the hydrogenated ring-opening metathesis polymer is capable of forming a uniform smooth coating film since the hydrogenated polymer has an increased solubility or dissolution rate in polar solvents. The embodiment wherein the polymer includes structural units [E] in addition to structural units [A] and [B] and/or [C] can more freely control the degree of decomposition upon exposure because the polymer contains ester groups whose reactivity differs from the reactivity of the ester groups in structural units [A]. The preferred molar ratio of these structural units, ([A]+[B]+[C])/[E], is from 100/0 to 40/60.

The hydrogenated ring-opening metathesis polymers comprising structural units [A] of formula (1) and structural units [B] of formula (3) and/or structural units [C] of formula (4), wherein at least one of $X^1$ in the structural units [A] of formula (1), $X^2$ in the structural units [B] of formula (3), and $X^3$ in the structural units [C] of formula (4) is —O— and the remainders are —$CH_2$—, are effective for further improving the adhesion to substrates to be coated, such as silicon substrates, the wetting tension upon development with an aqueous alkali solution, and the solubility in polar organic solvents such as ketones and alcohols used in the step of applying resist solutions to substrates. Additional improvements are made in the affinity to water and the developability with a stripper (or developer) such as aqueous alkali solution after exposure.

The hydrogenated ring-opening metathesis copolymer used in the invention can be prepared by polymerizing cyclic olefin monomers corresponding to the structural unit [A] of formula (1), the structural unit [B] of formula (3) and/or the structural unit [C] of formula (4), and optionally the structural unit [E] of formula (7) and further optionally the structural unit [F] of formula (22), in the presence of a ring-opening metathesis catalyst, followed by hydrogenation in the presence of a hydrogenation catalyst.

More illustratively, the cyclic olefin monomer corresponding to the structural unit [A] of formula (1) is a monomer having a structure of the following general formula (9). The cyclic olefin monomer corresponding to the structural unit [B] of formula. (3) is a monomer having a structure of the following general formula (10). The cyclic olefin monomer corresponding to the structural unit [C] of formula (4) is a monomer having a structure of the following general formula (11). The cyclic olefin monomer corresponding to the structural unit [E] of formula (7) is a monomer having a structure of the following general formula (12). The cyclic olefin monomer corresponding to the structural unit [F] of formula (22) is a monomer having a structure of the following general formula (23).

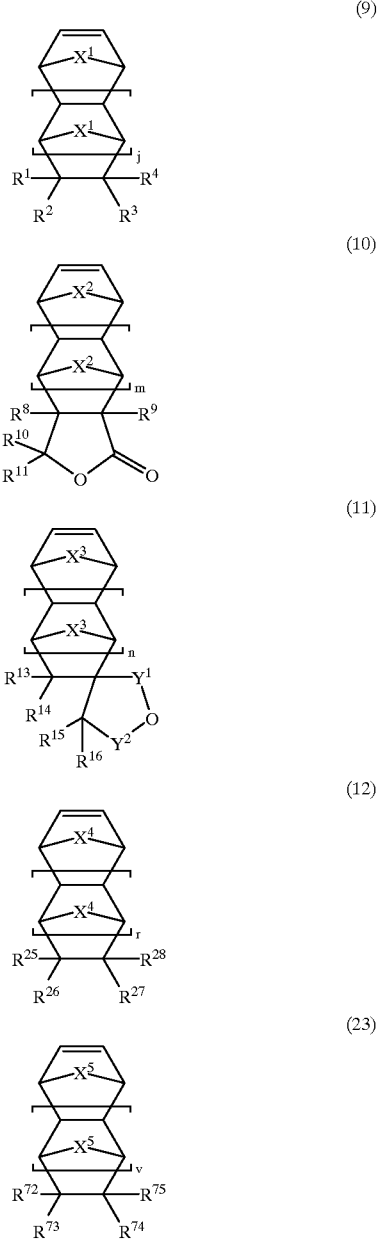

In the above formulae, $R^1$ to $R^{75}$, $X^1$ to $X^6$, $Y^1$, $Y^2$, j, m, n, r and v are as defined above.

The hydrogenated ring-opening metathesis copolymers used in the invention are prepared by polymerizing the above cyclic olefin monomers in solvents or in solventless systems in the presence of living ring-opening metathesis catalysts, and preferably in the presence of chain transfer agents such as olefins or dienes and hydrogenating the polymers in solvents under hydrogen pressure in the presence of hydrogenation catalysts.

From the hydrogenated product of ring-opening metathesis copolymer obtained by the polymerization and hydrogenation steps discussed above, by decomposing at least some of the tertiary ester groups of cyclic alkyl of formula (2) and/or the ester groups of formula (8) to convert them to carboxylic acid, there can be obtained a hydrogenated product of ring-opening metathesis polymer comprising structural units [A] of formula (1), structural units [B] of formula (3) and/or structural units [C] of formula (4), structural units [D] of formula (5), and optionally, structural units [E] of formula (7) and further optionally, structural units [F] of formula (22), wherein at least one of $X^1$ in the structural units [A] of formula (1), $X^2$ in the structural units [B] of formula (3), and $X^3$ in the structural units [C] of formula (4) is —O—, the molar ratio [A]/([B]+[C]) is from 20/80 to 99/1, and the dispersity Mw/Mn is from 1.0 to 2.0.

Any conventional method may be employed for decomposing at least some of the tertiary ester groups of cyclic alkyl of formula (2) and/or the ester groups of formula (8) to convert them to carboxylic acid.

Illustrative methods are hydrolysis under basic conditions, hydrolysis under acidic conditions, hydrolysis under neutral conditions, and acidolysis although the method is not limited thereto.

From the hydrogenated product of ring-opening metathesis polymer having carboxylic acid functional groups prepared as just above, by converting the carboxylic acid functional groups to ester groups, there can be obtained a hydrogenated product of ring-opening metathesis polymer comprising structural units [A] of formula (1), structural units [B] of formula (3) and/or structural units [C] of formula (4), and optionally structural units [D] of formula (5), and optionally, structural units [E] of formula (7) and further optionally, structural units [F] of formula (22), wherein at least one of $X^1$ in the structural units [A] of formula (1), $X^2$ in the structural units [B] of formula (3), and $X^3$ in the structural units [C] of formula (4) is —O—, the molar ratio [A]/([B]+[C]) is from 20/80 to 99/1, and the dispersity Mw/Mn is from 1.0 to 2.0.

Any conventional method may be employed for converting the carboxylic acid functional groups to ester. Illustrative methods are esterification by dehydrating condensation reaction with alcohols, esterification by ortho-alkylating agents, esterification by addition of olefins in the presence of acids, esterification by condensation reaction with halides with the aid of organic basic compounds, alkoxyalkyl esterification by the addition of alkyl vinyl ethers, esterification by conversion by thionyl chloride etc. of carboxylic acid to acid halide followed by contact with alcohols, and esterification by contacting metal salts of carboxylic acid with halides although the method is not limited thereto.

The hydrogenated ring-opening metathesis polymers having the specific structure discussed above are useful as the base polymer in photoresist compositions.

Resist composition

The resist composition of the invention is useful as a positive working resist composition, especially chemical amplification type positive working resist composition. The composition often contains a photoacid generator and an organic solvent in addition to the hydrogenated ring-opening metathesis polymer as a base resin.

Photoacid generator

The photoacid generator is a compound capable of generating an acid upon exposure to high energy radiation or electron beams and includes the following:

(i) onium salts of the formula (P1a-1), (P1a-2) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These photoacid generators are described in detail.

(i) Onium salts of formula (P1a-1), (P1a-2) or (P1b):

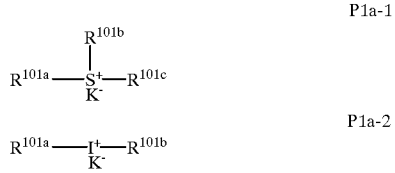

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. $K^-$ is a non-nucleophilic counter ion.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by $K^-$ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzene-sulfonate, and alkylsulfonate ions such as mesylate and butanesulfonate.

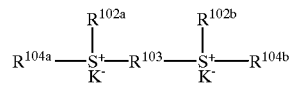

Herein, $R^{102a}$ and $R^{102b}$ independently represent straight, branched or cyclic alkyl groups of 1 to 8 carbon atoms. $R^{103}$ represents a straight, branched or cyclic alkylene groups of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (P1a-1) and (P1a-2).

(ii) Diazomethane derivatives of formula (P2)

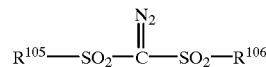

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime derivatives of formula (P3)

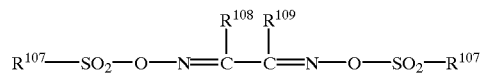

Herein, $R^{107}R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone derivatives of formula (P4)

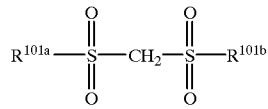

P4

Herein, $R^{101a}$ and $R^{101b}$ are as defined above. (v) Sulfonic acid esters of N-hydroxyimide compounds of formula (P5)

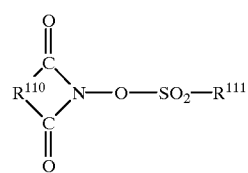

P5

Herein, $R^{101}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, 1,2-ethylene, 1,3-propylene, 1,4-butylene, 1-phenyl-1,2-ethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; the alkoxy groups of 1 to 4 carbon atoms include methoxy, ethoxy, propoxy, isopropoxy, n-butoxy, isobutoxy, and tert-butoxy; the phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the photoacid generator include:
onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis-[methyl(2-oxocyclopentyl)sulfonium trifluoromethanesulfonate], and 1,2'-naphthylcarbonylmethyltetrahydrothiophenium triflate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butane-sulfonyl)-2,3-pentanedioneglyoxime, bis-o-(n-butane-sulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoro-ethanesulfonyl)-α-dimethylglyoxime, bis-o-(tert-butanesulfonyl)-α-dimethylglyoxime, bis-o-(perfluoro-octanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α- dimethylglyoxime, bis-o-(xylenesulfonyl)-α-dimethylglyoxime, and bis-o-(camphorsulfonyl)-α-dimethylglyoxime;

bissulfone derivatives such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy) benzene; and sulfonic acid esters of N-hydroxyimides such as N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethahesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxyimide methanesulfonate, N-hydroxy-5-norbornene-2,3-dicarboxyimide trifluoromethanesulfonate, and N-hydroxy-5-norbornene-2,3-dicarboxyimide p-toluenesulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl) sulfonium trifluoromethanesulfonate, triphenylsulfonium p-toluenesulfonate, (p-tert-butoxyphenyl) diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate, and 1,2'-naphthylcarbonylmethyltetrahydrothiophenium triflate; diazomethane derivatives such as bis(benzenesulfonyl) diazomethane, bis(p-toluenesulfonyl)diazomethane, bis (cyclohexylsulfonyl)diazomethane, bis(n-butylsulfonyl) diazomethane, bis(isobutylsulfonyl)diazomethane, bis(sec-butylsulfonyl)diazomethane, bis(n-propylsulfonyl) diazomethane, bis(isopropylsulfonyl)diazomethane, and bis (tert-butylsulfonyl)diazomethane; glyoxime derivatives such as bis-o-(p-toluenesulfonyl)-α-dimethylglyoxime and bis-o-(n-butanesulfonyl)-α-dimethylglyoxime; bissulfone derivatives such as bisnaphthylsulfonylmethane; and sulfonic acid esters of N-hydroxyimide compounds such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is added in an amount of 0.1 to 15 parts, and especially 0.5 to 8 parts by weight, per 100 parts by weight of the base resin (all parts are by weight, hereinafter). Less than 0.1 part of the photoacid generator would provide a poor sensitivity whereas more than 15 parts of the photoacid generator would adversely affect transparency and resolution.

Organic solvent

The organic solvent used herein may be any organic solvent in which the base resin, photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, it is recommended to use diethylene glycol dimethyl ether and 1-ethoxy-2-propanol because the photoacid generator serving as one of the resist components is most soluble therein, propylene glycol monomethyl ether acetate because it is a safe solvent, or a mixture thereof.

An appropriate amount of the organic solvent used is about 200 to 1,000 parts, especially about 400 to 800 parts by weight per 100 parts by weight of the base resin.

Other Polymer

To the resist composition of the invention, another polymer other than the inventive hydrogenated ring-opening metathesis polymer may also be added. The other polymers that can be added to the resist composition are, for example, those polymers comprising units of the following formula (R1) or (R2) and having a weight average molecular weight of about 1,000 to about 500,000, especially about 5,000 to about 100,000 although the other polymers are not limited thereto.

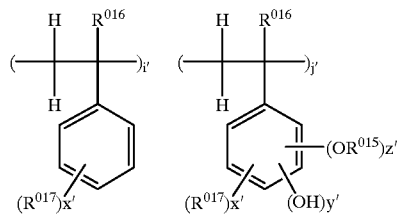

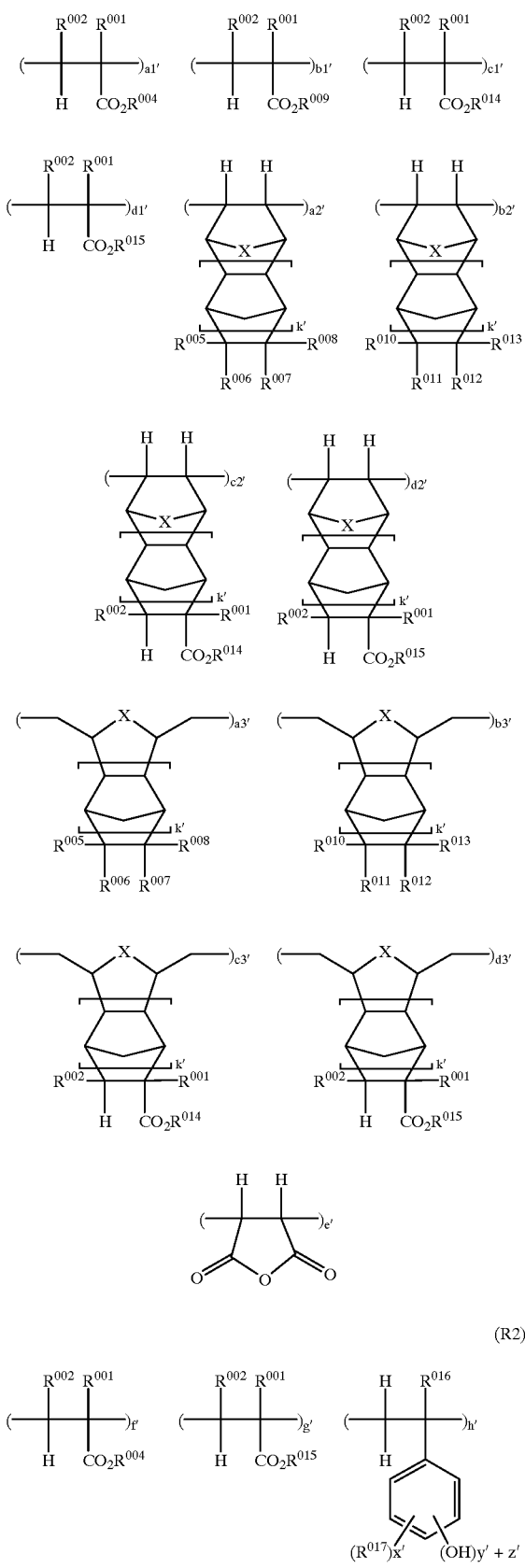

Herein, $R^{001}$ is hydrogen, methyl or $CH_2CO_2R^{003}$. $R^{002}$ is hydrogen, methyl or $CO_2R^{003}$. $R^{003}$ is a straight, branched or cyclic alkyl group of 1 to 15 carbon atoms. $R^{004}$ is hydrogen or a monovalent hydrocarbon group of 1 to 15 carbon atoms having a carboxyl or hydroxyl group. At least one of $R^{005}$ to $R^{008}$ represents a monovalent hydrocarbon group of 1 to 15 carbon atoms having a carboxyl or hydroxyl group while the remaining R's independently represent hydrogen or a straight, branched or cyclic alkyl group of 1 to 15 carbon atoms. Alternatively, $R^{005}$ to $R^{008}$, taken together, may form a ring, and in that event, at least one of $R^{005}$ to $R^{008}$ is a divalent hydrocarbon group of 1 to 15 carbon atoms having a carboxyl or hydroxyl group, while the remaining R's are independently single bonds or straight, branched or cyclic alkylene groups of 1 to 15 carbon atoms. $R^{009}$ is a monovalent hydrocarbon group of 3 to 15 carbon atoms containing a —$CO_2$— partial structure. At least one of $R^{010}$ to $R^{013}$ is a monovalent hydrocarbon group of 2 to 15 carbon atoms containing a —$CO_2$— partial structure, while the remaining R's are independently hydrogen or straight, branched or cyclic alkyl groups of 1 to 15 carbon atoms. $R^{010}$ to $R^{013}$, taken together, may form a ring, and in that event, at least one of $R^{010}$ to $R^{013}$ is a divalent hydrocarbon group of 1 to 15 carbon atoms containing a —$CO_2$— partial structure, while the remaining R's are independently single bonds or straight, branched or cyclic alkylene groups of 1 to 15 carbon atoms. $R^{014}$ is a polycyclic hydrocarbon group having 7 to 15 carbon atoms or an alkyl group containing a polycyclic hydrocarbon group. $R^{015}$ is an acid labile group. $R^{016}$ is hydrogen or methyl. $R^{017}$ is a straight, branched or cyclic alkyl group of 1 to 8 carbon atoms. X is $CH_2$ or an oxygen atom. Letter k' is 0 or 1; x', y' and z' are each an integer of 0 to 3, satisfying $x'+y'+z'\leq 5$ and $1\leq y'+z'$; a1', a2', a3', b1', b2', b3', c1', c2', c3', d1', d2', d3', and e' are numbers from 0 to less than 1, satisfying $a1'+a2'+a3'+b1'+b2'+b3'+c1'+c2'+c3'+d1'+d2'+d3'+e'=1$; f', g', h', i', and j' are numbers from 0 to less than 1, satisfying $f'+g'+h'+i'+j'=1$.

More illustratively, $R^{003}$ is a straight, branched or cyclic alkyl group of 1 to 15 carbon atoms, for example, methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

$R^{004}$ is hydrogen or a monovalent hydrocarbon group of 1 to 15 carbon atoms having a carboxyl or hydroxyl group, for example, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, and hydroxyadamantyl.

At least one of $R^{005}$ to $R^{008}$ represents a monovalent hydrocarbon group of 1 to 15 carbon atoms having a carboxyl or hydroxyl group while the remaining R's independently represent hydrogen or a straight, branched or cyclic alkyl group of 1 to 15 carbon atoms. Examples of the carboxyl or hydroxyl-bearing monovalent hydrocarbon group of 1 to 15 carbon atoms include carboxy, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, and hydroxyadamantyloxycarbonyl. Examples of the straight, branched or cyclic alkyl group of 1 to 15 carbon atoms are the same as exemplified for $R^{003}$.

Alternatively, $R^{005}$ to $R^{008}$, taken together, may form a ring, and in that event, at least one of $R^{005}$ to $R^{008}$ is a divalent hydrocarbon group of 1 to 15 carbon atoms having a carboxyl or hydroxyl group, while the remaining R's are independently single bonds or straight, branched or cyclic alkylene groups of 1 to 15 carbon atoms. Examples of the carboxyl or hydroxyl-bearing divalent hydrocarbon group of 1 to 15 carbon atoms include the groups exemplified as the carboxyl or hydroxyl-bearing monovalent hydrocarbon group, with one hydrogen atom eliminated therefrom. Examples of the straight, branched or cyclic alkylene groups of 1 to 15 carbon atoms include the groups exemplified for $R^{003}$, with one hydrogen atom eliminated therefrom.

$R^{009}$ is a monovalent hydrocarbon group of 3 to 15 carbon atoms containing a —$CO_2$— partial structure, for example, 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

At least one of $R^{010}$ to $R^{013}$ is a monovalent hydrocarbon group of 2 to 15 carbon atoms containing a —$CO_2$— partial structure, while the remaining R's are independently hydrogen or straight, branched or cyclic alkyl groups of 1 to 15 carbon atoms. Examples of the monovalent hydrocarbon group of 2 to 15 carbon atoms containing a —$CO_2$— partial structure include 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Examples of the straight, branched or cyclic alkyl groups of 1 to 15 carbon atoms are the same as exemplified for $R^{003}$.

$R^{010}$ to $R^{013}$, taken together, may form a ring, and in that event, at least one of $R^{010}$ to $R^{013}$ is a divalent hydrocarbon group of 1 to 15 carbon atoms containing a —$CO_2$— partial structure, while the remaining R's are independently single bonds or straight, branched or cyclic alkylene groups of 1 to 15 carbon atoms. Examples of the divalent hydrocarbon group of 1 to 15 carbon atoms containing a —$CO_2$— partial structure include 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl, as well as the groups exemplified as the monovalent hydrocarbon group containing a —$CO_2$— partial structure, with one hydrogen atom eliminated therefrom. Examples of the straight, branched or cyclic alkylene groups of 1 to 15 carbon atoms include the groups exemplified for $R^{003}$, with one hydrogen atom eliminated therefrom.

$R^{014}$ is a polycyclic hydrocarbon group having 7 to 15 carbon atoms or an alkyl group containing a polycyclic hydrocarbon group, for example, norbornyl, bicyclo[3.3.1]-nonyl, tricyclo[5.2.1.0$^{2,6}$]decyl, adamantyl, ethyladamantyl, butyladamantyl, norbornylmethyl, and adamantylmethyl.

$R^{015}$ is an acid labile group. $R^{016}$ is hydrogen or methyl. $R^{017}$ is a straight, branched or cyclic alkyl group of 1 to 8 carbon atoms, for example, methyl, ethyl, propyl, isopropyl, n-butyl, sec-butyl, tert-butyl, tert-amyl, n-pentyl, n-hexyl, cyclopentyl, cyclohexyl, cyclopentylmethyl, cyclopentylethyl, cyclohexylmethyl, and cyclohexylethyl.

The acid labile groups represented by $R^{015}$ may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

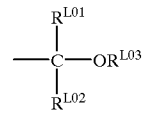

(L1)

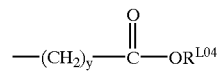

(L2)

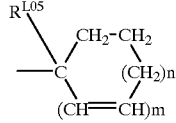

(L3)

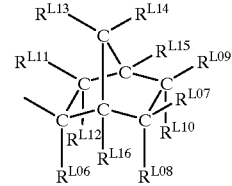

(L4)

$R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and straight, branched or cyclic alkyl groups in which some hydrogen atoms are replaced by hydroxyl, alkoxy, oxo, amino, alkylamino or the like. Illustrative examples are the substituted alkyl groups shown below.

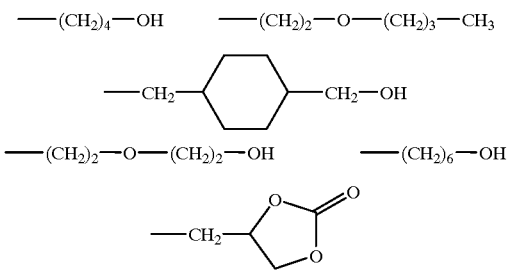

A pair of $R^{L01}$ and $R^{L02}$, $R^{L01}$ and $R^{L03}$, or $R^{L02}$ and $R^{L03}$ may form a ring. Each of $R^{L01}$, $R^{L02}$ and $R^{L03}$ is a straight or branched alkylene group of 1 to 18 carbon atoms, preferably 1 to 10 carbon atoms when they form a ring.

$R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-5-oxooxolan-4-yl. Letter y is an integer of 0 to 6.

$R^{L05}$ is a straight, branched or cyclic alkyl group of 1 to 8 carbon atoms or a substituted or unsubstituted aryl group of 6 to 20 carbon atoms. Examples of the straight, branched or cyclic alkyl group include methyl, ethyl, propyl, isopropyl, n-butyl, sec-butyl, tert-butyl, tert-amyl, n-pentyl, n-hexyl, cyclopentyl, cyclohexyl, cyclopentylmethyl, cyclopentylethyl, cyclohexylmethyl, and cyclohexylethyl. Exemplary aryl groups are phenyl, methylphenyl, naphthyl, anthryl, phenanthryl, and pyrenyl. Letter m is equal to 0 or 1, n is equal to 0, 1, 2 or 3, and 2m+n is equal to 2 or 3.

$R^{L06}$ is a straight, branched or cyclic alkyl group of 1 to 8 carbon atoms or a substituted or unsubstituted aryl group of 6 to 20 carbon atoms. Examples of these groups are the same as exemplified for $R^{L05}$.

$R^{L07}$ to $R^{L16}$ independently represent hydrogen or monovalent hydrocarbon groups of 1 to 15 carbon atoms which may contain a hetero atom. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted ones of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, $R^{L07}$ to $R^{L16}$, taken together, form a ring (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1-C_{15}$ hydrocarbon group which may contain a hetero atom, when they form a ring, examples of which are the ones exemplified above for the monovalent hydrocarbon groups, with one hydrogen atom being eliminated. Two of $R^{L07}$ to $R^{L16}$ which are attached to adjoining carbon atoms (for example, a pair of $R^{L07}$ and $R^{L09}$, $R^{L09}$ and $R^{L15}$, $R^{L13}$ and $R^{L15}$ or a similar pair) may bond together directly to form a double bond.

Of the acid labile groups of formula (L1), the straight and branched ones are exemplified by the following groups.

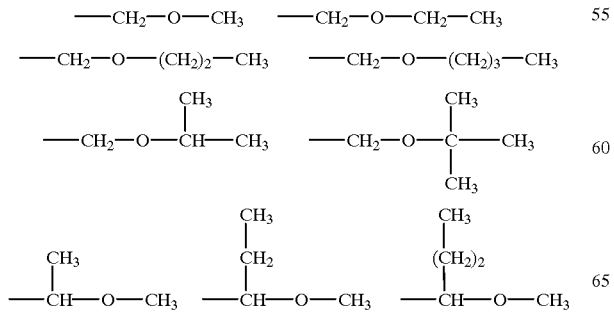

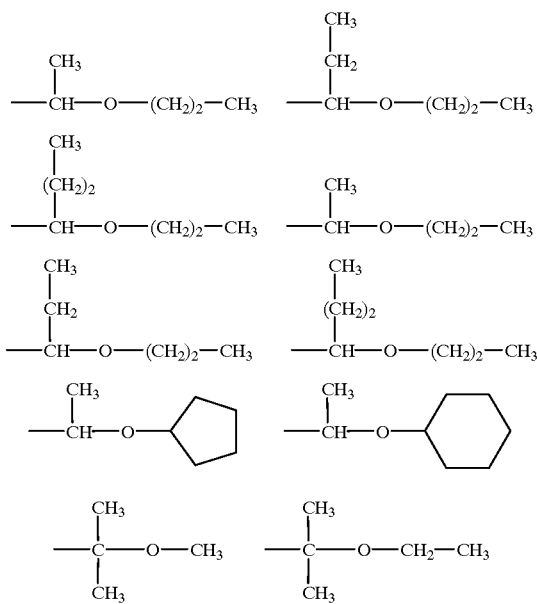

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl groups.

The acid labile groups of formula (L4) are exemplified by the following groups.

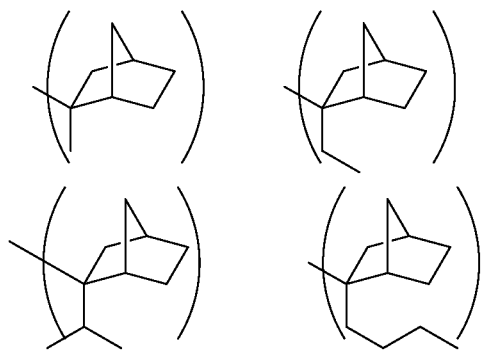

-continued

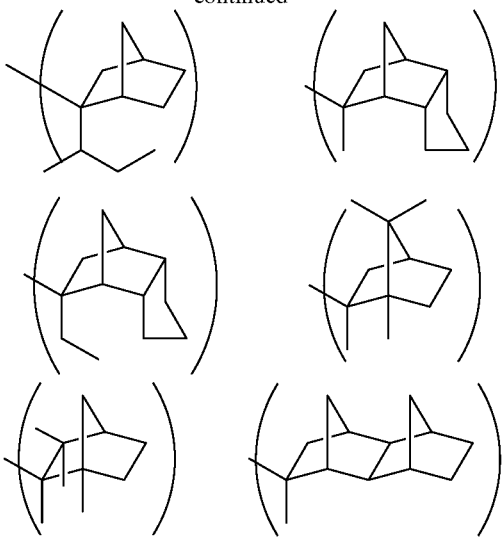

Examples of the tertiary alkyl, trialkylsilyl and oxoalkyl groups included in the acid labile groups represented by $R^{015}$ are as exemplified above.

As the acid labile group represented by $R^{015}$, there may be used one type or a combination of two or more types. The use of acid labile groups of different types enables fine adjustment of a pattern profile.

The inventive polymer (hydrogenated ring-opening metathesis polymer) and the other polymer are preferably blended in a weight ratio from 100:0 to 10:90, more preferably from 100:0 to 20:80. If the blend ratio of the inventive polymer is below this range, the resist composition would become poor in some of the desired properties. The properties of the resist composition can be adjusted by properly changing the blend ratio of the inventive polymer.

The other polymer is not limited to one type and a mixture of two or more other polymers may be added. The use of plural polymers allows for easy adjustment of resist properties.

Dissolution regulator

To the resist composition, a dissolution regulator may be added. The dissolution regulator is a compound having on the molecule at least two phenolic hydroxyl groups, in which an average of from 0 to 100 mol % of all the hydrogen atoms on the phenolic hydroxyl groups are replaced with acid labile groups or a compound having on the molecule at least one carboxyl group, in which an average of 50 to 100 mol % of all the hydrogen atoms on the carboxyl groups are replaced with acid labile groups, both the compounds having an average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below.

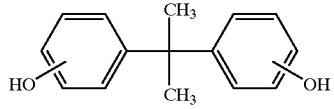 D1

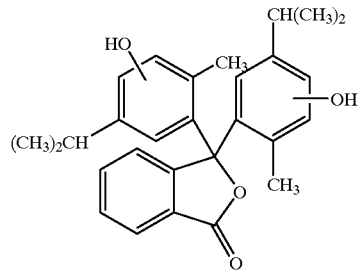 D2

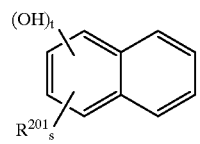 D3

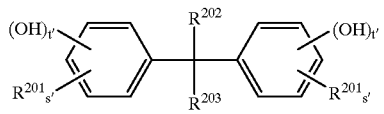 D4

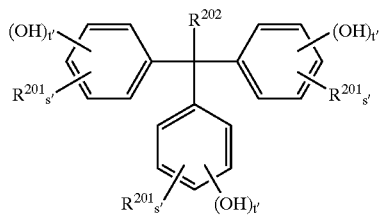 D5

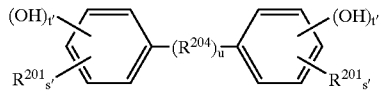 D6

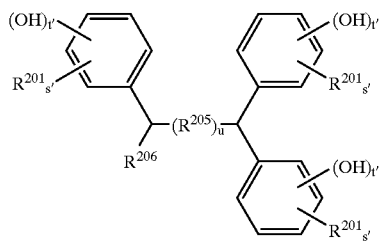 D7

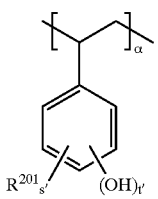 D8

-continued

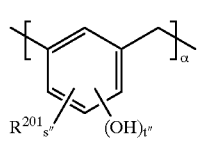
D9

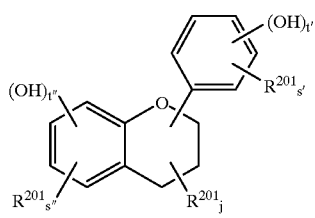
D10

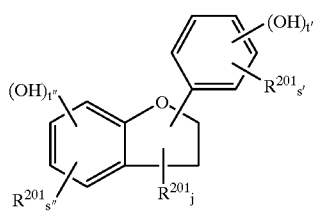
D11

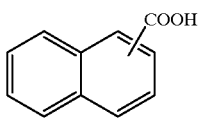
D12

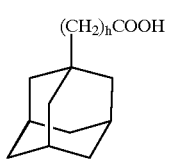
D13

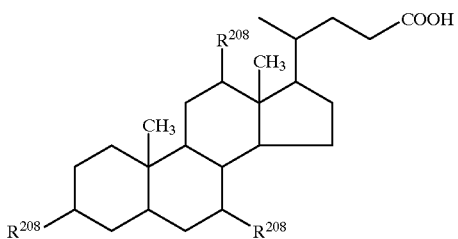
D14

In these formulas, $R^{201}$ and $R^{202}$ are each hydrogen or a straight or branched alkyl or alkenyl of 1 to 8 carbon atoms; $R^{203}$ is hydrogen, a straight or branched alkyl or alkenyl of 1 to 8 carbon atoms, or —$(R^{207})_h$—COOH; $R^{204}$ is —$(CH_2)_i$— (where i=2 to 10), an arylene of 6 to 10 carbon atoms, carbonyl, sulfonyl, an oxygen atom, or a sulfur atom; $R^{205}$ is an alkylene of 1 to 10 carbon atoms, an arylene of 6 to 10 carbon atoms, carbonyl, sulfonyl, an oxygen atom, or a sulfur atom; $R^{206}$ is hydrogen, a straight or branched alkyl or alkenyl of 1 to 8 carbon atoms, or a hydroxyl-substituted phenyl or naphthyl; $R^{207}$ is a straight or branched alkylene of 1 to 10 carbon atoms; $R^{208}$ is hydrogen or hydroxyl; the letter j is an integer from 0 to 5; u and h are each 0 or 1; s, t, s', t', s", and t" are each numbers which satisfy s+t=8, s'+t'=5, and s"+t"=4, and are such that each phenyl skeleton has at least one hydroxyl group; and α is a number such that the compounds of formula (D8) or (D9) have a molecular weight of from 100 to 1,000.

In the above formulas, suitable examples of $R^{201}$ and $R^{202}$ include hydrogen, methyl, ethyl, butyl, propyl, ethynyl, and cyclohexyl; suitable examples of $R^{203}$ include the same groups as for $R^{201}$ and $R^{202}$, as well as —COOH and —$CH_2COOH$; suitable examples of $R^{204}$ include ethylene, phenylene, carbonyl, sulfonyl, oxygen, and sulfur; suitable examples of $R^{205}$ include methylene as well as the same groups as for $R^{204}$; and suitable examples of $R^{206}$ include hydrogen, methyl, ethyl, butyl, propyl, ethynyl, cyclohexyl, and hydroxyl-substituted phenyl or naphthyl.

Exemplary acid labile groups on the dissolution regulator include groups of the following general formulae (L1) to (L4), tertiary alkyl groups of 4 to 20 carbon atoms, trialkylsilyl groups in which each of the alkyls has 1 to 6 carbon atoms, and oxoalkyl groups of 4 to 20 carbon atoms.

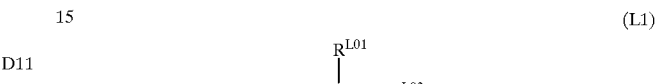
(L1)

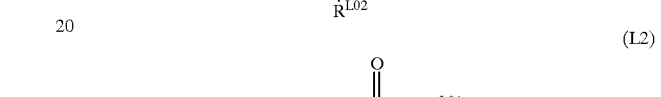
(L2)

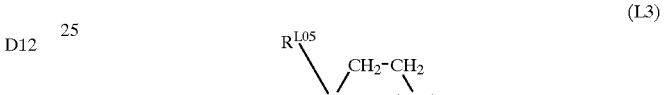
(L3)

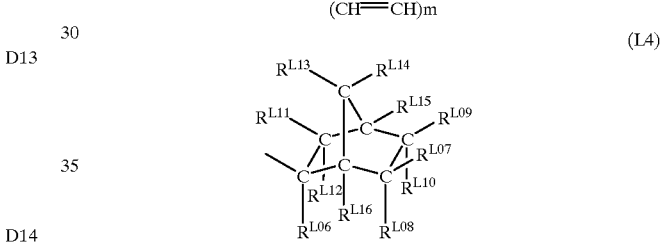
(L4)

In these formulas, $R^{L01}$ and $R^{L02}$ are each hydrogen or a straight, branched or cyclic alkyl having 1 to 18 carbon atoms; and $R^{L03}$ is a monovalent hydrocarbon group of 1 to 18 carbon atoms which may contain a heteroatom (e.g., oxygen). A pair of $R^{L01}$ and $R^{L02}$, a pair of $R^{L01}$ and $R^{L03}$ or a pair of $R^{L02}$ and $R^{L03}$ may together form a ring, with the proviso that $R^{L01}$, $R^{L02}$, and $R^{L03}$ are each a straight or branched alkylene of 1 to 18 carbon atoms when they form a ring. $R^{L04}$ is a tertiary alkyl group of 4 to 20 carbon atoms, a trialkysilyl group in which each of the alkyls has 1 to 6 carbon atoms, an oxoalkyl group of 4 to 20 carbon atoms, or a group of the formula (L1). $R^{L05}$ is a straight, branched or cyclic alkyl group of 1 to 8 carbon atoms or a substituted or unsubstituted aryl group of 6 to 20 carbon atoms. $R^{L06}$ is a straight, branched or cyclic alkyl group of 1 to 8 carbon atoms or a substituted or unsubstituted aryl group of 6 to 20 carbon atoms. $R^{L07}$ to $R^{L16}$ independently represent hydrogen or monovalent hydrocarbon groups of 1 to 15 carbon atoms which may contain a hetero atom. Alternatively, $R^{L07}$ to $R^{L16}$, taken together, may form a ring. Each of $R^{L07}$ to $R^{L16}$ represents a divalent $C_1$–$C_{15}$ hydrocarbon group which may contain a hetero atom, when they form a ring. Two of $R^{L07}$ to $R^{L16}$ which are attached to adjoining carbon atoms may bond together directly to form a double bond. Letter y is an integer of 0 to 6. Letter m is equal to 0 or 1, n is equal to 0, 1, 2 or 3, and 2m+n is equal to 2 or 3.

The dissolution regulator may be formulated in an amount of 0 to 50 parts, preferably 5 to 50 parts, and more preferably 10 to 30 parts, per 100 parts of the base resin, and may be used singly or as a mixture of two or more thereof. Less than 5 parts of the dissolution regulator may fail to yield an improved resolution, whereas the use of more than 50 parts would lead to slimming of the patterned film, and thus a decline in resolution.

The dissolution regulator can be synthesized by introducing acid labile groups into a compound having phenolic hydroxyl or carboxyl groups in accordance with an organic chemical formulation.

Basic compound

In the resist composition of the invention, a basic compound may be blended. A suitable basic compound used herein is a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)-isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B1) may also be included alone or in admixture.

$$N(X)_n(Y)_{3-n}$$ B1

In the formula, n is equal to 1, 2 or 3; Y is independently hydrogen or a straight, branched or cyclic alkyl group of 1 to 20 carbon atoms which may contain a hydroxyl group or ether; and X is independently selected from groups of the following general formulas (X1) to (X3), and two or three X's may bond together to form a ring.

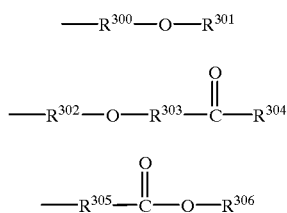

In the formulas, $R^{300}$, $R^{302}$ and $R^{305}$ are independently straight or branched alkylene groups of 1 to 4 carbon atoms; R301 and R304 are independently hydrogen, straight, branched or cyclic alkyl groups of 1 to 20 carbon atoms, which may contain at least one hydroxyl group, ether, ester or lactone ring; and $R^{303}$ is a single bond or a straight or branched alkylene group of 1 to 4 carbon atoms.

Illustrative examples of the compounds of formula (B1) include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxy-propoxy)ethyl}amine, tris[2-{2-(2-hydroxyethoxy)ethoxy}-ethyl]amine, 4,7,13,16,21,24-hexaoxa-1,10-diazabicyclo-[8.8.8]hexacosane, 4,7,13,18-tetraoxa-1,10-diazabicyclo-[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris (2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)- ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl] ethylamine, N,N-bis(2-acetoxyethyl)-2-[(2-oxotetrahydrofuran-3-yl)oxycarbonyl]-ethylamine, N,N-bis(2-hydroxyethyl)-2-(4-hydroxybutoxycarbonyl)ethylamine, N,N-bis(2-formyloxyethyl)-2-(4-formyloxy-butoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl] amine, N-(2-methoxyethyl)-bis[2-(methoxycarbonyl)ethyl] amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl) amine, N-ethyl-bis[2-(methoxycarbonyloxy)ethyl]amine, N-ethyl-bis[2-(tert-butoxycarbonyloxy)ethyl]amine, tris (methoxycarbonylmethyl)amine, tris (ethoxycarbonylmethyl)amine, N-butyl-bis (methoxycarbonylmethyl)amine, N-hexyl-bis (methoxycarbonylmethyl)amine, and β-(diethylamino)-δ-valerolactone.

The basic compound is preferably formulated in an amount of 0.001 to 10 parts, and especially 0.01 to 1 part, per part of the photoacid generator. Less than 0.001 part of the basic compound fails to achieve the desired effects thereof, while the use of more than 10 parts would result in too low a sensitivity and resolution.

Other components

In the resist composition, a compound bearing a≡C—COOH group in a molecule may be blended. Exemplary, non-limiting compounds bearing a≡C—COOH group include one or more compounds selected from Groups I and II below. Including this compound improves the PED stability of the resist and ameliorates edge roughness on nitride film substrates.

Group I: 5 Compounds in which some or all of the hydrogen atoms on the phenolic hydroxyl groups of the compounds of general formulas (A1) to (A10) below have been replaced with —$R^{401}$—COOH (wherein $R^{401}$ is a straight or branched alkylene of 1 to 10 carbon atoms), and in which the molar ratio C/(C+D) of phenolic hydroxyl groups (C) to ≡C—COOH groups (D) in the molecule is from 0.1 to 1.0.

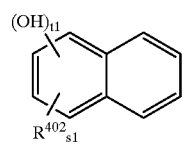

A1

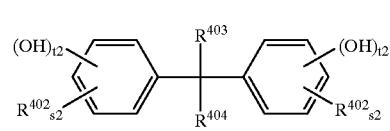

A2

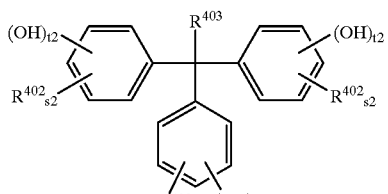
A3

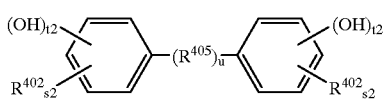
A4

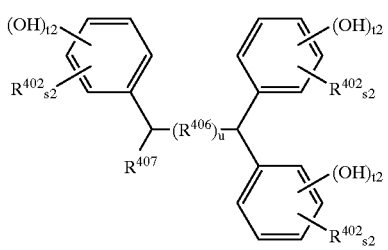
A5

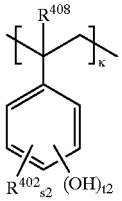
A6

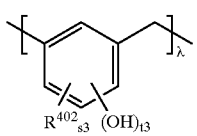
A7

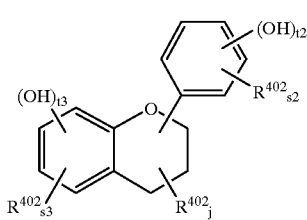
A8

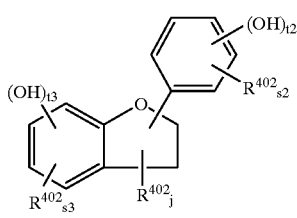
A9

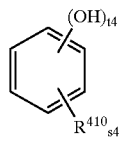
A10

In these formulas, $R^{408}$ is hydrogen or methyl; $R^{402}$ and $R^{403}$ are each hydrogen or a straight or branched alkyl or alkenyl of 1 to 8 carbon atoms; $R^{404}$ is hydrogen, a straight or branched alkyl or alkenyl of 1 to 8 carbon atoms, or a —$(R^{409})_h$—COOR' group (R' being hydrogen or —$R^{409}$—COOH); $R^{405}$ is —$(CH_2)_i$— (wherein i is 2 to 10), an arylene of 6 to 10 carbon atoms, carbonyl, sulfonyl, an oxygen atom, or a sulfur atom; $R^{406}$ is an alkylene of 1 to 10 carbon atoms, an arylene of 6 to 10 carbon atoms, carbonyl, sulfonyl, an oxygen atom, or a sulfur atom; $R^{407}$ is hydrogen, a straight or branched alkyl or alkenyl of 1 to 8 carbon atoms, or a hydroxyl-substituted phenyl or naphthyl; $R^{409}$ is a straight or branched alkylene of 1 to 10 carbon atoms; $R^{410}$ is hydrogen, a straight or branched alkyl or alkenyl of 1 to 8 carbon atoms, or a —$R^{411}$—COOH group; $R^{411}$ is a straight or branched alkylene of 1 to 10 carbon atoms; the letter j is an integer from 0 to 5; u and h are each 0 or 1; s1, t1, s2, t2, s3, t3, s4, and t4 are each numbers which satisfy s1+t1=8, s2+t2=5, s3+t3=4, and s4+t4=6, and are such that each phenyl skeleton has at least one hydroxyl group; κ is a number such that the compound of formula (A6) may have a weight average molecular weight of 1,000 to 5,000; and λ is a number such that the compound of formula (A7) may have a weight average molecular weight of 1,000 to 10,000.

Group II:

Compounds of general formulas (A11) to (A15) below.

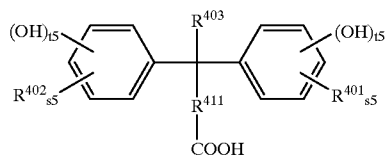
A11

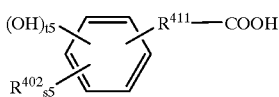
A12

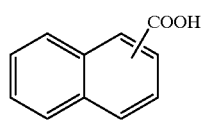
A13

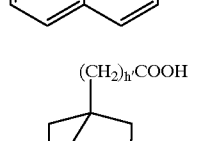
A14

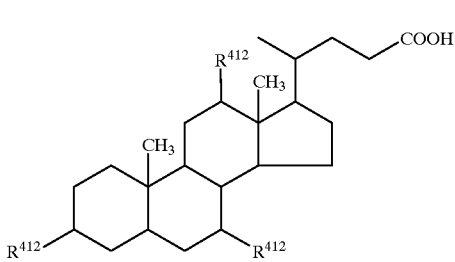
A15

In these formulas, $R^{402}$, $R^{403}$, and $R^{411}$ are as defined above; $R^{412}$ is hydrogen or hydroxyl; s5 and t5 are numbers which satisfy s5≧0, t5≧0, and s5+t5=5; and h' is equal to 0 or 1.

Illustrative, non-limiting examples of the compound bearing a ≡C—COOH group include compounds of the general formulas AI-1 to AI-14 and AII-1 to AII-10 below.

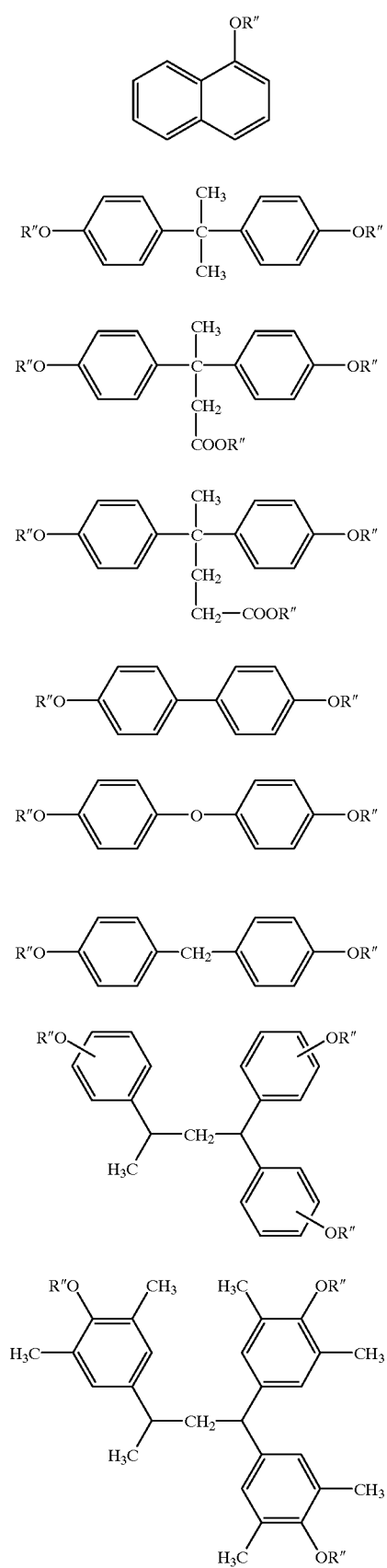
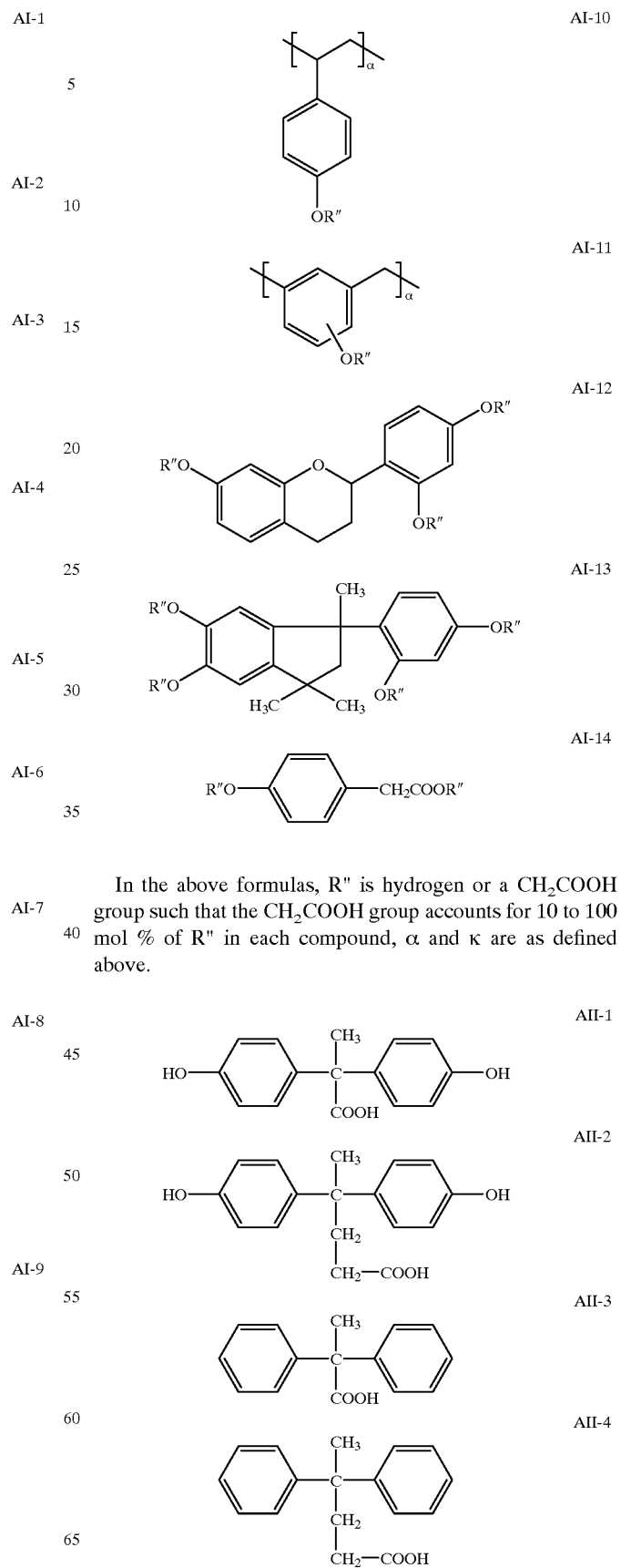
In the above formulas, R″ is hydrogen or a $CH_2COOH$ group such that the $CH_2COOH$ group accounts for 10 to 100 mol % of R″ in each compound, α and κ are as defined above.

-continued

AII-5
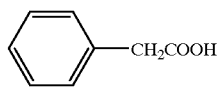

AII-6
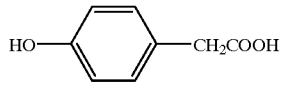

AII-7

COOH (naphthalene-COOH structure)

AII-8

COOH (adamantane-COOH structure)

AII-9

CH₂COOH (adamantane-CH₂COOH structure)

AII-10
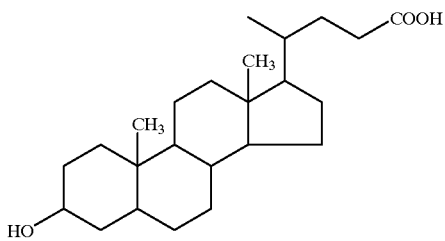

The compound bearing a ≡C—COOH group within the molecule may be used singly or as combinations of two or more thereof.

The compound bearing a ≡C—COOH group within the molecule is added in an amount ranging from 0 to 5 parts, preferably 0.1 to 5 parts, more preferably 0.1 to 3 parts, further preferably 0.1 to 2 parts, per 100 parts of the base resin. More than 5 parts of the compound can reduce the resolution of the resist composition.

The resist composition of the invention may additionally include an acetylene alcohol derivative for the purpose of enhancing the shelf stability. Preferred acetylene alcohol derivatives are those having the general formula (S1) or (S2) below.

S1

$$R^{501}-C\equiv C-\underset{\underset{O-(CH_2CH_2O)_YH}{|}}{\overset{R^{502}}{\underset{|}{C}}}-R^{503}$$

S2

$$R^{505}-\underset{\underset{H(OCH_2CH_2)_X-O}{|}}{\overset{R^{504}}{\underset{|}{C}}}-C\equiv C-\underset{\underset{O-(CH_2CH_2O)_YH}{|}}{\overset{R^{502}}{\underset{|}{C}}}-R^{503}$$

In the formulas, $R^{501}$, $R^{502}$, $R^{503}$, $R^{504}$, and $R^{505}$ are each hydrogen or a straight, branched, or cyclic alkyl of 1 to 8 carbon atoms; and X and Y are each 0 or a positive number, satisfying $0 \leq X \leq 30$, $0 \leq Y \leq 30$, and $0 = X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industry K.K.

The acetylene alcohol derivative is preferably added in an amount of 0.01 to 2% by weight, and more preferably 0.02 to 1% by weight, per 100% by weight of the resist composition. Less than 0.01% by weight would be ineffective for improving coating characteristics and shelf stability, whereas more than 2% by weight would result in a resist having a low resolution.

The resist composition of the invention may include, as an optional ingredient, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Florade FC-430 and FC-431 from Sumitomo 3M K.K., Surflon S-141 and S-145 from Asahi Glass K.K., Unidine DS-401, DS-403 and DS-451 from Daikin Industry K.K., Megaface F-8151 from Dai-Nippon Ink & Chemicals K.K., and X-70-092 and X-70-093 from Shin-Etsu Chemical Co., Ltd. Preferred surfactants are Florade FC-430 from Sumitomo 3M K.K. and X-70-093 from Shin-Etsu Chemical Co., Ltd.

Pattern formation using the resist composition of the invention may be carried out by a known lithographic technique. For example, the resist composition is applied onto a substrate such as a silicon wafer by spin coating or the like to form a resist film having a thickness of 0.3 to 2.0 μm, which is then pre-baked on a hot plate at 60 to 150° C. for 1 to 10 minutes, and preferably at 80 to 130° C. for 1 to 5 minutes. A patterning mask having the desired pattern is then placed over the resist film, and the film exposed through the mask to an electron beam or to high-energy radiation such as deep-UV rays, an excimer laser, or x-rays in a dose of about 1 to 200 mJ/cm², and preferably about 10 to 100 mJ/cm², then post-exposure baked (PEB) on a hot plate at 60 to 150° C. for 1 to 5 minutes, and preferably at 80 to 130° C. for 1 to 3 minutes. Finally, development is carried out using as the developer an aqueous alkali solution, such as a 0.1 to 5% (preferably 2 to 3%) aqueous solution of tetramethylammonium hydroxide (TMAH), this being done by a conventional method such as dipping, puddling, or spraying for a period of 0.1 to 3 minutes, and preferably 0.5 to 2 minutes. These steps result in the formation of the desired pattern on the substrate. Of the various types of high-energy radiation that may be used, the resist composition of the invention is best suited to fine pattern formation with, in particular, deep-UV rays having a wavelength of 248 to 193 nm, an excimer laser, x-rays, or an electron beam. The desired pattern may not be obtainable outside the upper and lower limits of the above range.

The hydrogenated ring-opening metathesis polymer used herein has improved heat resistance, pyrolysis resistance and light transmission and is suited as a photoresist for semiconductor microfabrication using UV or deep-UV. The resist composition comprising the polymer as a base resin lends itself to micropatterning with electron beams or deep-UV rays since it is sensitive to high-energy radiation and has excellent sensitivity, resolution, and etching resistance. Especially because of the minimized absorption at the exposure wavelength of an ArF or KrF excimer laser, a finely defined pattern having sidewalls perpendicular to the substrate can easily be formed.

EXAMPLE

Synthesis Examples and Examples are given below by way of illustration and not by way of limitation.

Abbreviations are GPC for gel permeation chromatography, NMR for nuclear magnetic resonance, THF for tetrahydrofuran, Me for methyl, iPr for isopropyl, and $Bu^t$ for tert-butyl.

Synthesis Examples

The hydrogenated products of ring-opening metathesis polymers used in Examples were synthesized according to the following procedure.

The physical properties of the polymers were assessed by the following tests.

Average molecule weight:

GPC analysis was conducted on a solution in tetrahydrofuran of the polymer resulting from ring-opening metathesis of cyclic olefins or the hydrogenated product of the polymer, using detectors 830-RI and 875-UV (Nippon Bunko Co., Ltd.) and columns Shodexk-805, 804, 803, 802.5 while flowing the solution at a rate of 1.0 ml/min at room temperature. The molecular weight was calibrated using a polystyrene standard.

Hydrogenation:

The hydrogenated product of ring-opening metathesis polymer in powder form was dissolved in deuterated chloroform. Using 270 MHz $^1$H-NMR, a peak of $\delta=4.0$ to 6.5 ppm attributable to the carbon-to-carbon double bond on the backbone was observed. A percent hydrogenation was computed from a reduction of this peak before and after hydrogenation reaction.

Content of carboxylic acid in polymer:

It was determined by neutralization titration using Bromothymol Blue as the indicator.

Synthesis Example 1

Synthesis of Polymer 1

In a 300-ml Schlenk flask under nitrogen, 2.43 g (16 mmol) of 4,10-dioxatricyclo[5.2.1.0$^{2,6}$]dec-8-ene-3-one and 7.21 g (24 mmol) of 8-(1'-ethylcyclopentoxycarbonyl)tetracyclo[4.4.0.1$^{2,5}$.1$^{7,10}$]-3-dodecene as cyclic olefin monomers were dissolved in THF. To the solution was added 462 mg (0.57 mmol) of W(N-2,6-Me$_2$C$_6$H$_3$)(CHCHCMe$_2$)—(OC(CF$_3$)$_2$Me)$_2$(PMe$_3$) as a ring-opening metathesis polymerization catalyst. Reaction was effected for one hour at room temperature. Thereafter, 205 mg (2.85 mmol) of butylaldehyde was added to the reaction mixture, which was stirred for 30 minutes to stop the reaction.

The ring-opening metathesis polymer solution was added to methanol whereupon the polymer precipitated. By filtration, methanol washing and vacuum drying, 9.46 g of the ring-opening metathesis polymer powder was obtained.

Thereafter, in a 200-ml autoclave, 9.0 g of the ring-opening metathesis polymer powder was dissolved in 100 ml of THF. A previously prepared solution of 27 mg (0.022 mmol) of dichlorotetrakis(triphenylphosphine)ruthenium and 11.3 mg (0.108 mmol) of triethylamine in 20 ml of THF as a hydrogenation catalyst was added thereto. Hydrogenation reaction was effected at a hydrogen pressure of 8.1 MPa and 165° C. for 5 hours. The temperature was brought back to room temperature and the hydrogen gas was released. The hydrogenated ring-opening metathesis polymer solution was added to methanol whereupon the hydrogenated ring-opening metathesis polymer precipitated. By filtration and vacuum drying, 8.0 g of the hydrogenated ring-opening metathesis polymer was obtained in a white powder form. The resulting hydrogenated ring-opening metathesis polymer was analyzed by $^1$H-NMR, with no peak attributable to the proton on the backbone olefin being observed, and found to have a percent hydrogenation of 100%. The number average molecular weight Mn was 37,600 as measured by GPC using a polystyrene standard, and Mw/Mn was 1.10. The compositional ratio of structural units [A]/[B] in the polymer was 60/40.

Synthesis Example 2

Synthesis of Polymer 2

Ring-opening metathesis polymerization was effected as in Synthesis Example 1 except that the cyclic olefin monomers were changed to 1.31 g (8 mmol) of bicyclo[2.2.1]hept-2-ene-5-spiro-3'-oxoran-2-one, 1.83 g (12 mmol) of 4,10-dioxatricyclo[5.2.1.0$^{2,6}$]dec-8-ene-3-one and 6.01 g (20 mmol) of 8-(1'-ethylcyclopentoxycarbonyl)tetracyclo[4.4.0.1$^{2,5}$.1$^{7,10}$]-3-dodecene, yielding 9.10 g of a ring-opening metathesis polymer.

As in Synthesis Example 1, hydrogenation reaction was effected on 9.0 g of the ring-opening metathesis polymer powder at a hydrogen pressure of 8.1 MPa and 165° C. for 5 hours, yielding 8.4 g of a hydrogenated ring-opening metathesis polymer in a white powder form. The resulting hydrogenated ring-opening metathesis polymer was analyzed by $^1$H-NMR, with no peak attributable to the proton on the backbone olefin being observed, and found to have a percent hydrogenation of 100%. The number average molecular weight Mn was 35,600 as measured by GPC using a polystyrene standard, and Mw/Mn was 1.20. The compositional ratio of structural units [A]/[B]/[C] in the polymer was 50/30/20.

Synthesis Example 3

Synthesis of Polymer 3

Ring-opening metathesis polymerization was effected as in Synthesis Example 1 except that the ring-opening metathesis polymerization catalyst was changed to 198 mg (0.286 mmol) of Mo(N-2,6-iPr$_2$C$_6$H$_3$)(CHCMe$_3$)(OC(CF$_3$)$_2$Me)$_2$. yielding 9.25 g of a ring-opening metathesis polymer.

Thereafter, in a 200-ml autoclave, 9.0 g of the ring-opening metathesis polymer powder was dissolved in 100 ml of THF. A previously prepared solution of 27 mg (0.022 mmol) of chlorohydridocarbonyltris(triphenylphosphine) ruthenium and 11.3 mg (0.108 mmol) of triethylamine in 20 ml of THF as a hydrogenation catalyst was added thereto. Hydrogenation reaction was effected at a hydrogen pressure of 8.1 MPa and 165° C. for 5 hours. The temperature was brought back to room temperature and the hydrogen gas was released. The hydrogenated ring-opening metathesis polymer solution was added to methanol whereupon the hydrogenated ring-opening metathesis polymer precipitated. By filtration and vacuum drying, 8.1 g of the hydrogenated ring-opening metathesis polymer was obtained in a white powder form. The resulting hydrogenated ring-opening metathesis polymer was analyzed by $^1$H-NMR, with no peak attributable to the proton on the backbone olefin being observed, and found to have a percent hydrogenation of 100%. The number average molecular weight Mn was 75,200 as measured by GPC using a polystyrene standard, and Mw/Mn was 1.15. The compositional ratio of structural units [A]/[B] in the polymer was 60/40.

Synthesis Example 4

Synthesis of Polymer 4

Ring-opening metathesis polymerization was effected as in Synthesis Example 2 except that the ring-opening metathesis polymerization catalyst was changed to 470 mg (0.57 mmol) of $Ru(P(C_6H_{11})_3)_2(CHPh)Cl_2$, yielding 9.0 g of a ring-opening metathesis polymer.

As in Synthesis Example 2, hydrogenation reaction was effected on 9.0 g of the ring-opening metathesis polymer powder at a hydrogen pressure of 8.1 MPa and 165° C. for 5 hours, yielding 8.6 g of a hydrogenated ring-opening metathesis polymer in a white powder form. The resulting hydrogenated ring-opening metathesis polymer was analyzed by $^1$H-NMR, with no peak attributable to the proton on the backbone olefin being observed, and found to have a percent hydrogenation of 100%. The number average molecular weight Mn was 33,100 as measured by GPC using a polystyrene standard, and Mw/Mn was 1.37. The compositional ratio of structural units [A]/[B]/[C] in the polymer was 50/30/20.

Synthesis Example 5

Synthesis of Polymer 5

In a 1000-ml autoclave equipped with a magnetic stirrer under nitrogen, 17.0 g (111.7 mmol) of 4,10-dioxatricyclo[5.2.1.0$^{2,6}$]dec-8-ene-3-one and 33.57 g (111.7 mmol) of 8-(1'-ethylcyclopentoxycarbonyl)tetracyclo[4.4.0.1$^{2,5}$.1$^{7,10}$]-3-dodecene as cyclic olefin monomers were dissolved in 550 ml of THF. To the solution were added 1.5 ml (12.3 mmol) of 1,5-hexadiene as a chain transfer agent and 786 mg (1.12 mmol) of $Mo(N-2,6-iPr_2C_6H_3)(CHCMe_3)(OC(CF_3)_2Me)_2$ as a ring-opening metathesis polymerization catalyst. With stirring, reaction was effected for 2 hours at room temperature. Thereafter, 404 mg (5.60 mmol) of butylaldehyde was added to the reaction mixture, which was stirred for 30 minutes to stop the reaction.

The ring-opening metathesis polymer solution was added to methanol whereupon the polymer precipitated. By filtration, methanol washing and vacuum drying, 42.5 g of the ring-opening metathesis polymer powder was obtained.

Thereafter, in a 1000-ml autoclave, 40.0 g of the ring-opening metathesis polymer powder was dissolved in 400 ml of THF. A previously prepared solution of 20 mg (0.02 mmol) of chlorohydridocarbonyltris(triphenylphosphine)ruthenium in 40 ml of THF as a hydrogenation catalyst was added thereto. Hydrogenation reaction was effected at a hydrogen pressure of 6.0 MPa and 100° C. for 20 hours. The temperature was brought back to room temperature and the hydrogen gas was released. The hydrogenated ring-opening metathesis polymer solution was added to methanol whereupon the hydrogenated ring-opening metathesis polymer precipitated. By filtration and vacuum drying, 38.5 g of the hydrogenated ring-opening metathesis polymer was obtained in a white powder form. The resulting hydrogenated ring-opening metathesis polymer was analyzed by $^1$H-NMR, with no peak attributable to the proton on the backbone olefin being observed, and found to have a percent hydrogenation of 100%. The number average molecular weight Mn was 8,260 as measured by GPC using a polystyrene standard, and Mw/Mn was 1.32. The compositional ratio of structural units [A]/[B] in the polymer was 50/50.

Synthesis Example 6

Synthesis of Polymer 6

In a 1000-ml autoclave equipped with a magnetic stirrer under nitrogen, 11.41 g (75.0 mmol) of 5,5-dimethyl-4,10-dioxatricyclo[5.2.1.0$^{2,6}$]dec-8-ene-3-one and 36.73 g (112.5 mmol) of 8-(2'-ethyl-2'-norbornyloxycarbonyl)tetracyclo[4.4.0.1$^{2,5}$.1$^{7,10}$]-3-dodecene as cyclic olefin monomers were dissolved in 500 ml of THF. To the solution were added 3.17 ml (23.41 mmol) of 1,6-heptadiene as a chain transfer agent and 740 mg (0.935 mmol) of $W(N-2,6-iPr_2C_6H_3)(CHCMe_3)(OC(CF_3)_2Me)_2$ as a ring-opening metathesis polymerization catalyst. With stirring, reaction was effected for 3 hours at room temperature. Thereafter, 360 mg (5.00 mmol) of butylaldehyde was added to the reaction mixture, which was stirred for 30 minutes to stop the reaction.

The ring-opening metathesis polymer solution was added to methanol whereupon the polymer precipitated. By filtration, methanol washing and vacuum drying, 48.9 g of the ring-opening metathesis polymer powder was obtained.

Thereafter, to a 500-ml autoclave, 40.0 g of the ring-opening metathesis polymer powder, 5.0 g (2.35 mmol as palladium) of 5% palladium-carrying carbon as a hydrogenation catalyst, and 300 ml of THF as a solvent were added. Hydrogenation reaction was effected at a hydrogen pressure of 8.0 MPa and 120° C. for 24 hours. The temperature was brought back to room temperature and the hydrogen gas was released. After the palladium-carrying carbon catalyst was removed by filtration, the hydrogenated ring-opening metathesis polymer solution was added to methanol whereupon the hydrogenated ring-opening metathesis polymer precipitated. By filtration and vacuum drying, 39.1 g of the hydrogenated ring-opening metathesis polymer was obtained in a white powder form. On $^1$H-NMR analysis, the resulting hydrogenated ring-opening metathesis polymer was found to have a percent hydrogenation of 99%. The number average molecular weight Mn was 4,690 as measured by GPC using a polystyrene standard, and Mw/Mn was 1.38. The compositional ratio of structural units [A]/[B] in the polymer was 60/40.

Synthesis Example 7

Synthesis of Polymer 7

In a 1000-ml autoclave equipped with a magnetic stirrer under nitrogen, 19.94 g (120.0 mmol) of 5-methyl-4,10-dioxatricyclo[5.2.1.0$^{26}$]dec-8-ene-3-one and 28.20 g (80.0 mmol) of 8-(2'-methyl-2'-adamantyloxycarbonyl)tetracyclo[4.4.0.1$^{2,5}$.1$^{7,10}$]-3-dodecene as cyclic olefin monomers were dissolved in 600 ml of toluene. To the solution were added 10.3 ml (65.0 mmol) of 1-octene as a chain transfer agent and 687.6 mg (1.00 mmol) of $Re(CBu^t)(CHBu^t)(OC(CF_3)_2Me)_2$ as a ring-opening metathesis polymerization catalyst. With stirring, reaction was effected for 6 hours at 50° C. Thereafter, 360 mg (5.00 mmol) of butylaldehyde was added to the reaction mixture, which was stirred for 30 minutes to stop the reaction.

The ring-opening metathesis polymer solution was added to methanol whereupon the polymer precipitated. By filtration, methanol washing and vacuum drying, 46.3 g of the ring-opening metathesis polymer powder was obtained.

Thereafter, to a 1000-ml autoclave, 40.0 g of the ring-opening metathesis polymer powder, 12.0 mg (0.013 mmol) of dihydridotetrakis(triphenylphosphine)ruthenium and 4.05 mg (0.04 mmol) of triethylamine as a hydrogenation catalyst, and 600 ml of toluene as a solvent were added. Hydrogenation reaction was effected at a hydrogen pressure of 8.0 MPa and 100° C. for 24 hours. The temperature was brought back to room temperature and the hydrogen gas was released. The hydrogenated ring-opening metathesis polymer solution was added to methanol whereupon the hydrogenated ring-opening metathesis polymer precipitated. By filtration and vacuum drying, 38.8 g of the hydrogenated ring-opening metathesis polymer was obtained in a white powder form. On $^1$H-NMR analysis, the resulting hydrogenated ring-opening metathesis polymer was found to have a percent hydrogenation of 100%. The number average molecular weight Mn was 2,880 as measured by GPC using a polystyrene standard, and Mw/Mn was 1.42. The compositional ratio of structural units [A]/[B] in the polymer was 40/60.

Synthesis Example 8

Synthesis of Polymer 8

In a 2000-ml eggplant-shaped flask, 20.0 g of the hydrogenated ring-opening metathesis polymer obtained in Synthesis Example 5 was added to 1,000 ml of a toluene solution containing 5.0 ml trifluoroacetic acid. The solution was stirred for 3 hours at 70° C., the solvent was distilled off, the residue was dissolved in THF, which was added to methanol for precipitation. By filtration and vacuum drying, 17.8 g of a partially ester-decomposed product of hydrogenated ring-opening metathesis polymer was obtained in a white powder form. The polymer had a compositional ratio of structural units [A]/[B]/[D] of 30/50/20, a number average molecular weight Mn of 8,150 as measured by GPC, and a Mw/Mn of 1.33.

Synthesis Example 9

Synthesis of Polymer 9

In a 2000-ml eggplant-shaped flask, 15.0 g of the hydrogenated ring-opening metathesis polymer obtained in Synthesis Example 6 was added to 1,000 ml of a benzene solution containing 5.0 ml trifluoroacetic acid. The solution was stirred for 2 hours at 70° C., the solvent was distilled off, the residue was dissolved in THF, which was added to methanol for precipitation. By filtration and vacuum drying, 13.1 g of a partially ester-decomposed product of hydrogenated ring-opening metathesis polymer was obtained in a white powder form. The polymer had a compositional ratio of structural units [A]/[B]/[D] of 40/40/20, a number average molecular weight Mn of 4,490 as measured by GPC, and a Mw/Mn of 1.35.

Synthesis Example 10

Synthesis of Polymer 10

In a 2000-ml eggplant-shaped flask, 15.0 g of the hydrogenated ring-opening metathesis polymer obtained in Synthesis Example 7 was added to 1,000 ml of a THF solution containing 10.0 ml conc. hydrochloric acid. The solution was stirred for 6 hours at 60° C. and then added to methanol for precipitation. By filtration and vacuum drying, 13.0 g of a partially ester-decomposed product of hydrogenated ring-opening metathesis polymer was obtained in a white powder form. The polymer had a compositional ratio of structural units [A]/[B]/[D] of 25/60/15, a number average molecular weight Mn of 2,810 as measured by GPC, and a Mw/Mn of 1.39.

Synthesis Example 11

Synthesis of Polymer 11

In a 500-ml autoclave equipped with a magnetic stirrer under nitrogen, 9.89 g (65.0 mmol) of 4,10-dioxatricyclo[5.2.1.0$^{2,6}$]dec-8-ene-3-one, 11.72 g (39.0 mmol) of 8-(1'-ethylcyclopentoxycarbonyl)tetracyclo[4.4.0.1$^{2,5}$.1$^{7,10}$]-3-dodecene, and 6.77 g (26.0 mmol) of 8-tert-butoxycarbonyltetracyclo[4.4.0.1$^{2,5}$.1$^{7,10}$]-3-dodecene as cyclic olefin monomers were dissolved in 300 ml of THF. To the solution were added 0.75 ml (6.5 mmol) of 1,5-hexadiene as a chain transfer agent and 536 mg (0.70 mmol) of Mo(N-2,6-iPr$_2$C$_6$H$_3$)(CHCMe$_2$Ph)(OC(CF$_3$)$_2$Me)$_2$ as a ring-opening metathesis polymerization catalyst. With stirring, reaction was effected for 2 hours at room temperature. Thereafter, 250 mg (3.47 mmol) of butylaldehyde was added to the reaction mixture, which was stirred for 30 minutes to stop the reaction.

The ring-opening metathesis polymer solution was added to methanol whereupon the polymer precipitated. By filtration, methanol washing and vacuum drying, 26.6 g of the ring-opening metathesis polymer powder was obtained.

Thereafter, in a 500-ml autoclave, 20.0 g of the ring-opening metathesis polymer powder was dissolved in 300 ml of THF. A previously prepared solution of 30.0 mg (0.029 mmol) of dichlorotris(triphenylphosphine)osmium and 11.74 mg (0.116 mmol) of triethylamine in 20 ml of THF as a hydrogenation catalyst was added thereto. Hydrogenation reaction was effected at a hydrogen pressure of 6.0 MPa and 100° C. for 20 hours. The temperature was brought back to room temperature and the hydrogen gas was released. The hydrogenated ring-opening metathesis polymer solution was added to methanol whereupon the hydrogenated ring-opening metathesis polymer precipitated. By filtration and vacuum drying, 18.8 g of the hydrogenated ring-opening metathesis polymer was obtained in a white powder form. On $^1$H-NMR analysis, the resulting hydrogenated ring-opening metathesis polymer was found to have a percent hydrogenation of 100%. The number average molecular weight Mn was 9,110 as measured by GPC using a polystyrene standard, and Mw/Mn was 1.43. The compositional ratio of structural units [A]/[B]/[E] in the polymer was 30/50/20.

Synthesis Example 12

Synthesis of Polymer 12

In a 500-ml autoclave equipped with a magnetic stirrer under nitrogen, 9.13 g (60.0 mmol) of 4,10-dioxatricyclo[5.2.1.0$^{2,6}$]dec-8-ene-3-one, 14.42 g (48.0 mmol) of 8-(1'-ethylcyclopentoxycarbonyl)tetracyclo-[4.4.0.1$^{2,5}$.1$^{7,10}$]-3-dodecene, and 2.62 g (12.0 mmol) of 8-methoxycarbonyltetracyclo[4.4.0.1$^{2,5}$.1$^{7,10}$]-3-dodecene as cyclic olefin monomers were dissolved in 350 ml of toluene. To the solution were added 0.70 ml (6.0 mmol) of 1,5-hexadiene as a chain transfer agent and 440 mg (0.60 mmol) of W(N-2,6-Me$_2$C$_6$H$_3$)(CHCHCMe$_2$)(OC(CF$_3$)$_2$Me)$_2$ as a ring-opening metathesis polymerization catalyst. With stirring, reaction was effected for 5 hours at room temperature. Thereafter, 216 mg (3.0 mmol) of butylaldehyde was added to the reaction mixture, which was stirred for 30 minutes to stop the reaction.

The ring-opening metathesis polymer solution was added to methanol whereupon the polymer precipitated. By filtration, methanol washing and vacuum drying, 24.7 g of the ring-opening metathesis polymer powder was obtained.

Thereafter, in a 500-ml autoclave, 20.0 g of the ring-opening metathesis polymer powder was dissolved in 350 ml of toluene. A solution of 66.0 mg (0.094 mmol) of dichlorobis(triphenylphosphine)palladium in 30 ml of toluene as a hydrogenation catalyst was added thereto. Hydrogenation reaction was effected at a hydrogen pressure of 6.0 MPa and 100° C. for 20 hours. The temperature was brought back to room temperature and the hydrogen gas was released. The hydrogenated ring-opening metathesis polymer solution was added to methanol whereupon the hydrogenated ring-opening metathesis polymer precipitated. By filtration and vacuum drying, 17.9 g of the hydrogenated ring-opening metathesis polymer was obtained in a white powder form. On $^1$H-NMR analysis, the resulting hydrogenated ring-opening metathesis polymer was found to have a percent hydrogenation of 100%. The number average molecular weight Mn was 8,810 as measured by GPC using a polystyrene standard, and Mw/Mn was 1.24. The compositional ratio of structural units [A]/[B]/[E] in the polymer was 40/50/10.

Synthesis Example 13

Synthesis of Polymer 13

In a 1000-ml flask, 9.0 g of the hydrogenated ring-opening metathesis polymer obtained in Synthesis Example 12 was added to 400 ml of an aqueous methanol solution containing 5% potassium hydroxide. The solution was stirred for 3 hours at 80° C. and then added to 1,000 ml of an aqueous 2% hydrochloride acid solution for neutralization. This was followed by precipitation, filtration, water washing and vacuum drying, yielding 8.4 g of a partially hydrolyzed product of hydrogenated ring-opening metathesis polymer in a white powder form. The polymer had a compositional ratio of structural units [A]/[B]/[D] of 40/50/10, a number average molecular weight Mn of 8,730 as measured by GPC, and a Mw/Mn of 1.25.

Synthesis Example 14

Synthesis of Polymer 14

In a 500-ml autoclave equipped with a magnetic stirrer under nitrogen, 9.13 g (60.0 mmol) of 4,10-dioxatricyclo[5.2.1.0$^{2,6}$]dec-8-ene-3-one, 9.01 g (30.0 mmol) of 8-(1'-ethylcyclopentoxycarbonyl)tetracyclo-[4.4.0.1$^{2,5}$.1$^{7,10}$]-3-dodecene, and 8.65 g (30.0 mmol) of 8-(tetrahydropyran-2'-yl)oxycarbonyltetracyclo[4.4.0.1$^{2,5}$.1$^{7,10}$]-3-dodecene as cyclic olefin monomers were dissolved in 320 ml of THF. To the solution were added 0.70 ml (6.0 mmol) of 1,5-hexadiene as a chain transfer agent and 356 mg (0.60 mmol) of W(N-2,6-Me$_2$C$_6$H$_3$)(CHCHCMe$_2$)(OBu$^t$)$_2$(PMe$_3$) as a ring-opening metathesis polymerization catalyst. With stirring, reaction was effected for 5 hours at room temperature. Thereafter, 216 mg (3.0 mmol) of butylaldehyde was added to the reaction mixture, which was stirred for 30 minutes to stop the reaction.

The ring-opening metathesis polymer solution was added to methanol whereupon the polymer precipitated. By filtration, methanol washing and vacuum drying, 24.3 g of the ring-opening metathesis polymer powder was obtained.

Thereafter, in a 500-ml autoclave, 20.0 g of the ring-opening metathesis polymer powder was dissolved in 300 ml of THF. A solution of 91.0 mg (0.10 mmol) of chlorotris(triphenylphosphine)rhodium in 30 ml of THF as a hydrogenation catalyst was added thereto. Hydrogenation reaction was effected at a hydrogen pressure of 6.0 MPa and 100° C. for 20 hours. The temperature was brought back to room temperature and the hydrogen gas was released. The hydrogenated ring-opening metathesis polymer solution was added to methanol whereupon the hydrogenated ring-opening metathesis polymer precipitated. By filtration and vacuum drying, 17.1 g of the hydrogenated ring-opening metathesis polymer was obtained in a white powder form. On $^1$H-NMR analysis, the resulting hydrogenated ring-opening metathesis polymer was found to have a percent hydrogenation of 100%. The number average molecular weight Mn was 9,620 as measured by GPC using a polystyrene standard, and Mw/Mn was 1.19. The compositional ratio of structural units [A]/[B]/[E] in the polymer was 25/50/25.

Synthesis Example 15

Synthesis of Polymer 15

In a 1000-ml eggplant-shaped flask, 8.0 g of the hydrogenated ring-opening metathesis polymer obtained in Synthesis Example 14 was added to 500 ml of a toluene solution containing 3.0 ml trifluroacetic acid. The solution was stirred for one hour at 30° C. The solvent was distilled off, and the residue was dissolved in THF, which was added to methanol for precipitation. On filtration and vacuum drying, 6.8 g of a white powder was obtained. On NMR analysis, the product was found to be a hydrogenated ring-opening metathesis polymer in which only tetrahydropyranyl groups were ester-decomposed. The polymer had a compositional ratio of structural units [A]/[B]/[D] of 25/50/25, a number average molecular weight Mn of 9,060 as measured by GPC, and a Mw/Mn of 1.21.

Synthesis Example 16

Synthesis of Polymer 16

In a 500-ml three-necked eggplant-shaped flask equipped with a 100-ml dropping funnel, stirrer and three-way cock and under a nitrogen stream, 8.0 g of the partially ester-decomposed product of hydrogenated ring-opening metathesis polymer obtained in Synthesis Example 8 was added to 200 ml of a toluene solution containing 80 mg p-toluenesulfonic acid pyridine salt. With stirring at 25° C., 70 ml of a toluene solution containing 10 g 5,6-dihydropyran was added dropwise over about one hour. After the completion of dropwise addition, stirring was continued for 2 hours at 25° C. The solvent was distilled off, and the residue was dissolved in THF, which was added to methanol for precipitation. On filtration and vacuum drying, 6.6 g of a partially esterified product of hydrogenated ring-opening metathesis polymer was obtained in a white powder form. The polymer had a compositional ratio of structural units [A]/[B]/[D]/[E] of 30/50/5/15, a number average molecular weight Mn of 8,200 as measured by GPC, and a Mw/Mn of 1.33.

Synthesis Example 17

Synthesis of Polymer 17

In a 500-ml autoclave equipped with a magnetic stirrer under nitrogen, 4.51 g (30.0 mmol) of 4-oxatricyclo[5.2.1.0$^{2,6}$]dec-8-ene-3-one, 12.02 g (40.0 mmol) of 8-(1'-ethylcyclopentoxycarbonyl)tetracyclo[4.4.0.1$^{2,5}$.1$^{7,10}$]-3-dodecene, and 8.83 g (30.0 mmol) of 5-(1'-ethylcyclopentoxycarbonyl)-6-methoxycarbonyl-7- oxabicyclo[2.2.1]hept-2-ene as cyclic olefin monomers were dissolved in 350 ml of THF. To the solution were added 0.42 ml (3.5 mmol) of 1-hexene as a chain transfer agent and 288 mg (0.50 mmol) of W(N-2,6-iPr$_2$C$_6$H$_3$)(CHCMe$_3$)(OBu$^t$)$_2$ as a ring-opening metathesis polymerization catalyst. With stirring, reaction was effected for 5 hours at room temperature. Thereafter, 180 mg (2.5 mmol) of butylaldehyde was added to the reaction mixture, which was stirred for 30 minutes to stop the reaction.

The ring-opening metathesis polymer solution was added to methanol whereupon the polymer precipitated. By filtration, methanol washing and vacuum drying, 23.3 g of the ring-opening metathesis polymer powder was obtained.

Thereafter, in a 1000-ml autoclave, 20.0 g of the ring-opening metathesis polymer powder was dissolved in 500 ml of THF. A previously prepared solution containing 4.0 mg (0.0048 mmol) of dichlorobis(tetrahydrofuran)bis (triphenylphosphine)ruthenium and 4.86 mg (0.048 mmol) of triethylamine in 100 ml of THF as a hydrogenation catalyst was added thereto. Hydrogenation reaction was effected at a hydrogen pressure of 6.0 MPa and 100° C. for 20 hours. The temperature was brought back to room temperature and the hydrogen gas was released. The hydrogenated ring-opening metathesis polymer solution was added to methanol whereupon the hydrogenated ring-opening metathesis polymer precipitated. By filtration and vacuum drying, 18.1 g of the hydrogenated ring-opening metathesis polymer was obtained in a white powder form. On $^1$H-NMR analysis, the resulting hydrogenated ring-opening metathesis polymer was found to have a percent hydrogenation of 100%. The number average molecular weight Mn was 12,600 as measured by GPC using a polystyrene standard, and Mw/Mn was 1.39. The compositional ratio of structural units [A]/[A']/[B] in the polymer was 40/30/30.

Synthesis Example 18

Synthesis of Polymer 18

In a 500-ml autoclave equipped with a magnetic stirrer under nitrogen, 10.81 g (50.0 mmol) of 6-oxapentacyclo [9.2.1.1$^{3,9}$.0$^{2,10}$.0$^{4,8}$]pentadec-12-ene-5-one and 11.82 g (50.0 mmol) of 5-(1'-ethylcyclopentoxycarbonyl)-7-oxabicyclo[2.2.1]hept-2-ene as cyclic olefin monomers were dissolved in 250 ml of THF. To the solution were added 0.64 ml (6.5 mmol) of 1-heptene as a chain transfer agent and 328 mg (0.50 mmol) of W(N-2,6-Me$_2$C$_6$H$_3$)(CHCHCMePh) (OBu$^t$)$_2$(PMe$_3$) as a ring-opening metathesis polymerization catalyst. With stirring, reaction was effected for 5 hours at room temperature. Thereafter, 258 mg (3.0 mmol) of pentylaldehyde was added to the reaction mixture, which was stirred for 30 minutes to stop the reaction.

The ring-opening metathesis polymer solution was added to methanol whereupon the polymer precipitated. By filtration, methanol washing and vacuum drying, 20.8 g of the ring-opening metathesis polymer powder was obtained.

Thereafter, in a 500-ml autoclave, 15.0 g of the ring-opening metathesis polymer powder was dissolved in 300 ml of THF. A previously prepared solution containing 9.5 mg (0.01 mmol) of chlorohydridocarbonyltris (triphenylphosphine)ruthenium and 4.9 mg (0.02 mmol) of triphenylamine in 30 ml of THF as a hydrogenation catalyst was added thereto. Hydrogenation reaction was effected at a hydrogen pressure of 10.0 MPa and 80° C. for 42 hours. The temperature was brought back to room temperature and the hydrogen gas was released. The hydrogenated ring-opening metathesis polymer solution was added to methanol whereupon the hydrogenated ring-opening metathesis polymer precipitated. By filtration and vacuum drying, 12.3 g of the hydrogenated ring-opening metathesis polymer was obtained in a white powder form. On $^1$H-NMR analysis, the resulting hydrogenated ring-opening metathesis polymer was found to have a percent hydrogenation of 100%. The number average molecular weight Mn was 8,450 as measured by GPC using a polystyrene standard, and Mw/Mn was 1.29. The compositional ratio of structural units [A]/[B] in the polymer was 50/50.

Synthesis Example 19

Synthesis of Polymer 19

In a 500-ml autoclave equipped with a magnetic stirrer under nitrogen, 11.41 g (75.0 mmol) of 4,10-dioxatricyclo [5.2.1.0$^{2,6}$]dec-8-ene-3-one, 7.51 g (25.0 mmol) of 8-(1'-ethylcyclopentoxycarbonyl)tetracyclo-[4.4.0.1$^{2,5}$.1$^{7,10}$]-3-dodecene, and 8.16 g (25.0 mmol) of 8-(2'-ethyl-2'-norbornyloxycarbonyl)tetracyclo[4.4.0.1$^{2,5}$.1$^{7,10}$]-3-dodecene as cyclic olefin monomers were dissolved in 300 ml of THF. To the solution were added 1.04 ml (9.0 mmol) of 1,5-hexadiene as a chain transfer agent and 652 mg (1.00 mmol) of W(N-2,6-iPr$_2$C$_6$H$_3$)(CHCMe$_3$)(OBu$^t$)$_2$(PMe$_3$) as a ring-opening metathesis polymerization catalyst. With stirring, reaction was effected for 5 hours at room temperature. Thereafter, 432 mg (6.0 mmol) of butylaldehyde was added to the reaction mixture, which was stirred for 30 minutes to stop the reaction.

The ring-opening metathesis polymer solution was added to methanol whereupon the polymer precipitated. By filtration, methanol washing and vacuum drying, 25.1 g of the ring-opening metathesis polymer powder was obtained.

Thereafter, in a 1000-ml autoclave, 10.0 g of the ring-opening metathesis polymer powder was dissolved in 350 ml of THF. A previously prepared solution containing 44.8 mg (0.10 mmol) of dichlorotris(trimethylphosphite) ruthenium and 15.2 mg (0.15 mmol) of triethylamine in 200 ml of THF as a hydrogenation catalyst was added thereto. Hydrogenation reaction was effected at a hydrogen pressure of 10.0 MPa and 70° C. for 20 hours. The temperature was brought back to room temperature and the hydrogen gas was released. The hydrogenated ring-opening metathesis polymer solution was added to methanol whereupon the hydrogenated ring-opening metathesis polymer precipitated. By filtration and vacuum drying, 8.8 g of the hydrogenated ring-opening metathesis polymer was obtained in a white powder form. On $^1$H-NMR analysis, the resulting hydrogenated ring-opening metathesis polymer was found to have a percent hydrogenation of 100%. The number average molecular weight Mn was 8,330 as measured by GPC using a polystyrene standard, and Mw/Mn was 1.44. The compositional ratio of structural units [A]/[A']/[B] in the polymer was 20/20/60.

Synthesis Example 20

Synthesis of Polymer 20

In a 500-ml Schlenk flask under nitrogen, 2.43 g (16 mmol) of 4,10-dioxatricyclo[5.2.1.0$^{2,6}$ ]dec-8-ene-3-one and 7.55 g (24 mmol) of 8-(1'-ethylcyclopentoxycarbonyl)-8-methyltetracyclo[4.4.0.1$^{2,5}$.1$^{7,10}$]-3-dodecene as cyclic olefin monomers were dissolved in 200 ml of THF. To the solution was added 606 mg (0.70 mmol) of W(N-2,6-iPr$_2$C$_6$H$_3$)(CHCHCMe$_2$)(OC(CF$_3$)$_2$Me)$_2$(PMe$_3$) as a ring-opening metathesis polymerization catalyst. Reaction was effected for 30 minutes at room temperature. Thereafter, 202 mg (2.80 mmol) of butylaldehyde was added to the reaction mixture, which was stirred for one hour to stop the reaction.

The ring-opening metathesis polymer solution was added to methanol whereupon the polymer precipitated. By filtration, methanol washing and vacuum drying, 9.13 g of the ring-opening metathesis polymer powder was obtained.

Thereafter, in a 500-ml autoclave, 9.0 g of the ring-opening metathesis polymer powder was dissolved in 250 ml of THF. A previously prepared solution of 27 mg (0.022 mmol) of dichlorotetrakis(triphenylphosphine)ruthenium and 11.3 mg (0.108 mmol) of triethylamine in 50 ml of THF as a hydrogenation catalyst was added thereto. Hydrogenation reaction was effected at a hydrogen pressure of 9.0 MPa and 120° C. for 16 hours. The temperature was brought back to room temperature and the hydrogen gas was released. The hydrogenated ring-opening metathesis polymer solution was added to methanol whereupon the hydrogenated ring-opening metathesis polymer precipitated. By filtration and vacuum drying, 7.4 g of the hydrogenated ring-opening metathesis polymer was obtained in a white powder form. On $^1$H-NMR analysis, the resulting hydrogenated ring-opening metathesis polymer was found to have a percent hydrogenation of 100%. The polymer had a number average molecular weight Mn of 28,600 as measured by GPC using a polystyrene standard, a Mw/Mn of 1.07, and a compositional ratio of structural units [A]/[B] of 60/40.

Synthesis Example 21

Synthesis of Polymer 21

In a 500-ml Schlenk flask under nitrogen, 4.56 g (30.0 mmol) of 4,10-dioxatricyclo[5.2.1.$^{2,6}$]dec-8-ene-3-one and 6.29 g (20.0 mmol) of 8-(1'-ethylcyclopentoxycarbonylmethyl)tetracyclo[4.4.0.1$^{2,5}$.1$^{7,10}$]-3-dodecene as cyclic olefin monomers were dissolved in 200 ml of THF. To the solution was added 606 mg (0.70 mmol) of W(N-2,6-iPr$_2$C$_6$H$_3$) (CHCHCMe$_2$)(OC(CF$_3$)$_2$Me)$_2$(PMe$_3$) as a ring-opening metathesis polymerization catalyst. Reaction was effected for 30 minutes at room temperature. Thereafter, 202 mg (2.80 mmol) of butylaldehyde was added to the reaction mixture, which was stirred for one hour to stop the reaction.

The ring-opening metathesis polymer solution was added to methanol whereupon the polymer precipitated. By filtration, methanol washing and vacuum drying, 9.98 g of the ring-opening metathesis polymer powder was obtained.

Thereafter, in a 500-ml autoclave, 9.0 g of the ring-opening metathesis polymer powder was dissolved in 250 ml of THF. A previously prepared solution of 61 mg (0.05 mmol) of dichlorotetrakis(triphenylphosphine)ruthenium and 10.1 mg (0.10 mmol) of triethylamine in 50 ml of THF as a hydrogenation catalyst was added thereto. Hydrogenation reaction was effected at a hydrogen pressure of 9.0 MPa and 90° C. for 16 hours. The temperature was brought back to room temperature and the hydrogen gas was released. The hydrogenated ring-opening metathesis polymer solution was added to methanol whereupon the hydrogenated ring-opening metathesis polymer precipitated. By filtration and vacuum drying, 8.0 g of the hydrogenated ring-opening metathesis polymer was obtained in a white powder form. On $^1$H-NMR analysis, the resulting hydrogenated ring-opening metathesis polymer was found to have a percent hydrogenation of 100%. The polymer had a number average molecular weight Mn of 34,100 as measured by GPC using a polystyrene standard, a Mw/Mn of 1.09, and a compositional ratio of structural units [A]/[B] of 40/60.

Synthesis Example 22

Synthesis of Polymer 22

In a 500-ml Schlenk flask under nitrogen, 1.08 g (6.0 mmol) of 5,5-dimethyl-4,10-dioxatricyclo[5.2.1.0$^{2,6}$]dec-8-ene-3-one and 6.17 g (14.0 mmol) of 8,9-di(1'-ethylcyclopentoxycarbonyl)tetracyclo[4.4.0.1$^{2,5}$.1$^{7,10}$]-3-dodecene as cyclic olefin monomers were dissolved in 200 ml of THF. To the solution was added 206 mg (0.35 mmol) of Mo(N-2,6-iPr$_2$C$_6$H$_3$)(CHCHCMe$_2$)(OC(CF$_3$)$_2$Me)$_2$ as a ring-opening metathesis polymerization catalyst. Reaction was effected for 30 minutes at room temperature. Thereafter, 108 mg (1.50 mmol) of butylaldehyde was added to the reaction mixture, which was stirred for one hour to stop the reaction.

The ring-opening metathesis polymer solution was added to methanol whereupon the polymer precipitated. By filtration, methanol washing and vacuum drying, 6.66 g of the ring-opening metathesis polymer powder was obtained.

Thereafter, in a 500-ml autoclave, 6.0 g of the ring-opening metathesis polymer powder was dissolved in 250 ml of THF. A previously prepared solution of 36.6 mg (0.03 mmol) of dichlorotetrakis(triphenylphosphine)ruthenium and 10.1 mg (0.10 mmol) of triethylamine in 50 ml of THF as a hydrogenation catalyst was added thereto. Hydrogenation reaction was effected at a hydrogen pressure of 9.0 MPa and 100° C. for 16 hours. The temperature was brought back to room temperature and the hydrogen gas was released. The hydrogenated ring-opening metathesis polymer solution was added to methanol whereupon the hydrogenated ring-opening metathesis polymer precipitated. By filtration and vacuum drying, 5.4 g of the hydrogenated ring-opening metathesis polymer was obtained in a white powder form. On $^1$H-NMR analysis, the resulting hydrogenated ring-opening metathesis polymer was found to have a percent hydrogenation of 100%. The polymer had a number average molecular weight Mn of 26,900 as measured by GPC using a polystyrene standard, a Mw/Mn of 1.06, and a compositional ratio of structural units [A]/[B] of 30/70.

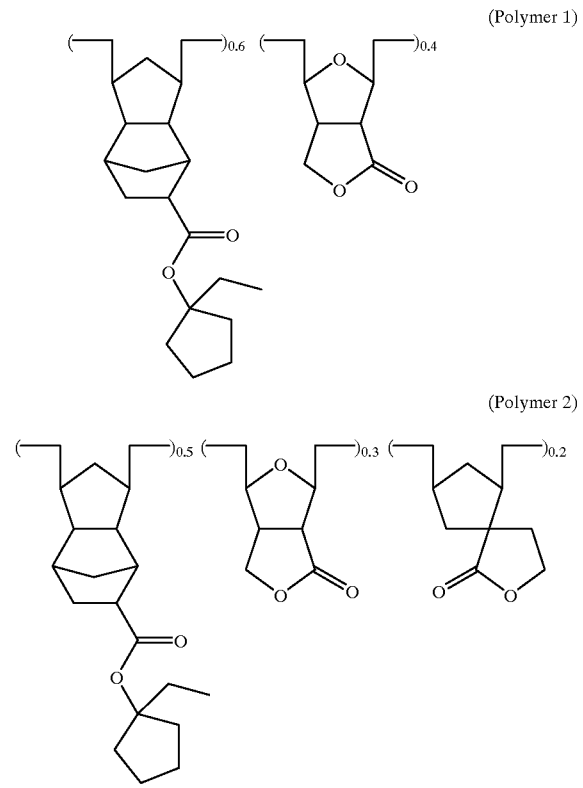

-continued
(Polymer 3)
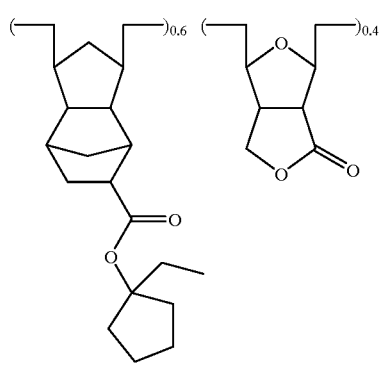
(Polymer 7)
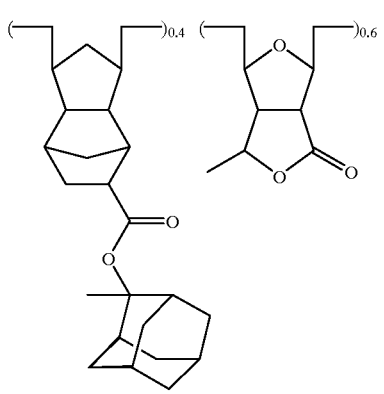
(Polymer 4)
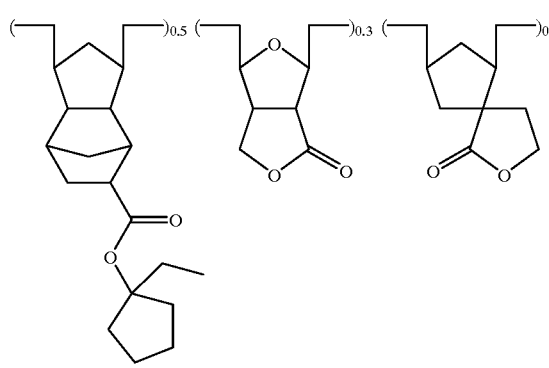
(Polymer 8)
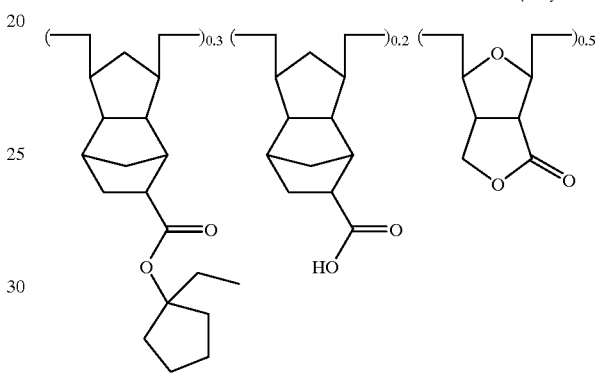
(Polymer 5)
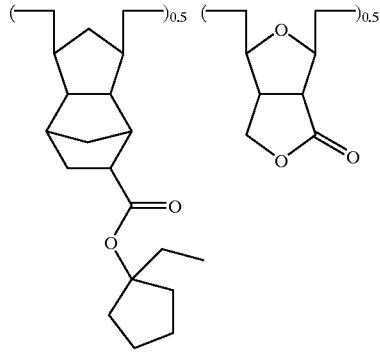
(Polymer 9)
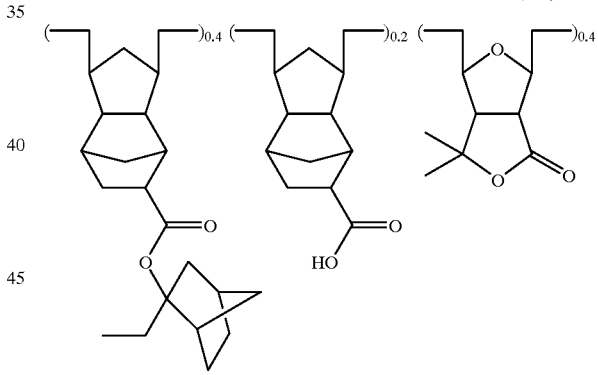
(Polymer 6)
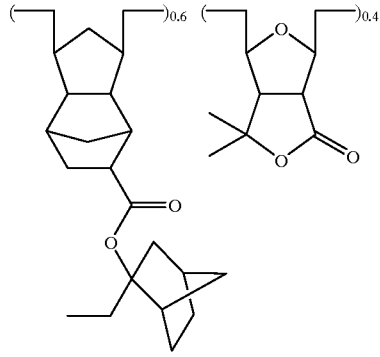
(Polymer 10)
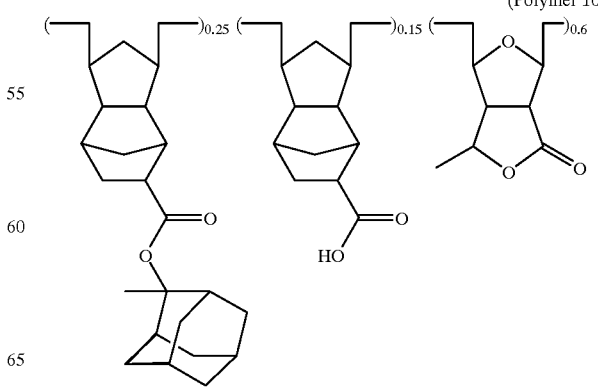

-continued
(Polymer 11)
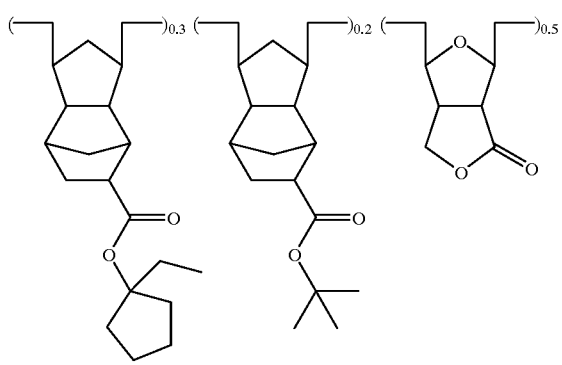
(Polymer 12)
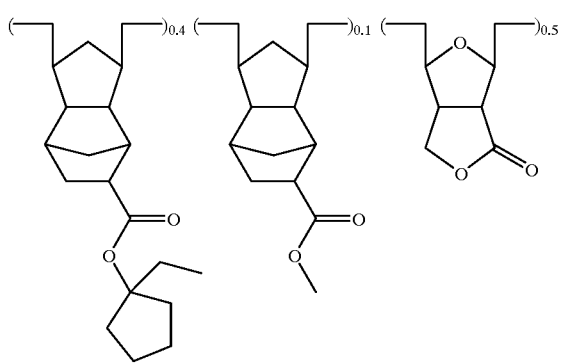
(Polymer 13)
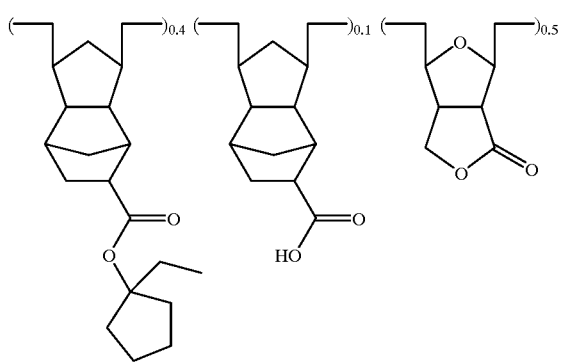
(Polymer 14)
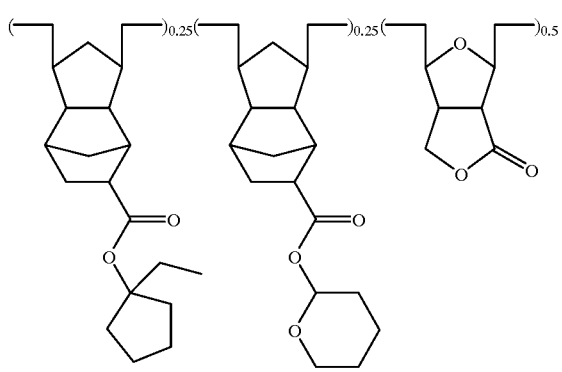
-continued
(Polymer 15)
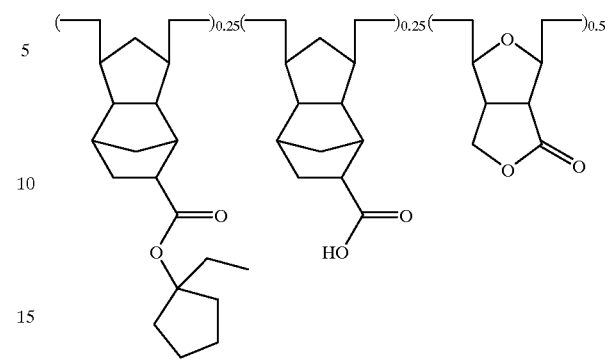
(Polymer 16)
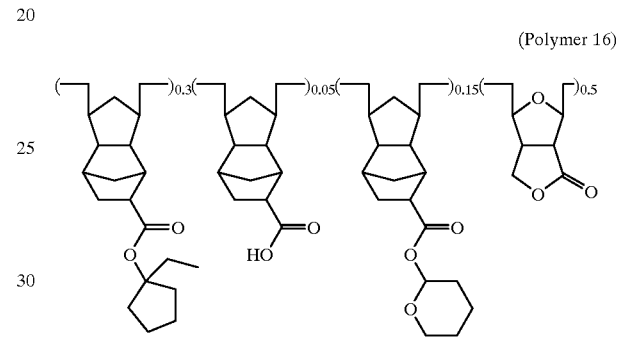
(Polymer 17)
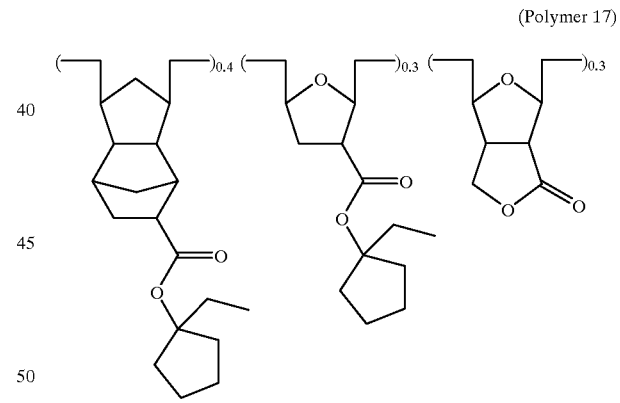
(Polymer 18)
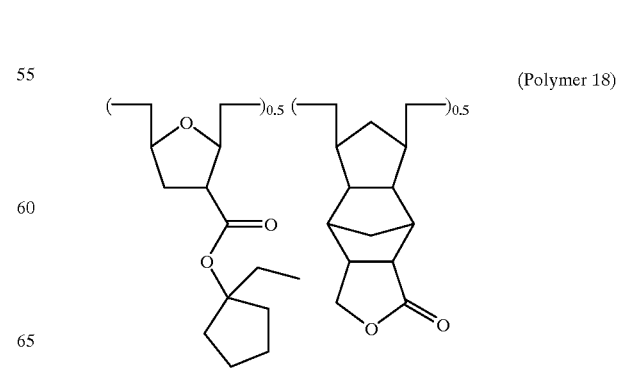

-continued (Polymer 19)
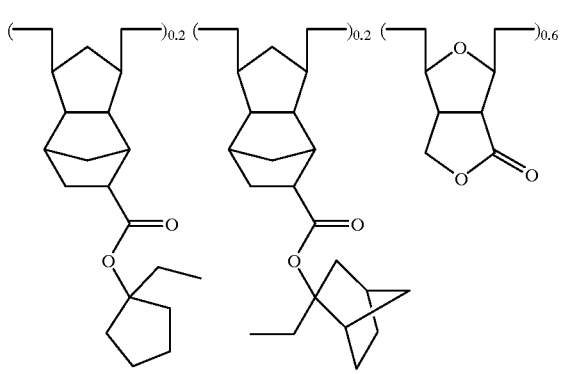

(Polymer 20)
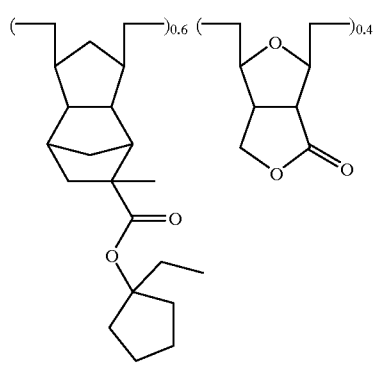

(Polymer 21)
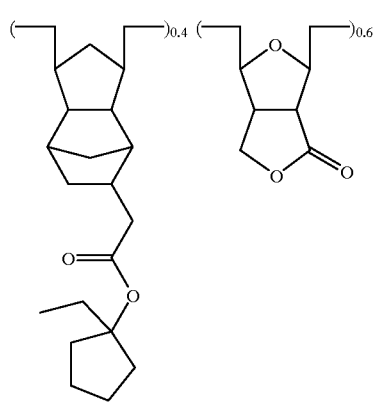

(Polymer 22)
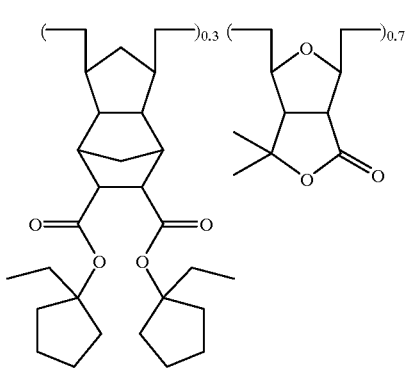

Example I

Resist compositions were formulated using inventive polymers and examined for resolution upon KrF excimer laser exposure.

Examples I-1 to I-12: Evaluation of Resist Resolution

Resist compositions were prepared by using Polymer 1 or 2 as the base resin, and dissolving the polymer, a photoacid generator (designated as PAG 1 and 2), a dissolution regulator (designated as DRR 1 to 4), a basic compound, and a compound having a ≡C—COOH group in the molecule (ACC 1 and 2) in a solvent in accordance with the formulation shown in Table 1. These compositions were each filtered through a Teflon filter (pore diameter 0.2 μm), thereby giving resist solutions.

(PAG 1)
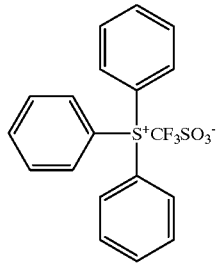

(PAG 2)
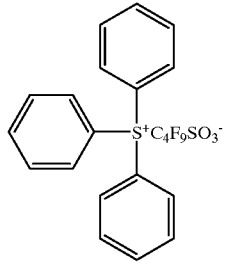

(DRR 1)
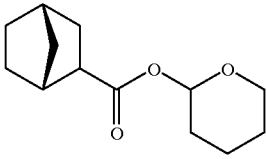

(DRR 2)
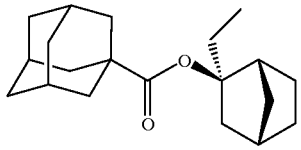

(DRR 3)
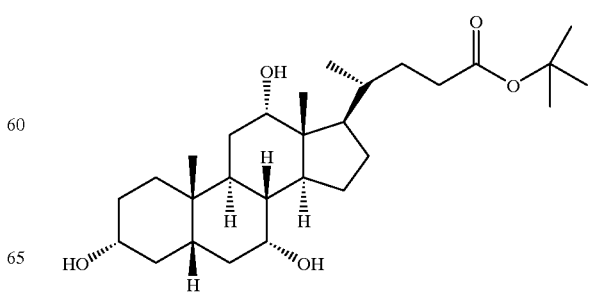

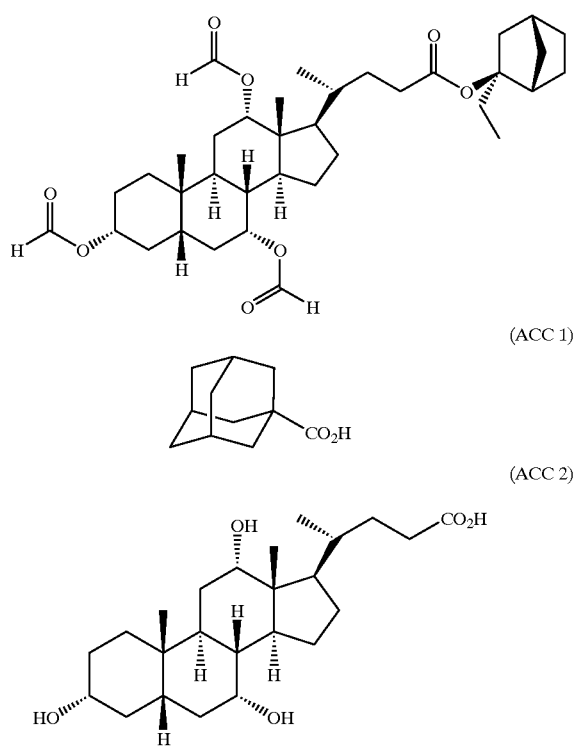

The solvents and basic compounds used are as follows.

It is noted that the solvents contained 0.05% by weight of surfactant Florade FC-430 (Sumitomo 3M).

CyHO: cyclohexanone
TBA: tributylamine
TEA: triethanolamine
TMMEA: trismethoxymethoxyethylamine
TMEMEA: trismethoxyethoxymethoxyethylamine These resist solutions were spin-coated onto silicon wafers having an anti-reflection film (DUV30 by Nissan Chemical Co., Ltd., 55 nm) coated thereon, then heat treated at 130° C. for 90 seconds to give resist films having a thickness of 485 nm. The resist films were exposed using a KrF excimer laser stepper (Nikon Corporation; NA 0.5), then heat treated at 110° C. for 90 seconds, and puddle developed with a solution of 2.38% TMAH in water for 60 seconds, thereby giving 1:1 line-and-space patterns. The developed wafers were cut, and the cross section was observed under a scanning electron microscope (SEM). The optimum dose (Eop, mJ/cm$^2$) was defined as the dose which provided a 1:1 resolution at the top and bottom of a 0.30 μm line-and-space pattern. The resolution of the resist under evaluation was defined as the minimum line width (μm) of the lines and spaces that separated at this dose. The shape of the resist pattern was classified into rectangular, rounded, T-top, forward taper or reverse taper.

The composition and test results of the resist materials are shown in Table 1.

TABLE 1

| Example | Base resin (pbw) | Photoacid generator (pbw) | Dissolution regulator (pbw) | Basic compound (pbw) | Solvent (pbw) | Optimum dose (mJ/cm$^2$) | Resolution (μm) | Shape |
|---|---|---|---|---|---|---|---|---|
| I-1 | Polymer 1 (80) | PAG 1 (1) | — | TBA (0.078) | CyHO (640) | 17.0 | 0.24 | rectangular |
| I-2 | Polymer 2 (80) | PAG 1 (1) | — | TBA (0.078) | CyHO (640) | 18.5 | 0.24 | rectangular |
| I-3 | Polymer 1 (80) | PAG 2 (1) | — | TBA (0.078) | CyHO (640) | 17.5 | 0.24 | rectangular |
| I-4 | Polymer 1 (80) | PAG 2 (1) | — | TEA (0.063) | CyHO (640) | 18.0 | 0.22 | rectangular |
| I-5 | Polymer 1 (80) | PAG 2 (1) | — | TMMEA (0.118) | CyHO (640) | 18.0 | 0.22 | rectangular |
| I-6 | Polymer 1 (80) | PAG 2 (1) | — | TMEMEA (0.173) | CyHO (640) | 18.5 | 0.22 | rectangular |
| I-7 | Polymer 1 (70) | PAG 2 (1) | DRR 1 (10) | TEA (0.063) | CyHO (640) | 15.5 | 0.24 | rectangular |
| I-8 | Polymer 1 (70) | PAG 2 (1) | DRR 2 (10) | TEA (0.063) | CyHO (640) | 16.0 | 0.24 | rectangular |
| I-9 | Polymer 1 (70) | PAG 2 (1) | DRR 3 (10) | TEA (0.063) | CyHO (640) | 18.5 | 0.24 | rectangular |
| I-10 | Polymer 1 (70) | PAG 2 (1) | DRR 4 (10) | TEA (0.063) | CyHO (640) | 17.0 | 0.22 | rectangular |
| I-11 | Polymer 1 (80) | PAG 2 (1) | ACC 1 (4) | TEA (0.063) | CyHO (640) | 16.5 | 0.24 | rectangular |
| I-12 | Polymer 1 (80) | PAG 2 (1) | ACC 2 (4) | TEA (0.063) | CyHO (640) | 17.0 | 0.24 | rectangular |

It is seen from Table 1 that the resist compositions within the scope of the invention have a high sensitivity and resolution upon KrF excimer laser exposure.

Example II Resist compositions were formulated using inventive polymers and examined for resolution upon ArF excimer laser exposure.

Examples II-1 to II-22: Evaluation of Resist Resolution

Resist compositions were prepared as in Example I in accordance with the formulation shown in Table 2.

The solvent and basic compound used are as follows.

It is noted that the solvent contained 0.01% by weight of surfactant Florade FC-430 (Sumitomo 3M).
CyHO: cyclohexanone
TMMEA: trismethoxymethoxyethylamine These resist solutions were spin-coated onto silicon wafers having an anti-reflection film (ARC25 by Nissan Chemical Co., Ltd., 77 nm) coated thereon, then heat treated at 130° C. for 90 seconds to give resist films having a thickness of 375 nm. The resist films were exposed using an ArF excimer laser stepper (Nikon Corporation; NA 0.55), then heat treated at 110° C. for 90 seconds, and puddle developed with a solution of 2.38% TMAH in water for 60 seconds, thereby giving 1:1 line-and-space patterns. The developed wafers were cut, and the cross section was observed under a scanning electron microscope (SEM). The optimum dose (Eop, $mJ/cm^2$) was defined as the dose which provided a 1:1 resolution at the top and bottom of a 0.25 $\mu$m line-and-space pattern. The resolution of the resist under evaluation was defined as the minimum line width ($\mu$m) of the lines and spaces that separated at this dose. The shape of the resist pattern was classified into rectangular, rounded, T-top, forward taper or reverse taper.

The composition and test results of the resist materials are shown in Table 2.

TABLE 2

| Example | Base resin (pbw) | Photoacid generator (pbw) | Basic compound (pbw) | Solvent (pbw) | Optimum dose ($mJ/cm^2$) | Resolution ($\mu$m) | Shape |
|---|---|---|---|---|---|---|---|
| II-1 | Polymer 1 (80) | PAG 2 (1) | TMMEA (0.236) | CyHO (640) | 19.0 | 0.19 | rectangular |
| II-2 | Polymer 2 (80) | PAG 2 (1) | TMMEA (0.236) | CyHO (640) | 20.0 | 0.18 | rectangular |
| II-3 | Polymer 3 (80) | PAG 2 (1) | TMMEA (0.236) | CyHO (640) | 24.0 | 0.21 | rectangular |
| II-4 | Polymer 4 (80) | PAG 2 (1) | TMMEA (0.236) | CyHO (640) | 18.0 | 0.18 | rectangular |
| II-5 | Polymer 5 (80) | PAG 2 (1) | TMMEA (0.236) | CyHO (640) | 17.0 | 0.18 | rectangular |
| II-6 | Polymer 6 (80) | PAG 2 (1) | TMMEA (0.236) | CyHO (640) | 15.0 | 0.17 | rectangular |
| II-7 | Polymer 7 (80) | PAG 2 (1) | TMMEA (0.236) | CyHO (640) | 19.0 | 0.18 | somewhat T-top |
| II-8 | Polymer 8 (80) | PAG 2 (1) | TMMEA (0.236) | CyHO (640) | 16.0 | 0.17 | rectangular |
| II-9 | Polymer 9 (80) | PAG 2 (1) | TMMEA (0.236) | CyHO (640) | 15.0 | 0.17 | rectangular |
| II-10 | Polymer 10 (80) | PAG 2 (1) | TMMEA (0.236) | CyHO (640) | 18.0 | 0.17 | rectangular |
| II-11 | Polymer 11 (80) | PAG 2 (1) | TMMEA (0.236) | CyHO (640) | 20.0 | 0.19 | rectangular |
| II-12 | Polymer 12 (80) | PAG 2 (1) | TMMEA (0.236) | CyHO (640) | 18.0 | 0.18 | rectangular |
| II-13 | Polymer 13 (80) | PAG 2 (1) | TMMEA (0.236) | CyHO (640) | 16.0 | 0.17 | rectangular |
| II-14 | Polymer 14 (80) | PAG 2 (1) | TMMEA (0.236) | CyHO (640) | 14.0 | 0.18 | somewhat rounded |
| II-15 | Polymer 15 (80) | PAG 2 (1) | TMMEA (0.236) | CyHO (640) | 13.0 | 0.18 | somewhat rounded |
| II-16 | Polymer 16 (80) | PAG 2 (1) | TMMEA (0.236) | CyHO (640) | 14.0 | 0.18 | rectangular |
| II-17 | Polymer 17 (80) | PAG 2 (1) | TMMEA (0.236) | CyHO (640) | 17.0 | 0.19 | rectangular |
| II-18 | Polymer 18 (80) | PAG 2 (1) | TMMEA (0.236) | CyHO (640) | 19.0 | 0.18 | rectangular |
| II-19 | Polymer 19 (80) | PAG 2 (1) | TMMEA (0.236) | CyHO (640) | 17.0 | 0.18 | rectangular |
| II-20 | Polymer 20 (80) | PAG 2 (1) | TMMEA (0.236) | CyHO (640) | 18.0 | 0.20 | rectangular |
| II-21 | Polymer 21 (80) | PAG 2 (1) | TMMEA (0.236) | CyHO (640) | 18.0 | 0.20 | rectangular |
| II-22 | Polymer 22 (80) | PAG 2 (1) | TMMEA (0.236) | CyHO (640) | 17.0 | 0.19 | rectangular |

It is seen from Table 2 that the resist compositions within the scope of the invention have a high sensitivity and resolution upon ArF excimer laser exposure.

Japanese Patent Application Nos. 2000-111545 and 2000-330181 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A resist composition comprising as a base resin a hydrogenated product of a ring-opening metathesis polymer, said product comprising at least one structural unit [A] of the following formula (1) and at least one or both of a structural unit [B] of the following formula (3) and a structural unit [C] of the following formula (4), and having a constitutional molar ratio defined as [A]:([B]+[C]) of from 20:80 to 99:1 and a dispersity defined as a weight average molecular weight (Mw) divided by a number average molecular weight (Mn) of 1.0 to 2.0,

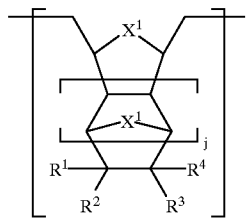
(1)

wherein at least one of $R^1$ to $R^4$ is a functional group having a tertiary ester group of cyclic alkyl of the following formula (2):

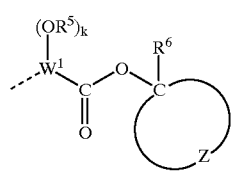
(2)

wherein the broken line denotes a valence bond, $R^5$ is selected from the group consisting of hydrogen, straight, branched or cyclic alkyl groups of 1 to 10 carbon atoms, straight, branched or cyclic alkoxyalkyl groups of 2 to 10 carbon atoms, and straight, branched or cyclic acyl groups of 1 to 10 carbon atoms, $R^6$ is a straight, branched or cyclic alkyl group of 1 to 10 carbon atoms, $W^1$ is a single bond or (k+2)-valent hydrocarbon group of 1 to 10 carbon atoms, Z is a divalent hydrocarbon group of 2 to 15 carbon atoms which forms a single ring or bridged ring with the carbon atom, and k is 0 or 1;

the remainders of $R^1$ to $R^4$ are independently selected from the group consisting of hydrogen, straight, branched or cyclic alkyl groups of 1 to 20 carbon atoms, halogen atoms, straight, branched or cyclic haloalkyl groups of 1 to 20 carbon atoms, straight, branched or cyclic alkoxy groups of 1 to 20 carbon atoms, straight, branched or cyclic alkoxyalkyl groups of 2 to 20 carbon atoms, straight, branched or cyclic alkylcarbonyloxy groups of 2 to 20 carbon atoms, arylcarbonyloxy groups of 6 to 20 carbon atoms, straight, branched or cyclic alkylsulfonyloxy groups of 1 to 20 carbon atoms, arylsulfonyloxy groups of 6 to 20 carbon atoms, straight, branched or cyclic alkoxycarbonyl groups of 2 to 20 carbon atoms, and straight, branched or cyclic alkoxycarbonylalkyl groups of 3 to 20 carbon atoms;

$X^1$, which may be the same or different, is —O— or —$CR^7_2$—wherein $R^7$ is hydrogen or a straight or branched alkyl group of 1 to 10 carbon atoms; and j is 0 or an integer of 1 to 3;

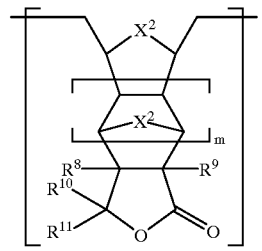
(3)

wherein $R^8$ to $R^{11}$ each are independently hydrogen or a straight, branched or cyclic alkyl group of 1 to 10 carbon atoms, $X^2$, which may be the same or different, is —O— or —$CR^{12}_2$—wherein $R^{12}$ is hydrogen or a straight or branched alkyl group of 1 to 10 carbon atoms, and m is 0 or an integer of 1 to 3;

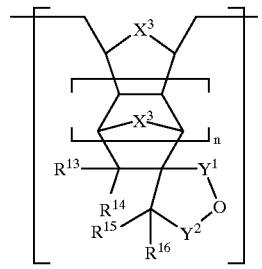
(4)

wherein $R^{13}$ to $R^{16}$ each are independently hydrogen or a straight, branched or cyclic alkyl group of 1 to 10 carbon atoms, $X^3$, which may be the same or different, is —O— or —$CR^{17}_2$—wherein $R^{17}$ is hydrogen or a straight or branched alkyl group of 1 to 10 carbon atoms, one of $Y^1$ and $Y^2$ is —(C=O)— and the other is —$CR^{18}_2$— wherein $R^{18}$ is hydrogen or a straight or branched alkyl group of 1 to 10 carbon atoms, and n is 0 or an integer of 1 to 3;

provided that the product contains:
at least one structural unit [A] of the formula (1) where $X^1$ is O,
at least one structural unit [B] of the formula (3) where $X^2$ is O, or
at least one structural unit [C] of the formula (4) where $X^3$ is O.

2. The resist composition of claim 1 wherein the functional group having a tertiary ester group of cyclic alkyl of the formula (2) represented by at least one of $R^1$ to $R^4$ is 1-alkylcyclopentyl ester, 2-alkyl-2-norbornyl ester or 2-alkyl-2-adamantyl ester.

3. The resist composition of claim 1 wherein the hydrogenated product of ring-opening metathesis polymer further comprises structural units [D] of the following general formula (5):

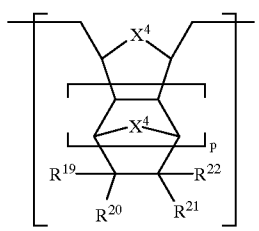

(5)

wherein at least one of $R^{19}$ to $R^{22}$ is a functional group having a carboxylic acid group represented by the following general formula (6):

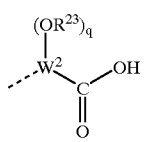

(6)

wherein the broken line denotes a valence bond, $R^{23}$ is selected from the class consisting of hydrogen, straight, branched or cyclic alkyl groups of 1 to 10 carbon atoms, straight, branched or cyclic alkoxyalkyl groups of 2 to 10 carbon atoms, and straight, branched or cyclic acyl groups of 1 to 10 carbon atoms, $W^2$ is a single bond or (q+2)-valent hydrocarbon group of 1 to 10 carbon atoms, and q is 0 or 1;

the remainders of $R^{19}$ to $R^{22}$ are independently selected from the class consisting of hydrogen, straight, branched or cyclic alkyl groups of 1 to 20 carbon atoms, halogen atoms, straight, branched or cyclic haloalkyl groups of 1 to 20 carbon atoms, straight, branched or cyclic alkoxy groups of 1 to 20 carbon atoms, straight, branched or cyclic alkoxyalkyl groups of 2 to 20 carbon atoms, straight, branched or cyclic alkylcarbonyloxy groups of 2 to 20 carbon atoms, arylcarbonyloxy groups of 6 to 20 carbon atoms, straight, branched or cyclic alkylsulfonyloxy groups of 1 to 20 carbon atoms, arylsulfonyloxy groups of 6 to 20 carbon atoms, straight, branched or cyclic alkoxycarbonyl groups of 2 to 20 carbon atoms, and straight, branched or cyclic alkoxycarbonylalkyl groups of 3 to 20 carbon atoms;

$X^4$, which may be the same or different, is —O— or —$CR^{24}_2$— wherein $R^{24}$ is hydrogen or a straight or branched alkyl group of 1 to 10 carbon atoms; and p is 0 or an integer of 1 to 3.

4. The resist composition of claim 3 wherein the hydrogenated product of ring-opening metathesis polymer has a constitutional molar ratio of structural units [A] of formula (1), structural units [B] of formula (3) and structural units [C] of formula (4) to structural units [D] of formula (5), defined as ([A]+[B]+[C]):[D], of from <100:>0.

5. The resist composition of claim 1 wherein the hydrogenated product of ring-opening metathesis polymer further comprises structural units [E] of the following general formula (7):

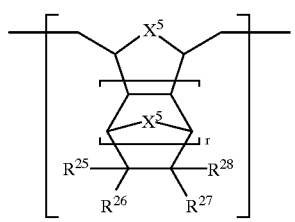

(7)

wherein at least one of $R^{25}$ to $R^{28}$ is a functional group having a carboxylate group represented by the following general formula (8):

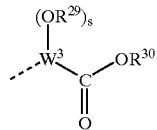

(8)

wherein the broken line denotes a valence bond, $R^{29}$ is selected from the class consisting of hydrogen, straight, branched or cyclic alkyl groups of 1 to 10 carbon atoms, straight, branched or cyclic alkoxyalkyl groups of 2 to 10 carbon atoms, and straight, branched or cyclic acyl groups of 1 to 10 carbon atoms, $R^{30}$ is a straight, branched or cyclic alkyl group of 1 to 10 carbon atoms, straight, branched or cyclic alkoxyalkyl group of 2 to 10 carbon atoms, or straight, branched or cyclic haloalkyl group of 1 to 20 carbon atoms, $W^3$ is a single bond or (s+2)-valent hydrocarbon group of 1 to 10 carbon atoms, and s is 0 or 1;

the remainders of $R^{25}$ to are independently selected from the class consisting of hydrogen, straight, branched or cyclic alkyl groups of 1 to 20 carbon atoms, halogen atoms, straight, branched or cyclic haloalkyl groups of 1 to 20 carbon atoms, straight, branched or cyclic alkoxy groups of 1 to 20 carbon atoms, straight, branched or cyclic alkoxyalkyl groups of 2 to 20 carbon atoms, straight, branched or cyclic alkylcarbonyloxy groups of 2 to 20 carbon atoms, arylcarbonyloxy groups of 6 to 20 carbon atoms, straight, branched or cyclic alkylsulfonyloxy groups of 1 to 20 carbon atoms, arylsulfonyloxy groups of 6 to 20 carbon atoms, straight, branched or cyclic alkoxycarbonyl groups of 2 to 20 carbon atoms, and straight, branched or cyclic alkoxycarbonylalkyl groups of 3 to 20 carbon atoms;

$X^5$, which may be the same or different, is —O— or —$CR^{31}_2$— wherein $R^{31}$ is hydrogen or a straight or branched alkyl group of 1 to 10 carbon atoms; and r is 0 or an integer of 1 to 3.

6. The resist composition of claim 3 wherein the hydrogenated product of ring-opening metathesis polymer has a constitutional molar ratio of structural units [A] of formula (1), structural units [B] of formula (3) and structural units [C] of formula (4) to structural units [E] of formula (7), defined as ([A]+[B]+[C]):[E], of from <100:>0.

7. The resist composition of claim 1 wherein the hydrogenated product of ring-opening metathesis polymer has a number average molecular weight (Mn) of 500 to 200,000 as measured by GPC using a polystyrene standard.

8. The resist composition of claim 7 wherein the hydrogenated product of ring-opening metathesis polymer has a number average molecular weight (Mn) of 3,000 to 20,000 as measured by GPC using a polystyrene standard.

9. A process for forming a resist pattern comprising the steps of:

applying the resist composition of claim 1 onto a substrate to form a coating, heat treating the coating and then exposing it to high-energy radiation or electron beams through a photo mask, and optionally heat treating the exposed coating and developing it with a developer.

* * * * *